(12) United States Patent
Sity et al.

(10) Patent No.: US 10,762,034 B2
(45) Date of Patent: Sep. 1, 2020

(54) MEMORY-BASED DISTRIBUTED PROCESSOR ARCHITECTURE

(71) Applicant: NeuroBlade, Ltd., Hod-Hashron (IL)

(72) Inventors: Elad Sity, Kfar Saba (IL); Eliad Hillel, Kfar Saba (IL)

(73) Assignee: NeuroBlade, Ltd., Hod-Hashron (IL)

( * ) Notice: Subject to any disclaimer, the term of this patent is extended or adjusted under 35 U.S.C. 154(b) by 0 days.

(21) Appl. No.: 16/512,590

(22) Filed: Jul. 16, 2019

(65) Prior Publication Data

US 2019/0341088 A1    Nov. 7, 2019

Related U.S. Application Data

(63) Continuation of application No. PCT/IB2018/000995, filed on Jul. 30, 2018.
(Continued)

(51) Int. Cl.
*G11C 7/10* (2006.01)
*G06F 15/80* (2006.01)
(Continued)

(52) U.S. Cl.
CPC ........ *G06F 15/8038* (2013.01); *G06F 9/3001* (2013.01); *G06F 9/3885* (2013.01);
(Continued)

(58) Field of Classification Search
CPC .................................. G11C 7/10; G11C 7/22
(Continued)

(56) References Cited

U.S. PATENT DOCUMENTS

| | | | | |
|---|---|---|---|---|
| 4,837,747 A | * | 6/1989 | Dosaka | G11C 8/12 365/189.05 |
| 5,155,729 A | | 10/1992 | Rysko et al. | |

(Continued)

FOREIGN PATENT DOCUMENTS

CA    2 149 479 C    5/2001

OTHER PUBLICATIONS

Ahn et al., "A Scalable Processing-in-Memory Accelerator for Parallel Graph Processing," ISCA '15 (Jun. 13-17, 2015), pp. 105-117.
(Continued)

*Primary Examiner* — Michael T Tran
(74) *Attorney, Agent, or Firm* — Finnegan, Henderson, Farabow, Garrett & Dunner, LLP

(57) ABSTRACT

Distributed processors and methods for compiling code for execution by distributed processors are disclosed. In one implementation, a distributed processor may include a substrate; a memory array disposed on the substrate; and a processing array disposed on the substrate. The memory array may include a plurality of discrete memory banks, and the processing array may include a plurality of processor subunits, each one of the processor subunits being associated with a corresponding, dedicated one of the plurality of discrete memory banks. The distributed processor may further include a first plurality of buses, each connecting one of the plurality of processor subunits to its corresponding, dedicated memory bank, and a second plurality of buses, each connecting one of the plurality of processor subunits to another of the plurality of processor subunits.

26 Claims, 31 Drawing Sheets

Related U.S. Application Data

(60) Provisional application No. 62/548,990, filed on Aug. 23, 2017, provisional application No. 62/538,724, filed on Jul. 30, 2017, provisional application No. 62/538,722, filed on Jul. 30, 2017.

(51) Int. Cl.
| | | |
|---|---|---|
| *G06F 9/38* | (2018.01) | |
| *G06F 11/10* | (2006.01) | |
| *G11C 11/16* | (2006.01) | |
| *G11C 11/4076* | (2006.01) | |
| *G11C 11/408* | (2006.01) | |
| *G06F 9/30* | (2018.01) | |
| *G06N 3/04* | (2006.01) | |
| *G11C 11/4093* | (2006.01) | |
| *G06F 13/16* | (2006.01) | |
| *G06F 15/76* | (2006.01) | |

(52) U.S. Cl.
CPC .......... *G06F 9/3889* (2013.01); *G06F 9/3895* (2013.01); *G06F 11/102* (2013.01); *G06F 11/1016* (2013.01); *G06F 13/1657* (2013.01); *G06N 3/04* (2013.01); *G11C 7/1072* (2013.01); *G11C 11/1655* (2013.01); *G11C 11/1657* (2013.01); *G11C 11/1675* (2013.01); *G11C 11/408* (2013.01); *G11C 11/4076* (2013.01); *G11C 11/4093* (2013.01); *G06F 2015/765* (2013.01)

(58) Field of Classification Search
USPC .......................................... 365/189.05, 233.5
See application file for complete search history.

(56) References Cited

U.S. PATENT DOCUMENTS

| | | | |
|---|---|---|---|
| 5,179,702 A | 1/1993 | Spix et al. | |
| 5,214,747 A | 5/1993 | Cok | |
| 5,239,654 A | 8/1993 | Ing-Simmons et al. | |
| 5,262,993 A * | 11/1993 | Horiguchi | G11C 5/14 365/200 |
| 5,297,260 A | 3/1994 | Kametani | |
| 5,345,552 A | 9/1994 | Brown | |
| 5,355,339 A * | 10/1994 | Oh | G11C 29/808 365/200 |
| 5,396,608 A * | 3/1995 | Garde | G06F 12/04 365/230.02 |
| 5,502,728 A | 3/1996 | Smith, III | |
| 5,506,992 A | 4/1996 | Saxenmeyer | |
| 5,517,600 A | 5/1996 | Shimokawa | |
| 5,568,617 A | 10/1996 | Kametani | |
| 5,590,345 A | 12/1996 | Barker et al. | |
| 5,625,796 A | 4/1997 | Kaczmarczyk et al. | |
| 5,631,872 A * | 5/1997 | Naritake | G11C 11/406 365/203 |
| 5,710,935 A | 1/1998 | Barker et al. | |
| 5,751,987 A | 5/1998 | Mahant-Shetti et al. | |
| 5,752,036 A | 5/1998 | Nakamura et al. | |
| 5,752,067 A | 5/1998 | Wikinson et al. | |
| 5,764,562 A * | 6/1998 | Hamamoto | G11C 11/404 365/149 |
| 5,777,921 A * | 7/1998 | Takata | G11C 7/00 365/145 |
| 5,802,005 A * | 9/1998 | Nakamura | G11C 7/10 365/230.03 |
| 5,822,608 A | 10/1998 | Dieffenderfer et al. | |
| 5,841,708 A * | 11/1998 | Nagata | G11C 29/84 365/200 |
| 5,844,856 A * | 12/1998 | Taylor | G06F 13/1647 365/230.05 |
| 5,894,448 A * | 4/1999 | Amano | G11C 5/063 365/230.08 |
| 5,946,266 A * | 8/1999 | Iwamoto | G11C 7/22 365/230.03 |
| 5,956,285 A * | 9/1999 | Watanabe | G11C 8/16 365/230.03 |
| 5,956,703 A | 9/1999 | Turner et al. | |
| 6,026,464 A | 2/2000 | Cohen | |
| 6,041,400 A | 3/2000 | Ozcelik et al. | |
| 6,064,621 A | 5/2000 | Tanizaki et al. | |
| 6,067,260 A | 5/2000 | Ooishi et al. | |
| 6,067,262 A | 5/2000 | Irrinki et al. | |
| 6,078,543 A * | 6/2000 | Kim | G11C 11/406 365/230.03 |
| 6,145,069 A | 11/2000 | Dye | |
| 6,173,356 B1 * | 1/2001 | Rao | G06F 9/383 711/104 |
| 6,188,634 B1 * | 2/2001 | Le | G11C 8/12 365/189.08 |
| 6,216,178 B1 | 4/2001 | Stracovsky et al. | |
| 6,301,184 B1 * | 10/2001 | Sasaki | G11C 7/1045 365/226 |
| 6,356,507 B1 * | 3/2002 | Kaku | H04Q 9/14 365/194 |
| 6,363,453 B1 | 3/2002 | Esposito et al. | |
| 6,389,497 B1 | 5/2002 | Koslawsky et al. | |
| 6,396,760 B1 | 5/2002 | Behera et al. | |
| 6,449,198 B1 * | 9/2002 | Hamade | G11C 7/1048 365/189.14 |
| 6,449,732 B1 | 9/2002 | Rasmussen et al. | |
| 6,523,018 B1 | 2/2003 | Louis et al. | |
| 6,553,355 B1 | 4/2003 | Arnoux et al. | |
| 6,584,033 B2 | 6/2003 | Ayukawa et al. | |
| 6,601,126 B1 | 7/2003 | Zaidi et al. | |
| 6,640,283 B2 | 10/2003 | Naffziger et al. | |
| 6,668,308 B2 | 12/2003 | Barroso et al. | |
| 6,708,254 B2 | 3/2004 | Lee et al. | |
| 6,717,834 B2 | 4/2004 | Zagorianakos et al. | |
| 6,678,801 B1 | 6/2004 | Greim et al. | |
| 6,785,841 B2 | 8/2004 | Akrout et al. | |
| 6,823,429 B1 | 11/2004 | Olnowich | |
| 6,894,392 B1 | 3/2005 | Gudesen et al. | |
| 6,877,046 B2 | 4/2005 | Singh | |
| 6,988,154 B2 | 1/2006 | Latta | |
| 6,999,950 B1 | 2/2006 | Linneberg et al. | |
| 7,107,285 B2 | 9/2006 | von Kaenel et al. | |
| 7,107,412 B2 | 9/2006 | Klein et al. | |
| 7,159,141 B2 | 1/2007 | Lakhani et al. | |
| 7,177,225 B2 * | 2/2007 | Terzioglu | G06F 13/4086 365/230.06 |
| 7,194,568 B2 | 3/2007 | Jeter, Jr. et al. | |
| 7,290,109 B2 | 10/2007 | Horii et al. | |
| 7,325,232 B2 | 1/2008 | Liem | |
| 7,450,410 B2 | 11/2008 | Klein | |
| 7,505,357 B2 * | 3/2009 | Lakhani | G11C 29/76 365/200 |
| 7,519,875 B2 * | 4/2009 | Rearick | G11C 29/44 714/6.13 |
| 7,549,081 B2 | 6/2009 | Robbins et al. | |
| 7,557,605 B2 | 7/2009 | D'Souza et al. | |
| 7,558,934 B2 | 7/2009 | Kondo et al. | |
| 7,562,271 B2 | 7/2009 | Shaeffer et al. | |
| 7,610,537 B2 | 10/2009 | Dickinson et al. | |
| 7,613,056 B2 * | 11/2009 | Ogawa | G11C 29/808 365/189.04 |
| 7,657,712 B2 | 2/2010 | Lentz et al. | |
| 7,768,831 B2 * | 8/2010 | Byeon | G11C 8/10 365/185.09 |
| 7,772,880 B2 | 8/2010 | Solomon | |
| 7,782,703 B2 | 8/2010 | Oh | |
| 7,783,936 B1 * | 8/2010 | Hall | G06F 11/1008 714/701 |
| 7,836,168 B1 | 11/2010 | Vasko et al. | |
| 7,877,627 B1 * | 1/2011 | Freydel | G06F 11/182 714/11 |
| 7,881,321 B2 | 2/2011 | Deneroff et al. | |
| 7,882,307 B1 | 2/2011 | Wentzlaff et al. | |
| 7,882,320 B2 | 2/2011 | Caulkins | |
| 7,894,262 B2 * | 2/2011 | Shirakawa | G11C 29/76 365/185.09 |

(56) References Cited

U.S. PATENT DOCUMENTS

| | | |
|---|---|---|
| 7,949,820 B2 | 5/2011 | Caulkins |
| 8,028,124 B2 | 9/2011 | Ban et al. |
| 8,042,082 B2 | 10/2011 | Solomon |
| 8,055,601 B2 | 11/2011 | Pandya |
| 8,074,031 B2 | 12/2011 | Bekooij |
| 8,171,233 B2 | 5/2012 | Kwon |
| 8,369,123 B2 | 2/2013 | Kang et al. |
| 8,442,927 B2 | 5/2013 | Chakradhar et al. |
| 8,648,403 B2 | 2/2014 | Luk et al. |
| 8,677,306 B1 | 3/2014 | Andreev et al. |
| 8,738,860 B1 | 5/2014 | Griffin et al. |
| 8,984,256 B2 | 3/2015 | Fish |
| 9,003,109 B1 | 4/2015 | Lam |
| 9,053,762 B2 | 6/2015 | Hirobe |
| 9,098,209 B2 | 8/2015 | Gopalakrishnan et al. |
| 9,164,807 B2 | 10/2015 | Blanc et al. |
| 9,239,691 B2 | 1/2016 | Lam |
| 9,245,222 B2 | 1/2016 | Modha |
| 9,305,635 B2 | 4/2016 | Lin et al. |
| 9,342,474 B2 | 5/2016 | Macri et al. |
| 9,348,385 B2 | 5/2016 | De Rochemont et al. |
| 9,378,003 B1 | 6/2016 | Sundararajan et al. |
| 9,432,298 B1 | 8/2016 | Smith |
| 9,449,257 B2 | 9/2016 | Shi et al. |
| 9,477,636 B2 | 10/2016 | Walker et al. |
| 9,570,132 B2 | 2/2017 | Kim et al. |
| 9,653,151 B1 | 5/2017 | Ong et al. |
| 9,665,503 B2 | 5/2017 | Dalal |
| 9,672,169 B2 | 6/2017 | Winderweedle |
| 9,760,827 B1 | 9/2017 | Lin et al. |
| 9,804,575 B2 * | 10/2017 | Ohnishi ................ G05B 9/03 |
| 9,904,874 B2 | 2/2018 | Shoaib et al. |
| 9,978,014 B2 | 5/2018 | Lupon et al. |
| 9,984,337 B2 | 5/2018 | Kadav et al. |
| 10,032,110 B2 | 7/2018 | Young et al. |
| 10,032,496 B1 * | 7/2018 | Bedeschi ................ G11C 7/14 |
| 10,067,681 B2 | 9/2018 | Park et al. |
| 10,078,620 B2 | 9/2018 | Farabet et al. |
| 10,114,795 B2 | 10/2018 | Cargnini et al. |
| 10,140,252 B2 | 11/2018 | Fowers et al. |
| 10,157,309 B2 | 12/2018 | Molchanov et al. |
| 2001/0024384 A1* | 9/2001 | Arimoto ................ G11C 29/28 365/200 |
| 2002/0001215 A1* | 1/2002 | Fujisawa ................ G11C 5/025 365/51 |
| 2002/0172070 A1* | 11/2002 | Arimoto ................ G11C 7/18 365/149 |
| 2003/0043671 A1* | 3/2003 | Mitsui ................ G11C 7/1045 365/222 |
| 2003/0081487 A1* | 5/2003 | Mizugaki ................ G11C 7/22 365/222 |
| 2003/0117886 A1* | 6/2003 | Shiga ................ G11C 16/107 365/233.1 |
| 2003/0227800 A1* | 12/2003 | Saito ................ G11C 8/12 365/200 |
| 2004/0095835 A1* | 5/2004 | La ................ G11C 7/1021 365/230.03 |
| 2005/0057963 A1* | 3/2005 | Ogura ................ G11C 5/025 365/155 |
| 2005/0111353 A1* | 5/2005 | Zievers ................ G06F 12/0802 370/229 |
| 2005/0223275 A1 | 10/2005 | Jardine et al. |
| 2006/0227619 A1* | 10/2006 | Honda ................ G11C 11/5642 365/185.22 |
| 2007/0022063 A1 | 1/2007 | Lightowler |
| 2007/0158808 A1* | 7/2007 | Bruce ................ H01L 25/0655 257/686 |
| 2007/0183213 A1* | 8/2007 | Kusakabe ................ G11C 8/08 365/185.23 |
| 2007/0220369 A1 | 9/2007 | Fayad et al. |
| 2007/0276977 A1 | 11/2007 | Coteus et al. |
| 2007/0279999 A1* | 12/2007 | Watanabe ................ G11C 16/16 365/185.23 |
| 2008/0043538 A1* | 2/2008 | Sugawara ................ G11C 8/08 365/185.23 |
| 2008/0043549 A1* | 2/2008 | Kim ................ G11C 29/783 365/200 |
| 2008/0046665 A1 | 2/2008 | Kim |
| 2008/0117710 A1* | 5/2008 | Kajigaya ................ G11C 7/1006 365/230.06 |
| 2008/0177979 A1* | 7/2008 | Stefan ................ G06F 9/30003 712/28 |
| 2008/0291741 A1* | 11/2008 | Sutardja ................ G11C 7/1048 365/185.23 |
| 2009/0113078 A1* | 4/2009 | Schnell ................ G11C 7/10 710/5 |
| 2009/0185407 A1* | 7/2009 | Park ................ G11C 5/025 365/51 |
| 2009/0187689 A1* | 7/2009 | Roohparvar ................ G11C 11/406 710/100 |
| 2009/0196102 A1* | 8/2009 | Kim ................ G11C 7/1045 365/185.11 |
| 2009/0217222 A1 | 8/2009 | Yasuda et al. |
| 2010/0079505 A1* | 4/2010 | Woo ................ G09G 3/3688 345/690 |
| 2010/0128548 A1* | 5/2010 | Okahiro ................ G11C 11/406 365/222 |
| 2010/0301926 A1* | 12/2010 | Dell ................ G06F 17/5068 327/540 |
| 2010/0302894 A1* | 12/2010 | Takahashi ................ G11C 8/08 365/230.06 |
| 2011/0016278 A1 | 1/2011 | Ware et al. |
| 2011/0296262 A1* | 12/2011 | Kim ................ G09G 3/3266 714/726 |
| 2011/0314473 A1 | 12/2011 | Yang et al. |
| 2012/0026154 A1* | 2/2012 | Tsuchi ................ G09G 3/3688 345/212 |
| 2012/0106277 A1* | 5/2012 | Kwean ................ G11C 11/40611 365/194 |
| 2012/0213021 A1* | 8/2012 | Riho ................ G11C 29/808 365/200 |
| 2013/0185520 A1* | 7/2013 | Dieffenderfer ................ G06F 12/1063 711/144 |
| 2014/0003113 A1* | 1/2014 | Seno ................ G11C 7/10 365/51 |
| 2014/0050020 A1* | 2/2014 | Lee et al. ................ G11C 7/1054 365/158 |
| 2014/0310495 A1 | 10/2014 | Michelogiannakis et al. |
| 2014/0328103 A1 | 11/2014 | Arsovski |
| 2014/0359199 A1 | 12/2014 | Huppenthal et al. |
| 2015/0009737 A1* | 1/2015 | Stephens, Jr. ................ G11C 5/14 365/51 |
| 2015/0089162 A1 | 3/2015 | Ahsan et al. |
| 2015/0309779 A1 | 10/2015 | Baskaran et al. |
| 2015/0324690 A1 | 11/2015 | Chilimbi et al. |
| 2015/0339201 A1* | 11/2015 | Kanekawa ................ G06F 11/165 714/6.11 |
| 2016/0034809 A1 | 2/2016 | Trenholm et al. |
| 2016/0035438 A1* | 2/2016 | Kim ................ G11C 29/4401 365/96 |
| 2016/0054434 A1* | 2/2016 | Williams ................ G01S 17/89 356/5.01 |
| 2016/0232445 A1 | 8/2016 | Srinivasan et al. |
| 2016/0379109 A1 | 12/2016 | Chung et al. |
| 2017/0103298 A1 | 4/2017 | Ling et al. |
| 2017/0200094 A1 | 7/2017 | Bruestle et al. |
| 2017/0221546 A1* | 8/2017 | Loh ................ G11C 11/40611 |
| 2017/0286825 A1 | 10/2017 | Akopyan et al. |
| 2017/0315737 A1* | 11/2017 | Kajigaya ................ G06F 3/0616 |
| 2017/0363741 A1* | 12/2017 | Send ................ G06F 3/0304 |
| 2018/0040358 A1* | 2/2018 | Noguchi ................ G11C 11/161 |
| 2018/0040362 A1* | 2/2018 | Kwak ................ G11C 7/12 |
| 2018/0052766 A1 | 2/2018 | Mehra et al. |
| 2018/0091747 A1* | 3/2018 | Rhee ................ G01S 3/784 |
| 2018/0144244 A1 | 5/2018 | Masoud et al. |
| 2018/0189215 A1 | 7/2018 | Boesch et al. |
| 2018/0189645 A1 | 7/2018 | Chen et al. |
| 2018/0285254 A1 | 10/2018 | Baum et al. |
| 2018/0285718 A1 | 10/2018 | Baum et al. |
| 2018/0336035 A1 | 11/2018 | Choi et al. |

(56) References Cited

U.S. PATENT DOCUMENTS

| | | | |
|---|---|---|---|
| 2019/0057726 A1* | 2/2019 | Nishizaki | G11C 5/063 |
| 2019/0103149 A1* | 4/2019 | Hasbun | G06F 12/0284 |
| 2019/0123276 A1* | 4/2019 | Ratnam | H01L 45/04 |
| 2019/0165044 A1* | 5/2019 | Takaki | H01L 27/11551 |
| 2019/0206487 A1* | 7/2019 | Chen | G11C 7/1075 |
| 2019/0214365 A1* | 7/2019 | Gu | G02F 1/011 |
| 2020/0111521 A1* | 4/2020 | Kim | G11C 8/08 |
| 2020/0125257 A1* | 4/2020 | Shin | G11C 11/4076 |
| 2020/0126603 A1* | 4/2020 | Kondo | G11C 7/1093 |

OTHER PUBLICATIONS

Stripf et al., "Compiling Scilab to high performance embedded multicore systems," Microprocessors and Microsystems (2013), 37:1033-49.

Chandramoorthy, "Design and Exploration of Accelerator-Rich Multi Core Architectures," The Pennsylvania State University (Dec. 2016), pp. title page, ii-xii, and 1-106.

Chaturvedi, "Techniques to Improve the Performance of Cache Memory for Multi-Core Processors," Birla Institute of Technology and Science (2015), pp. title page, i-xv, and 1-185.

Chetlur et al., "cuDNN: Efficient Primitives for Deep Learning," arXiv:1410.0759v3 (Dec. 18, 2014), pp. 1-9.

Chi et al., "PRIME: A Novel Processing-in-memory Architecture for Neural Network Computation in ReRAM-based Main Memory," 2016 ACM/IEEE 43$^{rd}$ Annual International Symposium on Computer Architecture (2016), pp. 27-39.

Chung, "CoRAM: An In-Fabric Memory Architecture for FPGA-Based Computing," Carnegie Mellon University (Aug. 2011), pp. title page, i-xiv, 1-179.

Cristian, "Understanding Fault-Tolerant Distributed Systems," University of California, San Diego (May 25, 1993), pp. 1-45.

De Dinechin et al., "A Clustered Manycore Processor Architecture for Embedded and Accelerated Applications," ResearchGate (Jan. 2013), pp. 1-6.

Gupta et al., "The StageNet fabric for constructing resilient multicore systems," Proceedings of the 41$^{st}$ annual IEEE/ACM International Symposium on Microarchitecture (Nov. 8-12, 2008), Abstract page.

HP ProLiant Servers Troubleshooting Guide, Hewlett Packard (Oct. 30, 2011), Edition 12.

Draper et al., "Implementation of a 32-bit RISC Processor for the Data-Intensive Architecture Processing-In-Memory Chip," Proceedings of the IEEE International Conference on Application-Specific Systems, Architectures, and Processors (2002), pp. 1-10.

Malki et al., "A CNN-Specific Integrated Processor," EURASIP Journal on Advances in Signal Processing (2009), 2009: pp. 1-14.

Meridian 1 Engineering Handbook, Update Package, Meridian 1 Communication Systems (Apr. 30, 1990), pp. 1-642.

Nanyang Technological University, "Scientists turn memory chips into processors to speed up computing tasks," Nanyang Technological University (Jan. 3, 2017), pp. 1-5.

Shafiee et al., "ISAAC: A Convolutional Neural Network Accelerator with In-Situ Analog Arithmetic in Crossbars," ACM SIGARCH Computer Architecture News 44 (2016), pp. 14-26.

Weninger et al., "Introducing Currennt: The Munich Open-Source CUDA Recurrent Neural Network Toolkit," Journal of Machine Learning Research (Mar. 2015), pp. 547-551.

Wu et al., "Demonstration and architectural analysis of complementary metal-oxide semiconductor/multiple-quantum-well smart-pixel array cellular logic processors for single-instruction multiple-data parallel-pipeline processing," Applied Optics (Apr. 10, 1999), 38:2270-81.

Yuan et al., "Complexity Effective Memory Access Scheduling for Many-Core Accelerator Architectures," MICRO '09 (Dec. 12-16, 2009), pp. 34-44.

Udipi et al., "Rethinking DRAM Design and Organization for Energy-Constrained Multi-Cores," ISCA '10 (Jun. 19-23, 2010), pp. 175-186.

Chen et al., "Eyeriss: A Spatial Architecture for Energy-Efficient Dataflow for Convolutional Neural Networks," 2016 ACM/IEEE 43$^{rd}$ Annual International Symposium on Computer Architecture (2016), pp. 1-13.

Gao et al., "TETRIS: Scalable and Efficient Neural Network Acceleration with 3D Memory," ASPLOS '17 (Apr. 8-12, 2017), pp. 1-14.

Chen et al., "DianNao: A Small-Footprint High-Throughput Accelerator for Ubiquitous Machine-Learning," ASPLOS '14 (Mar. 1-5, 2014), pp. 1-1-15.

Azarkhish et al., "Neurostream: Scalable and Energy Efficient Deep Learning with Smart Memory Cubes," arXiv:1701.06420v3 (Sep. 24, 2017), pp. 1-15.

Farabet et al., "NeuFlow: A Runtime Reconfigurable Dataflow Processor Vision," CVPR 2011 Workshops (Jun. 20-25, 2011), pp. 109-116.

Wang et al., "DLAU: A Scalable Deep Learning Accelerator Unit on FPGA," IEEE Transactions on Computer-Aided Design of Integrated Circuits and Systems (2016), pp. 1-5.

Han et al., "EIE: Efficient Inference Engine on Compressed Deep Neural Network," arXiv:1602.01528v2 (May 3, 2016), pp. 1-12.

\* cited by examiner

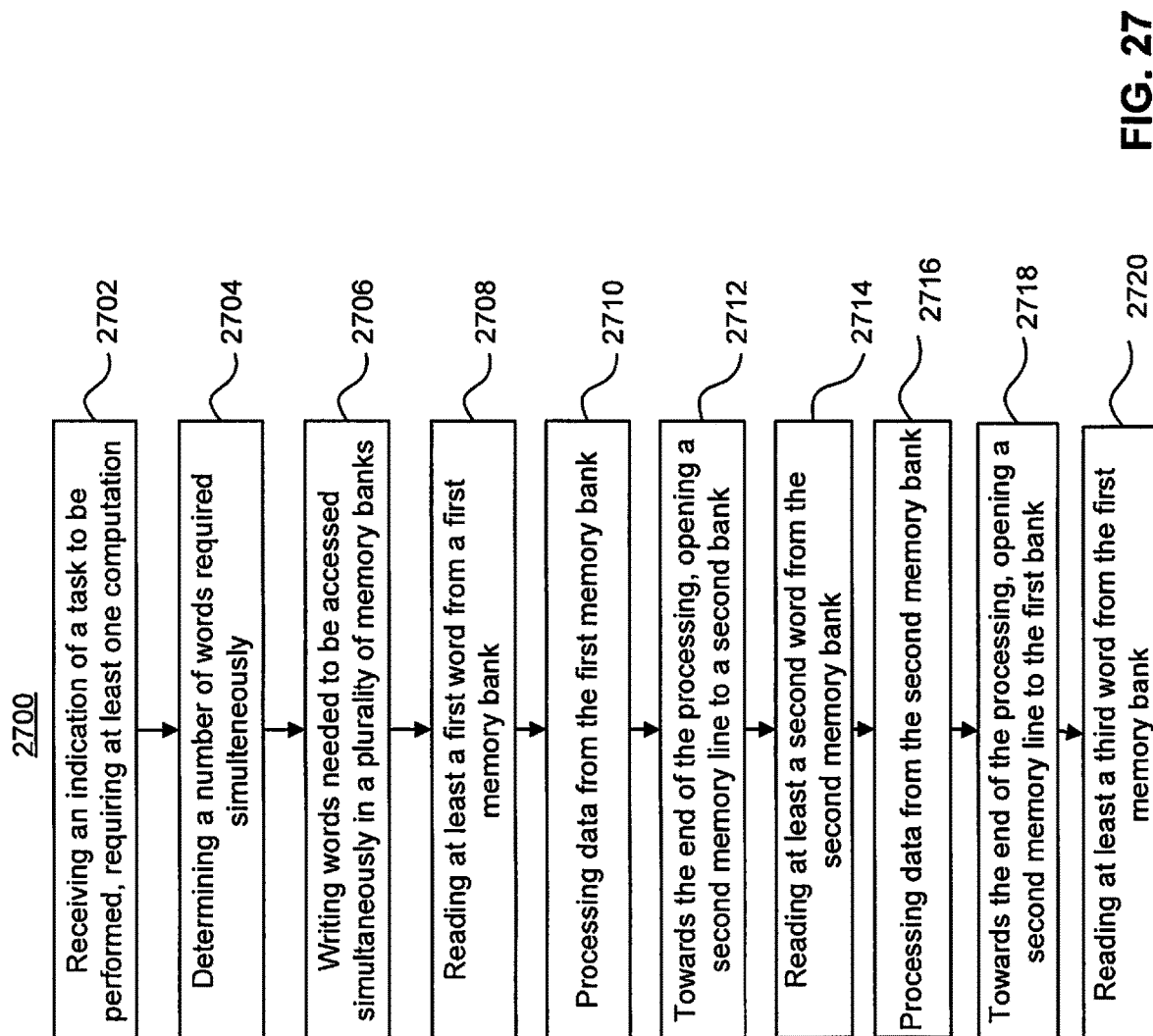

MEMORY-BASED DISTRIBUTED PROCESSOR ARCHITECTURE

CROSS REFERENCE TO RELATED APPLICATIONS

This application is a continuation of PCT/IB2018/000995, filed on Jul. 30, 2018, which claims the benefit of priority of U.S. Provisional Patent Application No. 62/538,722, filed on Jul. 30, 2017, U.S. Provisional Patent Application No. 62/538,724, filed on Jul. 30, 2017, and U.S. Provisional Patent Application No. 62/548,990, filed on Aug. 23, 2017. All of the foregoing applications are incorporated herein by reference in their entireties.

BACKGROUND

Technical Field

The present disclosure relates generally to apparatuses for facilitating memory-intensive operations. In particular, the present disclosure relates to hardware chips that include processing elements coupled to dedicated memory banks.

Background Information

As processor speeds and memory sizes both continue to increase, a significant limitation on effective processing speeds is the von Neumann bottleneck. The von Neumann bottleneck results from throughput limitations resulting from conventional computer architecture. In particular, data transfer from memory to the processor is often bottlenecked compared to actual computations undertaken by the processor. Accordingly, the number of clock cycles to read and write from memory increases significantly with memory-intensive processes. These clock cycles result in lower effective processing speeds because reading and writing from memory consumes clock cycles that cannot be used for performing operations on data. Moreover, the computational bandwidth of the processor is generally larger than the bandwidth of the buses that the processor uses to access the memory.

These bottlenecks are particularly pronounced for memory-intensive processes, such as neural network and other machine learning algorithms; database construction, indexing searching, and querying; and other tasks that include more reading and writing operation than data processing operations.

Additionally, the rapid growth in volume and granularity of available digital data has created opportunities to develop machine learning algorithms and has enabled new technologies. However, it has also brought cumbersome challenges to the world of data bases and parallel computing. For example, the rise of social media and the Internet of Things (IoT) creates digital data at a record rate. This new data can be used to create algorithms for a variety of purposes, ranging from new advertising techniques to more precise control methods of industrial processes. However, the new data has been difficult to store, process, analyze and handle.

New data resources can be massive, sometimes in the order of peta- to zettabytes. Moreover, the growth rate of these data resources may exceed data processing capabilities. Therefore, data scientists have turned to parallel data processing techniques, to tackle these challenges. In an effort to increase computation power and handle the massive amount of data, scientists have attempted to create systems and methods capable of parallel intensive computing. But these existing systems and methods have not kept up with the data processing requirements, often because the techniques employed are limited by their demand of additional resources for data management, integration of segregated data, and analysis of the sectioned data.

To facilitate the manipulation of large data sets, engineers and scientists now seek to improve the hardware used to analyze data. For example, new semiconductor processors or chips (such as those described herein) may be designed specifically for data intensive tasks by incorporating memory and processing functions in a single substrate fabricated in technologies more fitting for memory operations rather than arithmetic computation. With integrated circuits specifically designed for data-intensive tasks, it is possible to meet the new data processing requirements. Nonetheless, this new approach to tackle data processing of large data sets requires solving new issues in chip design and fabrication. For instance, if the new chips designed for data intensive tasks are manufactured with fabrication techniques and architectures used for common chips, they would have a poor performance and/or unacceptable yields. In addition, if the new chips are designed to operate with current data handling methods, they will have poor performance because current methods can limit the chip's ability to handle parallel operations.

The present disclosure describes solutions for mitigating or overcoming one or more of the problems set forth above, among other problems in the prior art.

SUMMARY

Embodiments consistent with the present disclosure provide apparatuses including hardware processing chips. The disclosed embodiments may use dedicated memory banks paired with processing elements to provide more efficient effective processing speeds than conventional processors. For example, consistent with the disclosed embodiments, the disclosed chips may include dedicated buses between each processing element and its corresponding memory banks. In addition, the disclosed chips may be free of arbiters and/or other hardware that controls timing of data transfers between the processing elements. Other disclosed non-transitory computer-readable media may store instructions for compiling higher-level instructions to lower-level instructions executed by hardware chips disclosed herein.

Some embodiments of the present disclosure include a distributed processor, comprising: a substrate; a memory array disposed on the substrate, the memory array including a plurality of discrete memory banks; a processing array disposed on the substrate, the processing array including a plurality of processor subunits, each one of the processor subunits being associated with a corresponding, dedicated one of the plurality of discrete memory banks; a first plurality of buses, each connecting one of the plurality of processor subunits to its corresponding, dedicated memory bank; and a second plurality of buses, each connecting one of the plurality of processor subunits to another of the plurality of processor subunits.

Other embodiments consistent with the present disclosure include a memory chip, comprising: a substrate; a memory array disposed on the substrate, the memory array including a plurality of discrete memory banks; a processing array disposed on the substrate, the processing array including a plurality of address generators, each one of the address generators being associated with a corresponding, dedicated one of the plurality of discrete memory banks; and a plurality of buses, each connecting one of the plurality of address generators to its corresponding, dedicated memory bank.

Another embodiment consistent with the present disclosure may include a distributed processor, comprising: a substrate; a memory array disposed on the substrate, the memory array including a plurality of discrete memory banks, wherein each of the discrete memory banks has a capacity greater than one megabyte; and a processing array disposed on the substrate, the processing array including a plurality of processor subunits, each one of the processor subunits being associated with a corresponding, dedicated one of the plurality of discrete memory banks.

Still other embodiments consistent with the present disclosure may include a distributed processor, comprising: a substrate; a memory array disposed on the substrate, the memory array including a plurality of discrete memory banks; and a processing array disposed on the substrate, the processing array including a plurality of processor subunits, each one of the processor subunits being associated with a corresponding, dedicated one of the plurality of discrete memory banks; and a plurality of buses, each one of the plurality of buses connecting one of the plurality of processor subunits to at least another one of the plurality of processor subunits, wherein the plurality of buses are free of timing hardware logic components such that data transfers between processor subunits and across corresponding ones of the plurality of buses are uncontrolled by timing hardware logic components.

Other embodiments may include a distributed processor on a memory chip, comprising: a substrate; a memory array disposed on the substrate, the memory array including a plurality of discrete memory banks; and a processing array disposed on the substrate, the processing array including a plurality of processor subunits, each one of the processor subunits being associated with a corresponding, dedicated one of the plurality of discrete memory banks; and a plurality of buses, each one of the plurality of buses connecting one of the plurality of processor subunits to a corresponding, dedicated one of the plurality of discrete memory banks, wherein the plurality of buses are free of timing hardware logic components such that data transfers between a processor subunit and a corresponding, dedicated one of the plurality of discrete memory banks and across a corresponding one of the plurality of buses are uncontrolled by timing hardware logic components.

Other embodiments may include a distributed processor, comprising: a substrate; a memory array disposed on the substrate, the memory array including a plurality of discrete memory banks; and a processing array disposed on the substrate, the processing array including a plurality of processor subunits, each one of the processor subunits being associated with a corresponding, dedicated one of the plurality of discrete memory banks; and a plurality of buses, each one of the plurality of buses connecting one of the plurality of processor subunits to at least another one of the plurality of processor subunits, wherein the plurality of processor subunits are configured to execute software that controls timing of data transfers across the plurality of buses to avoid colliding data transfers on at least one of the plurality of buses.

Other embodiments may include a distributed processor on a memory chip, comprising: a substrate; a plurality of processor subunits disposed on the substrate, each processor subunit being configured to execute a series of instructions independent from other processor subunits, each series of instructions defining a series of tasks to be performed by a single processor subunit; a corresponding plurality of memory banks disposed on the substrate, each one of the plurality of processor subunits being connected to at least one dedicated memory bank not shared by any others of the plurality of processor subunits; and a plurality of buses, each of the plurality of buses connecting one of the plurality of processor subunits to at least one other of the plurality of processor subunits, wherein data transfers across at least one of the plurality of buses are predefined by the series of instructions included in a processor subunit connected to the at least one of the plurality of buses.

Other embodiments may include a distributed processor on a memory chip, comprising: a plurality of processor subunits disposed on the memory chip; a plurality of memory banks disposed on the memory chip, wherein each one of the plurality of memory banks is configured to store data independent from data stored in other ones of the plurality of memory banks, and wherein each one of the plurality of processor subunits is connected to at least one dedicated memory bank from among the plurality of memory banks; and a plurality of buses, wherein each one of the plurality of buses connects one of the plurality of processor subunits to one or more corresponding, dedicated memory banks from among the plurality of memory banks, wherein data transfers across a particular one of the plurality of buses are controlled by a corresponding processor subunit connected to the particular one of the plurality of buses.

Other embodiments may include a distributed processor on a memory chip, comprising: a plurality of processor subunits disposed on the memory chip; a plurality of memory banks disposed on the memory chip, Wherein each one of the plurality of processor subunits is connected to at least one dedicated memory bank from among the plurality of memory banks, and wherein each memory bank of the plurality of memory banks is configured to store data independent from data stored in other ones of the plurality of memory banks, and wherein at least some of the data stored in one particular memory bank from among the plurality of memory banks comprises a duplicate of data stored in at least another one of the plurality of memory banks; and a plurality of buses, wherein each one of the plurality of buses connects one of the plurality of processor subunits to one or more corresponding, dedicated memory banks from among the plurality of memory banks, wherein data transfers across a particular one of the plurality of buses are controlled by a corresponding processor subunit connected to the particular one of the plurality of buses.

Other embodiments may include a distributed processor on a memory chip, comprising: a plurality of processor subunits disposed on the memory chip; a plurality of memory banks disposed on the memory chip, wherein each one of the plurality of processor subunits is connected to at least one dedicated memory bank from among the plurality of memory banks, and wherein each memory bank of the plurality of memory banks is configured to store data independent from data stored in other ones of the plurality of memory banks, and wherein at least some of the data stored in one particular memory bank from among the plurality of memory banks comprises a duplicate of data stored in at least another one of the plurality of memory banks; and a plurality of buses, wherein each one of the plurality of buses connects one of the plurality of processor subunits to one or more corresponding, dedicated memory banks from among the plurality of memory banks, wherein data transfers across a particular one of the plurality of buses are controlled by a corresponding processor subunit connected to the particular one of the plurality of buses.

Other embodiments may include a non-transitory computer-readable medium storing instructions for compiling a series of instructions for execution on a memory chip comprising a plurality of processor subunits and a plurality of memory banks, wherein each processor subunit from among the plurality of processor subunits is connected to at least one corresponding, dedicated memory bank from among the plurality of memory banks, the instructions causing at least one processor to: divide the series of instructions into a plurality of groups of sub-series instructions, the division comprising: assigning tasks associated with the series of instructions to different ones of the processor subunits, wherein the processor subunits are spatially distributed among the plurality of memory banks disposed on the memory chip; generating tasks to transfer data between pairs of the processor subunits of the memory chip, each pair of processor subunits being connected by a bus, and grouping the assigned and generated tasks into the plurality of groups of sub-series instructions, wherein each of the plurality of groups of sub-series instructions corresponds to a different one of the plurality of processor sub-units; generate machine code corresponding to each of the plurality of groups of subs-series instructions; and assign the generated machine code corresponding to each of the plurality of groups of subs-series instructions to a corresponding one of the plurality of processor subunits in accordance with the division.

Other embodiments may include a memory chip, comprising: a plurality of memory banks, each memory bank having a bank row decoder, a bank column decoder, and a plurality of memory sub-banks, each memory sub-bank having a sub-bank row decoder and a sub-bank column decoder for allowing reads and writes to locations on the memory sub-bank, each memory sub-bank comprising: a plurality of memory mats, each memory mat having a plurality of memory cells, wherein the sub-bank row decoders and the sub-bank column decoders are connected to the bank row decoder and the bank column decoder.

Other embodiments may include a memory chip, comprising: a plurality of memory banks, each memory bank having a bank controller and a plurality of memory sub-banks, each memory sub-bank having a sub-bank row decoder and a sub-bank column decoder for allowing reads and writes to locations on the memory sub-bank, each memory sub-bank comprising: a plurality of memory mats, each memory mat having a plurality of memory cells, wherein the sub-bank row decoders and the sub-bank column decoders process read and write requests from the bank controller.

Other embodiments may include a memory chip, comprising: a plurality of memory banks, each memory bank having a having a bank controller for processing reads and writes to locations on the memory bank, each memory bank comprising: a plurality of memory mats, each memory mat having a plurality of memory cells and having a mat row decoder and a mat column decoder, wherein the mat row decoders and the mat column decoders process read and write requests from the sub-bank controller.

Other embodiments may include a memory chip, comprising: a plurality of memory banks, each memory bank having a bank controller, a row decoder, and a column decoder for allowing reads and writes to locations on the memory bank; and a plurality of buses connecting each controller of the plurality of bank controllers to at least one other controller of the plurality of bank controllers.

One aspect of the present disclosure is directed to a memory device including a substrate; a plurality of memory banks on the substrate; a plurality of primary logic blocks on the substrate, each of the plurality of primary logic blocks being connected to at least one of the plurality of memory banks; a plurality of redundant blocks on the substrate, each of the plurality of redundant blocks being connected to at least one of the memory banks, each of the plurality of redundant blocks replicating at least one of the plurality of primary logic blocks; and a plurality of configuration switches on the substrate, each one of the plurality of the configuration switches being connected to at least one of the plurality of primary logic blocks or to at least one of the plurality of redundant blocks. In the memory device, upon detection of a fault associated with one of the plurality of primary logic blocks: a first configuration switch of the plurality of configuration switches may be configured to disable the one of the plurality of primary logic blocks, and a second configuration switch of the plurality of configuration switches may be configured to enable one of the plurality of redundant blocks that replicates the one of the plurality of primary logic blocks.

Another aspect of the present disclosure is directed to a distributed processor on a memory chip including a substrate; an address manager on the substrate; a plurality of primary logic blocks on the substrate, each of the plurality of primary logic blocks being connected to at least one of the plurality of memory banks; a plurality of redundant blocks on the substrate, each of the plurality of redundant blocks being connected to at least one of the plurality of memory banks, each of the plurality of redundant blocks replicating at least one of the plurality of primary logic blocks; and a bus on the substrate connected to each of the plurality of primary logic blocks, each of the plurality of redundant blocks, and the address manager. In the processor may assign running ID numbers to blocks in the plurality of primary logic blocks that pass a testing protocol; assign illegal ID numbers to blocks in the plurality of primary logic blocks that do not pass the testing protocol; and assign running ID numbers to blocks in the plurality of redundant blocks that pass the testing protocol.

Yet another aspect of the present disclosure is directed to a method for configuring a distributed processor on a memory chip. The method may include: testing each one of a plurality of primary logic blocks on the substrate of the memory chip for at least one circuit functionality; identifying at least one faulty logic block in the plurality of primary logic blocks based on the testing results, the at least one faulty logic block being connected to at least one memory bank disposed on the substrate of the memory chip; testing at least one redundant block on the substrate of the memory chip for the at least one circuit functionality, the at least one redundant block replicating the at least one faulty logic block and being connected to the at least one memory bank; disabling the at least one faulty logic block by applying an external signal to a deactivation switch, the deactivation switch being connected with the at least one faulty logic block and being disposed on the substrate of the memory chip; and enabling the at least one redundant block by applying the external signal to an activation switch, the activation switch being connected with the at least one redundant block and being disposed on the substrate of the memory chip.

Another aspect of the present disclosure is directed to a method for configuring a distributed processor on a memory chip. The method may include enabling a plurality of primary logic blocks and a plurality of redundant blocks on the substrate of the memory; testing each one of the plurality of primary logic blocks on the substrate of the memory chip for at least one circuit functionality; identifying at least one faulty logic block in the plurality of primary logic blocks based on the testing results, the at least one faulty logic block being connected to at least one memory bank disposed on the substrate of the memory chip; testing at least one redundant block on the substrate of the memory chip for the at least one circuit functionality, the at least one redundant block replicating the at least one faulty logic block and being connected to the at least one memory bank; and disabling at least one redundant block by applying the external signal to an activation switch, the activation switch being connected with the at least one redundant block and being disposed on the substrate of the memory chip.

One aspect of the present disclosure is directed to a processing device. The processing device may include a substrate; a plurality of memory banks on the substrate; a memory controller on the substrate connected to each one of the plurality of memory banks; and a plurality of processing units on the substrate, each one of the plurality of processing units being connected to the memory controller, the plurality of processing units including a configuration manager. In the processing device, the configuration manager is configured to receive a first indication of a task to be performed, the task requiring at least one computation; signal at least one selected processing unit from the plurality of processing units based upon a capability of the selected processing unit for performing the at least one computation; and transmitting a second indication to the at least one selected processing unit, and the memory controller is configured to route data from at least two memory banks to the at least one selected processing unit using at least one communication line, the at least one communication line being connected to the at least two memory banks and the at least one selected processing unit via the memory controller.

Another aspect of the present disclosure is directed to a method performed for operating a distributed memory device. The method may include: compiling, by a compiler, a task for the distributed memory device, the task requiring at least one computation, the compiling may include determining a number of words that are required simultaneously to perform the task, and providing instructions for writing words that need to be accessed simultaneously in a plurality of memory banks disposed on the substrate when a number a number of words that can be accessed simultaneously from one of the plurality of memory banks is lower than the number of words that are required simultaneously; receiving, by a configuration manager disposed on the substrate, an indication to perform the task; and in response to receiving the indication, configuring a memory controller disposed in the substrate to: within a first line access cycle: access at least one first word from a first memory bank from the plurality of memory banks using a first memory line, send the at least one first word to at least one processing unit, and open a first memory line in the second memory bank to access a second address from the second memory bank from the plurality of memory banks, and within a second line access cycle: access at least one second word from the second memory bank using the first memory line, send the at least one second word to at least one processing unit, and access a third address from the first memory bank using a second memory line in the first bank.

Yet another aspect of the present disclosure is directed to a non-transitory computer-readable medium that stores instructions that, when executed by at least one processor, cause the at least one processor to determine a number of words that are required simultaneously to perform a task, the task requiring at least one computation; write words that need to be accessed simultaneously in a plurality of memory banks disposed on the substrate when a number a number of words that can be accessed simultaneously from one of the plurality of memory banks is lower than the number of words that are required simultaneously; transmit an indication to perform the task to a configuration manager disposed on the substrate; and transmit instructions to configure a memory controller disposed on the substrate to, within a first line access cycle: access at least one first word from a first memory bank from the plurality of memory banks using a first memory line, send the at least one first word to at least one processing unit, and open a first memory line in the second memory bank to access a second address from the second memory bank from the plurality of memory banks, and within a second line access cycle: access at least one second word from the second memory bank using the first memory line, send the at least one second word to at least one processing unit, and access a third address from the first memory bank using a second memory line in the first bank.

Consistent with other disclosed embodiments, non-transitory computer-readable storage media may store program instructions, which are executed by at least one processing device and perform any of the methods described herein.

The foregoing general description and the following detailed description are exemplary and explanatory only and are not restrictive of the claims.

BRIEF DESCRIPTION OF THE DRAWINGS

The accompanying drawings, which are incorporated in and constitute a part of this disclosure, illustrate various disclosed embodiments. In the drawings:

FIG. 27 is an exemplary flowchart illustrating a process execution, consistent with disclosed embodiments.

DETAILED DESCRIPTION

Figure 1:
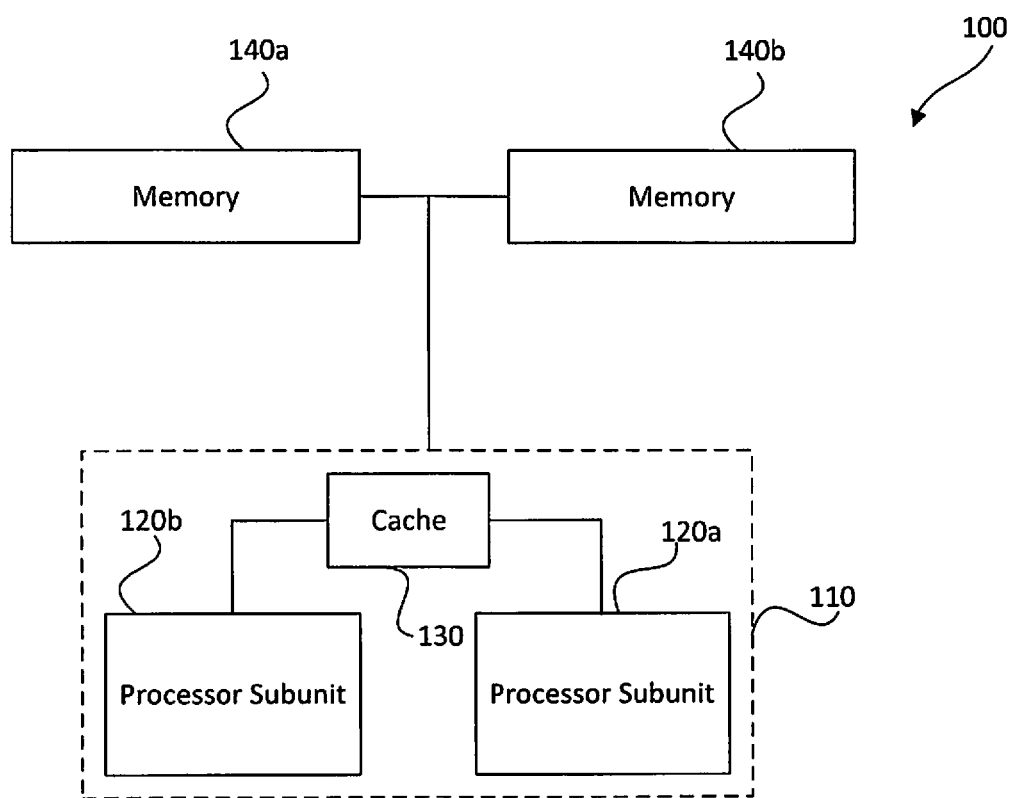
FIG. 1 is a diagrammatic representation of a central processing unit (CPU).

The following detailed description refers to the accompanying drawings. Wherever convenient, the same reference numbers are used in the drawings and the following description to refer to the same or similar parts. While several illustrative embodiments are described herein, modifications, adaptations and other implementations are possible. For example, substitutions, additions or modifications may be made to the components illustrated in the drawings, and the illustrative methods described herein may be modified by substituting, reordering, removing, or adding steps to the disclosed methods. Accordingly, the following detailed description is not limited to the disclosed embodiments and examples. Instead, the proper scope is defined by the appended claims.

Processor Architecture

As used throughout this disclosure, the term "hardware chip" refers to a semiconductor wafer (such as silicon or the like) on which one or more circuit elements (such as transistors, capacitors, resistors, and/or the like) are formed. The circuit elements may form processing elements or memory elements. A "processing element" refers to one or more circuit elements that, together, perform at least one logic function (such as an arithmetic function, a logic gate, other Boolean operations, or the like). A processing element may be a general-purpose processing element (such as a configurable plurality of transistors) or a special-purpose processing element (such as a particular logic gate or a plurality of circuit elements designed to perform a particular logic function). A "memory element" refers to one or more circuit elements that can be used to store data. A "memory element" may also be referred to as a "memory cell." A memory element may be dynamic (such that electrical refreshes are required to maintain the data store), static (such that data persists for at least some time after power loss), or non-volatile memories.

Processing elements may be joined to form processor subunits. A "processor subunit" may thus comprise a smallest grouping of processing elements that may execute at least one task or instructions (e.g., of a processor instruction set). For example, a subunit may comprise one or more general-purpose processing elements configured to execute instructions together, one or more general-purpose processing elements paired with one or more special-purpose processing elements configured to execute instructions in a complementary fashion, or the like. The processor subunits may be arranged on a substrate (e.g., a wafer) in an array. Although the "array" may comprise a rectangular shape, any arrangement of the subunits in the array may be formed on the substrate.

Memory elements may be joined to form memory banks. For example, a memory bank may comprise one or more lines of memory elements linked along at least one wire (or other conductive connection). Furthermore, the memory elements may be linked along at least one addition wire in another direction. For example, the memory elements may be arranged along wordlines and bitlines, as explained below. Although the memory bank may comprise lines, any arrangement of the elements in the bank may be used to form the bank on the substrate. Moreover, one or more banks may be electrically joined to at least one memory controller to form a memory array. Although the memory array may comprise a rectangular arrangement of the banks, any arrangement of the banks in the array may be formed on the substrate.

As further used throughout this disclose, a "bus" refers to any communicative connection between elements of a substrate. For example, a wire or a line (forming an electrical connection), an optical fiber (forming an optical connection), or any other connection conducting communications between components may be referred to as a "bus."

Conventional processors pair general-purpose logic circuits with shared memories. The shared memories may store both instruction sets for execution by the logic circuits as well as data used for and resulting from execution of the instruction sets. As described below, some conventional processors use a caching system to reduce delays in performing pulls from the shared memory; however, conventional caching systems remain shared. Conventional processors include central processing units (CPUs), graphics processing units (GPUs), various application-specific integrated circuits (ASICs), or the like. FIG. 1 shows an example of a CPU, and FIG. 2 shows an example of a GPU.

As shown in FIG. 1, a CPU 100 may comprise a processing unit 110 that includes one or more processor subunits, such as processor subunit 120a and processor subunit 120b. Although not depicted in FIG. 1, each processor subunit may comprise a plurality of processing elements. Moreover, the processing unit 110 may include one or more levels of on-chip cache. Such cache elements are generally formed on the same semiconductor die as processing unit 110 rather than being connected to processor subunits 120a and 120b via one or more buses formed in the substrate containing processor subunits 120a and 120b and the cache elements. An arrangement directly on the same die, rather than being connected via buses, is common for both first-level (L1) and second-level (L2) caches in conventional processors. Alternatively, in older processors, L2 caches were shared amongst processor subunits using back-side buses between the subunits and the L2 caches. Back-side buses are generally larger than front-side buses, described below. Accordingly, because cache is to be shared with all processor subunits on the die, cache 130 may be formed on the same die as processor subunits 120a and 120b or communicatively coupled to processor subunits 120a and 120b via one or more back-side buses. In both embodiments without buses (e.g., cache is formed directly on-die) as well as embodiments using back-side buses, the caches are shared between processor subunits of the CPU.

Moreover, processing unit 110 communicates with shared memory 140a and memory 140b. For example, memories 140a and 140b may represent memory banks of shared dynamic random access memory (DRAM). Although depicted with two banks, most conventional memory chips include between eight and sixteen memory banks. Accordingly, processor subunits 120a and 120b may use shared memories 140a and 140b to store data that is then operated upon by processor subunits 120a and 120b. This arrangement, however, results in the buses between memories 140a and 140b and processing unit 110 acting as a bottleneck when the clock speeds of processing unit 110 exceed data transfer speeds of the buses. This is generally true for conventional processors, resulting in lower effective processing speeds than the stated processing speeds based on clock rate and number of transistors.

Figure 2:
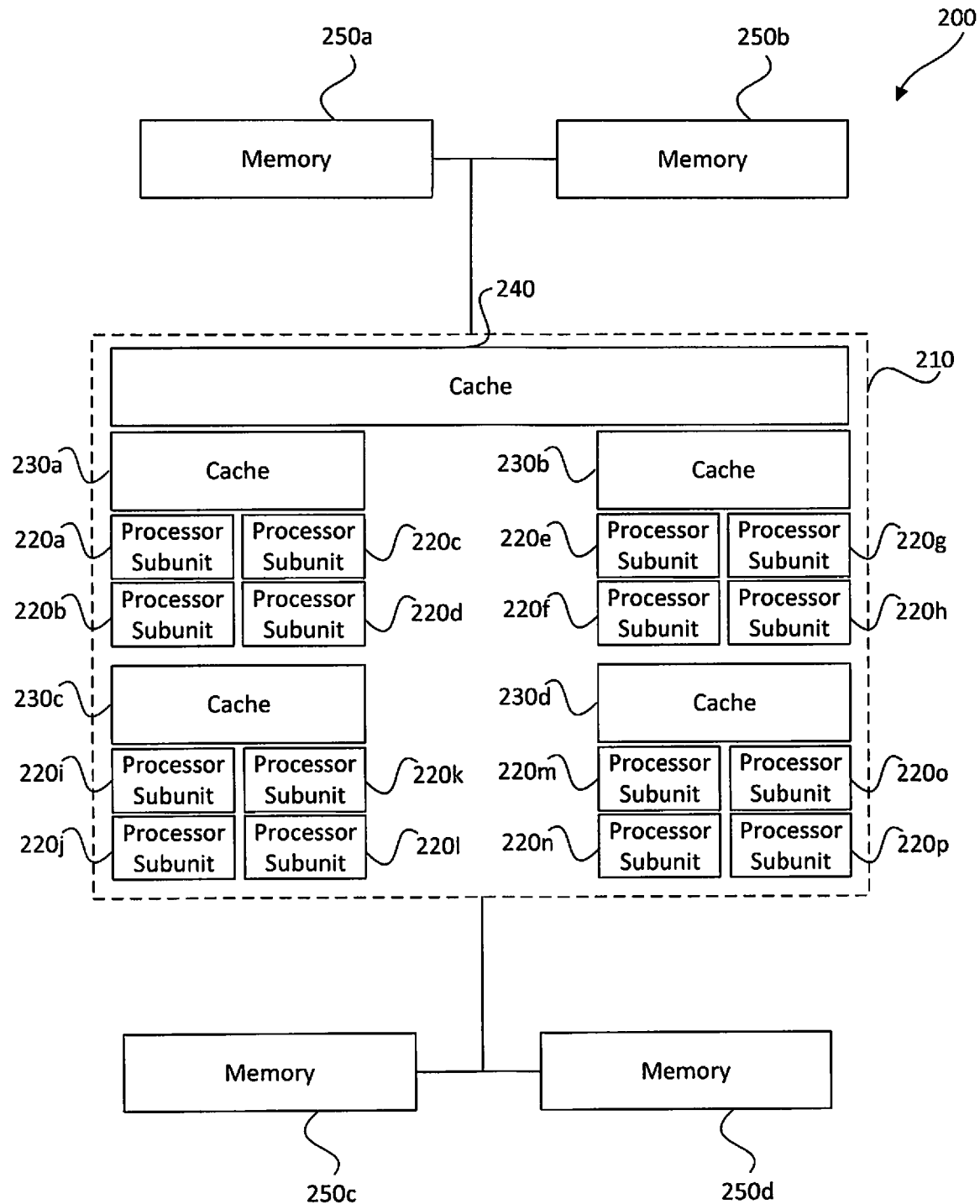
FIG. 2 is a diagrammatic representation of a graphics processing unit (GPU).

As shown in FIG. 2, similar deficiencies persist in GPUs. A GPU 200 may comprise a processing unit 210 that includes one or more processor subunits (e.g., subunits 220a, 220b, 220c, 220d, 220e, 220f, 220g, 220h, 220i, 220j, 220k, 220l, 220m, 220n, 220o, and 220p). Moreover, the processing unit 210 may include one or more levels of on-chip cache and/or register files. Such cache elements are generally formed on the same semiconductor die as processing unit 210. Indeed, in the example of FIG. 2, cache 210 is formed on the same die as processing unit 210 and shared amongst all of the processor subunits, while caches 230a, 230b, 230c, and 230d are formed on a subset of the processor subunits, respectively, and dedicated thereto.

Moreover, processing unit 210 communicates with shared memories 250a, 250b, 250c, and 250d. For example, memories 250a, 250b, 250c, and 250d may represent memory banks of shared DRAM. Accordingly, the processor subunits of processing unit 210 may use shared memories 250a, 250b, 250c, and 250d to store data that is then operated upon by the processor subunits. This arrangement, however, results in the buses between memories 250a, 250b, 250c, and 250d and processing unit 210 acting as a bottleneck, similar to the bottleneck described above for CPUs.

Overview of Disclosed Hardware Chips

Figure 3A:
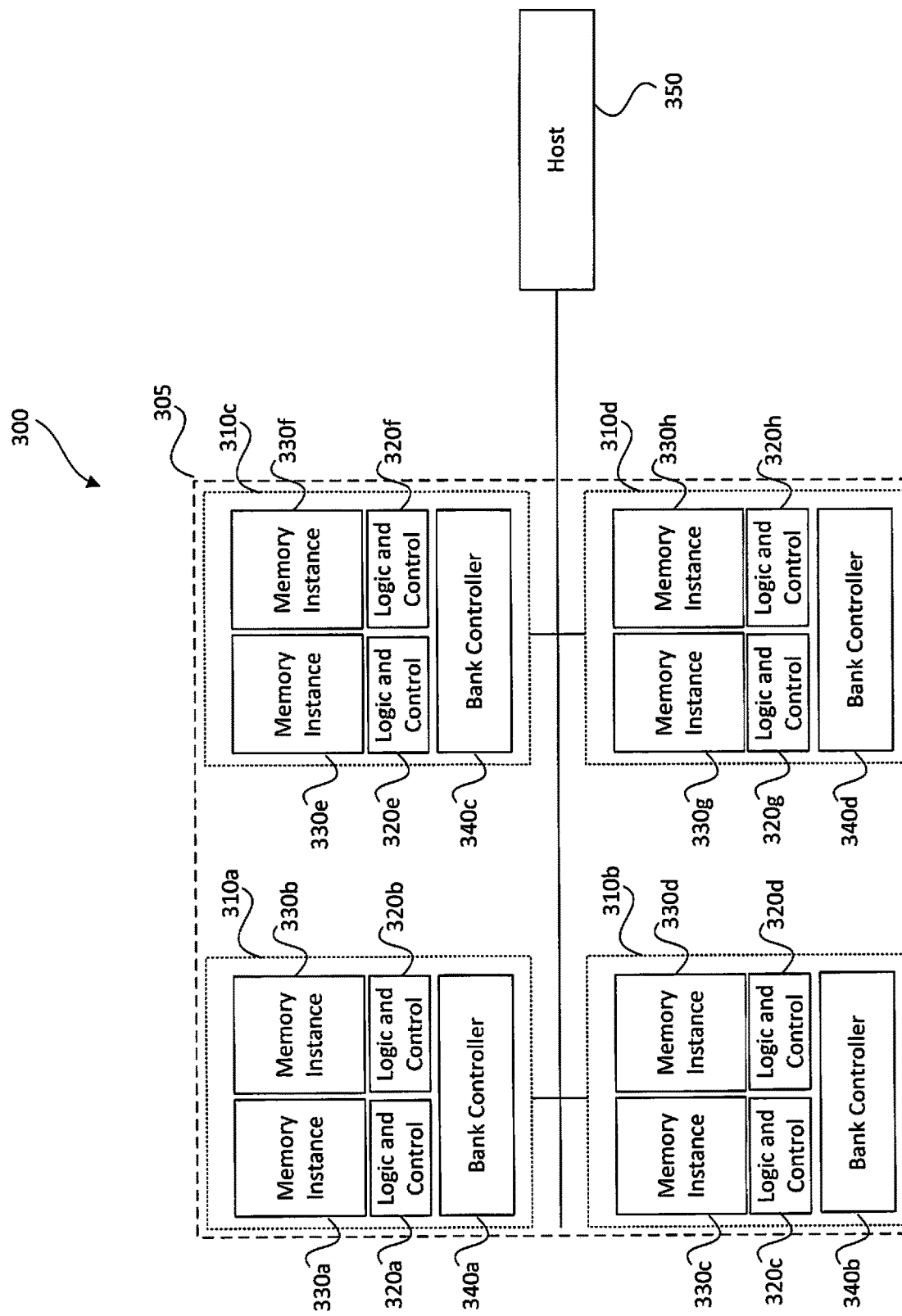
FIG. 3A is a diagrammatic representation of an embodiment of an exemplary hardware chip consistent with the disclosed embodiments.

FIG. 3A is a diagrammatic representation of an embodiment depicting an exemplary hardware chip 300. Hardware chip 300 may comprise a distributed processor designed to mitigate the bottlenecks described above for CPUs, GPUs, and other conventional processors. A distributed processor may include a plurality of processor subunits distributed spatially on a single substrate. Moreover, as explained above, in distributed processors of the present disclosure, corresponding memory banks are also spatially distributed on the substrate. In some embodiments, a distributed processor may be associated with a set of instructions, and each one of the processor subunits of the distributed processor may be responsible for performing one or more tasks included in the set of instructions.

As depicted in FIG. 3A, hardware chip 300 may comprise a plurality of processor subunits, e.g., logic and control subunits 320a, 320b, 320c, 320d, 320e, 320f, 320g, and 320h. As further depicted in FIG. 3A, each processor subunit may have a dedicated memory instance. For example, logic and control subunit 320a is operably connected to dedicated memory instance 330a, logic and control subunit 320b is operably connected to dedicated memory instance 330b, logic and control subunit 320c is operably connected to dedicated memory instance 330c, logic and control subunit 320d is operably connected to dedicated memory instance 330d, logic and control subunit 320e is operably connected to dedicated memory instance 330e, logic and control subunit 320f is operably connected to dedicated memory instance 330f, logic and control subunit 320g is operably connected to dedicated memory instance 330g, and logic and control subunit 320h is operably connected to dedicated memory instance 330h.

Although FIG. 3A depicts each memory instance as a single memory bank, hardware chip 300 may include two or more memory banks as a dedicated memory instance for a processor subunit on hardware chip 300. Furthermore, although FIG. 3A depicts each processor subunit as comprising both a logic component and a control for the dedicated memory bank(s), hardware chip 300 may use controls for the memory banks that are separate, at least in part, from the logic components. Moreover, as depicted in FIG. 3A, two or more processor subunits and their corresponding memory banks may be grouped, e.g., into processing groups 310a, 310b, 310c, and 310d. A "processing group" may represent a spatial distinction on a substrate on which hardware chip 300 is formed. Accordingly, a processing group may include further controls for the memory banks in the group, e.g., controls 340a, 340b, 340c, and 340d. Additionally or alternatively, a "processing group" may represent a logical grouping for the purposes of compiling code for execution on hardware chip 300. Accordingly, a compiler for hardware chip 300 (further described below) may divide an overall set of instructions between the processing groups on hardware chip 300.

Furthermore, host 350 may provide instructions, data, and other input to hardware chip 300 and read output from the same. Accordingly, a set of instructions may be executed entirely on a single die, e.g., the die hosting hardware chip 300. Indeed, the only communications off-die may include the loading of instructions to hardware chip 300, any input sent to hardware chip 300, and any output read from hardware chip 300. Accordingly, all calculations and memory operations may be performed on-die (on hardware chip 300) because the processor subunits of hardware chip 300 communicate with dedicated memory banks of hardware chip 300.

Figure 3B:
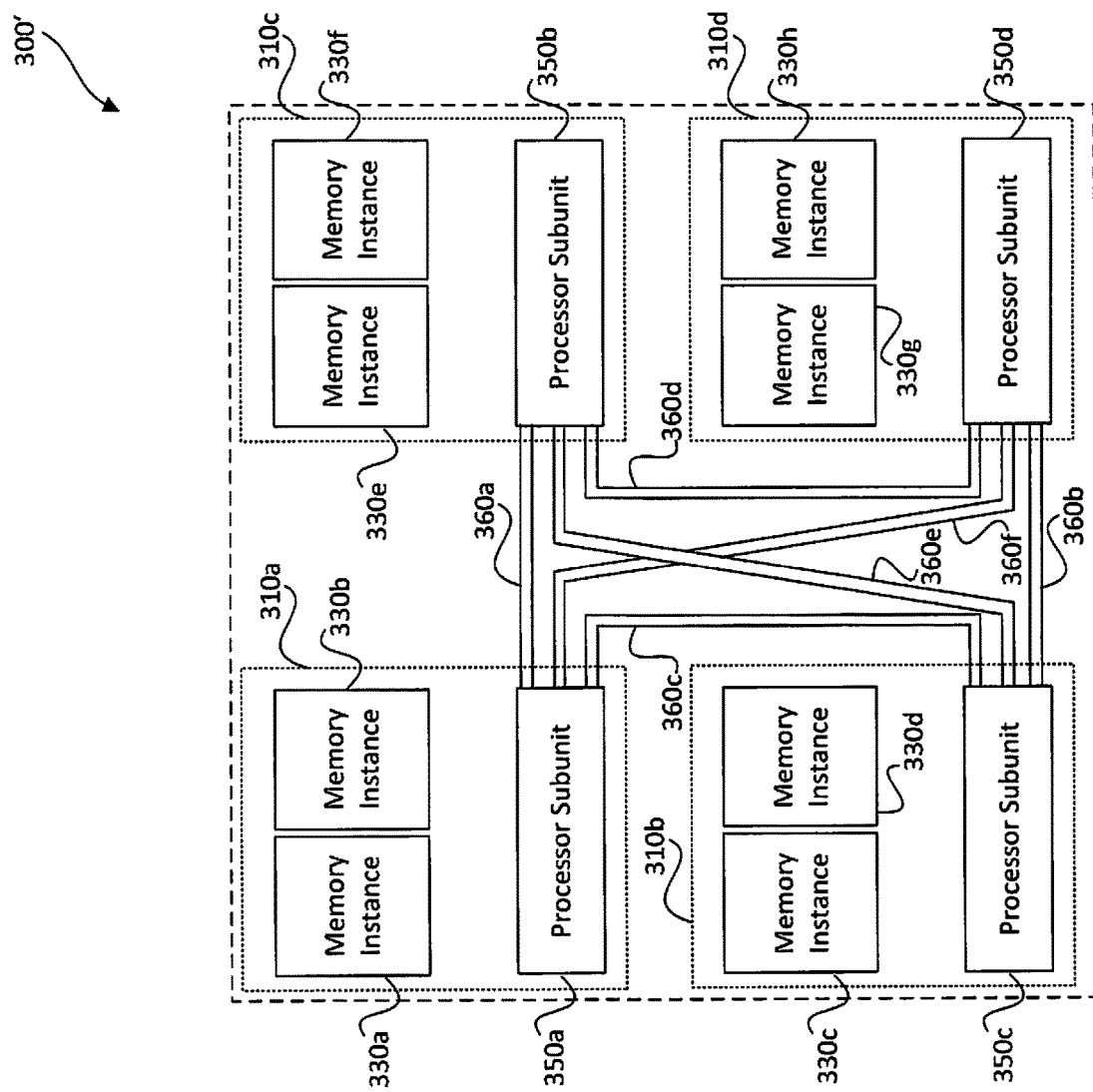
FIG. 3B is a diagrammatic representation of another embodiment of an exemplary hardware chip consistent with the disclosed embodiments.

FIG. 3B is a diagrammatic representation of an embodiment depicting another exemplary hardware chip 300'. Although depicted as an alternative to hardware chip 300, the architecture depicted in FIG. 3B may be combined, at least in part, with the architecture depicted in FIG. 3A.

As depicted in FIG. 3B, hardware chip 300' may comprise a plurality of processor subunits, e.g., processor subunits 350a, 350b, 350c, and 350d. As further depicted in FIG. 3B, each processor subunit may have a plurality of dedicated memory instances. For example, processor subunit 350*a* is operably connected to dedicated memory instances 330*a* and 330*b*, processor subunit 350*b* is operably connected to dedicated memory instances 330*c* and 330*d*, processor subunit 350*c* is operably connected to dedicated memory instances 330*e* and 330*f*, and processor subunit 350*d* is operably connected to dedicated memory instances 330*g* and 330*h*. Moreover, as depicted in FIG. 3B, the processor subunits and their corresponding memory banks may be grouped, e.g., into processing groups 310*a*, 310*b*, 310*c*, and 310*d*. As explained above, a "processing group" may represent a spatial distinction on a substrate on which hardware chip 300' is formed and/or a logical grouping for the purposes of compiling code for execution on hardware chip 300'.

As further depicted in FIG. 3B, the processor subunits may communicate with each other via buses. For example, as shown in FIG. 3B, processor subunit 350*a* may communicate with processor subunit 350*b* via bus 360*a*, with processor subunit 350*c* via bus 360*c*, and with processor subunit 350*d* via bus 360*f*. Similarly, processor subunit 350*b* may communicate with processor subunit 350*a* via bus 360*a* (as described above), with processor subunit 350*c* via bus 360*e*, and with processor subunit 350*d* via bus 360*d*. In addition, processor subunit 350*c* may communicate with processor subunit 350*a* via bus 360*c* (as described above), with processor subunit 350*b* via bus 360*e* (as described above), and with processor subunit 350*d* via bus 360*b*. Accordingly, processor subunit 350*d* may communicate with processor subunit 350*a* via bus 360*f* (as described above), with processor subunit 350*b* via bus 360*d* (as described above), and with processor subunit 350*c* via bus 360*b* (as described above). One of ordinary skill will understand that fewer buses than depicted in FIG. 3B may be used. For example, bus 360*e* may be eliminated such that communications between processor subunit 350*b* and 350*c* pass through processor subunit 350*a* and/or 350*d*. Similarly, bus 360*f* may be eliminated such that communications between processor subunit 350*a* and processor subunit 350*d* pass through processor subunit 350*b* or 350*c*.

Moreover, one of ordinary skill will understand that architectures other than those depicted in FIGS. 3A and 3B may be used. For example, an array of processing groups, each with a single processor subunit and memory instance, may be arranged on a substrate. Processor subunits may additionally or alternatively form part of controllers for corresponding dedicated memory banks, part of controllers for memory mats of corresponding dedicated memory, or the like.

In view of the architecture described above, hardware chips 300 and 300' may provide significant increases in efficiency for memory-intensive tasks as compared with traditional architectures. For example, database operations and artificial intelligence algorithms (such as neural networks) are examples of memory-intensive tasks for which traditional architectures are less efficient than hardware chips 300 and 300'. Accordingly, hardware chips 300 and 300' may be referred to as database accelerator processors and/or artificial intelligence accelerator processors.

Configuring the Disclosed Hardware Chips

The hardware chip architecture described above may be configured for execution of code. For example, each processor subunit may individually execute code (defining a set of instructions) apart from other processor subunits in the hardware chip. Accordingly, rather than relying on an operating system to manage multithreading or using multitasking (which is concurrency rather than parallelism), hardware chips of the present disclosure may allow for processor subunits to operate fully in parallel.

In addition to a fully parallel implementation described above, at least some of the instructions assigned to each processor subunit may be overlapping. For example, a plurality of processor subunits on a distributed processor may execute overlapping instructions as, for example, an implementation of an operating system or other management software, while executing non-overlapping instructions in order to perform parallel tasks within the context of the operating system or other management software.

Figure 4:
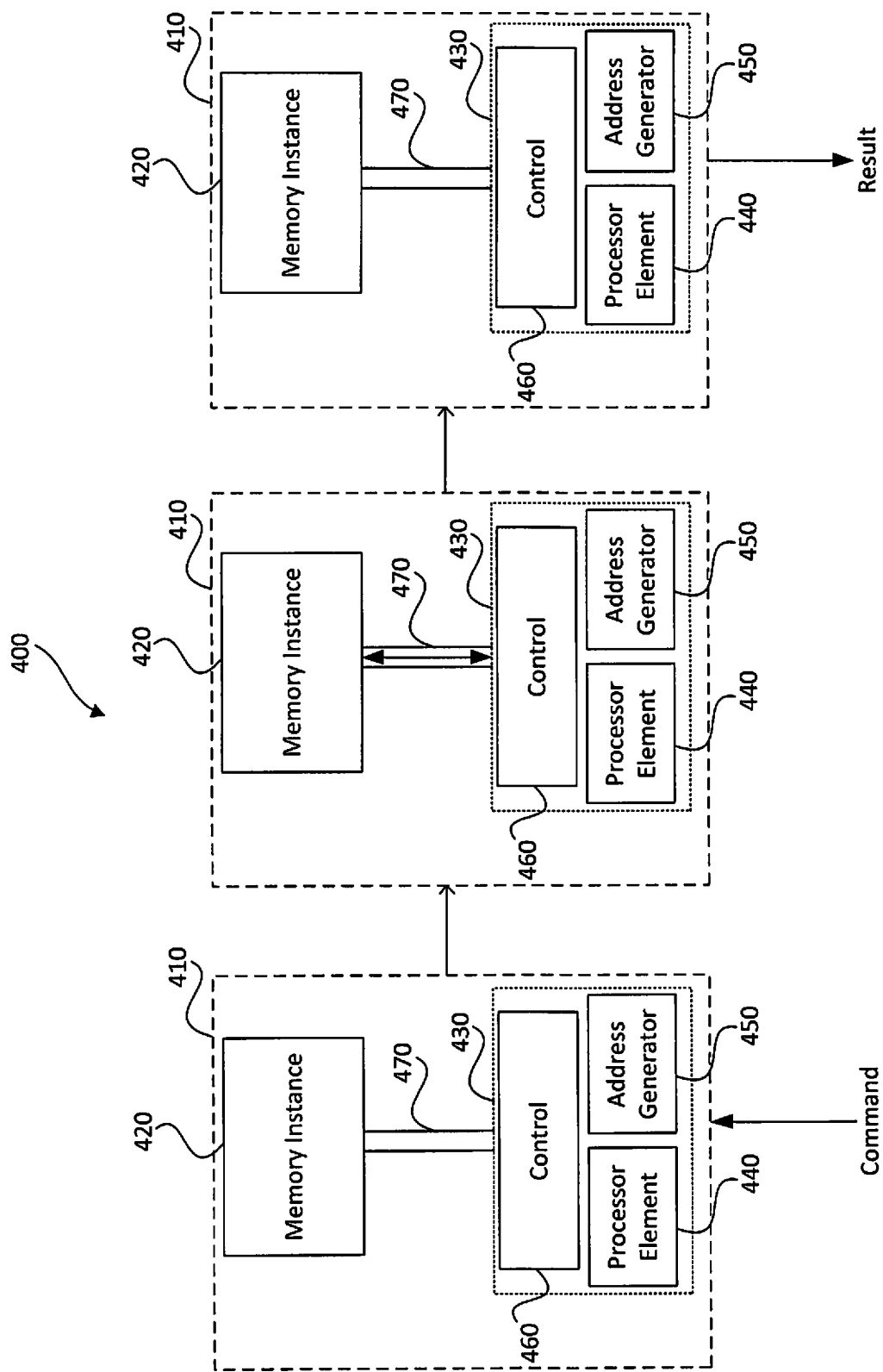
FIG. 4 is a diagrammatic representation of a generic command executed by an exemplary hardware chip consistent with the disclosed embodiments.

FIG. 4 depicts an exemplary process 400 for executing a generic command with processing group 410. For example, processing group 410 may comprise a portion of a hardware chip of the present disclosure, e.g., hardware chip 300, hardware chip 300', or the like.

As depicted in FIG. 4, a command may be sent to processor subunit 430, which is paired with dedicated memory instance 420. An external host (e.g., host 350) may send the command to processing group 410 for execution. Alternatively, host 350 may have sent an instruction set including the command for storage in memory instance 420 such that processor subunit 430 may retrieve the command from memory instance 420 and execute the retrieved command. Accordingly, the command may be executed by processing element 440, which is a generic processing element configurable to execute the received command. Moreover, processing group 410 may include a control 460 for memory instance 420. As depicted in FIG. 4, control 460 may perform any reads and/or writes to memory instance 420 required by processing element 440 when executing the received command. After execution of the command, processing group 410 may output the result of the command, e.g., to the external host or to a different processing group on the same hardware chip.

In some embodiments, as depicted in FIG. 4, processor subunit 430 may further include an address generator 450. An "address generator" may comprise a plurality of processing elements that are configured to determine addresses in one or more memory banks for performing reads and writes and may also perform operations on the data located at the determined addresses (e.g., addition, subtraction, multiplication, or the like). For example, address generator 450 may determine addresses for any reads or writes to memory. In one example, address generator 450 may increase efficiency by overwriting a read value with a new value determined based on the command when the read value is no longer needed. Additionally or alternatively, address generator 450 may select available addresses for storage of results from execution of the command. This may allow for scheduling of result read-off for a later clock cycle, when it is more convenient for the external host. In another example, address generator 450 may determine addresses to read from and write to during a multi-cycle calculation, such as a vector or matrix multiply-accumulate calculation. Accordingly, address generator 450 may maintain or calculate memory addresses for reading data and writing intermediate results of the multi-cycle calculation such that processor subunit 430 may continue processing without having to store these memory addresses.

Figure 5:
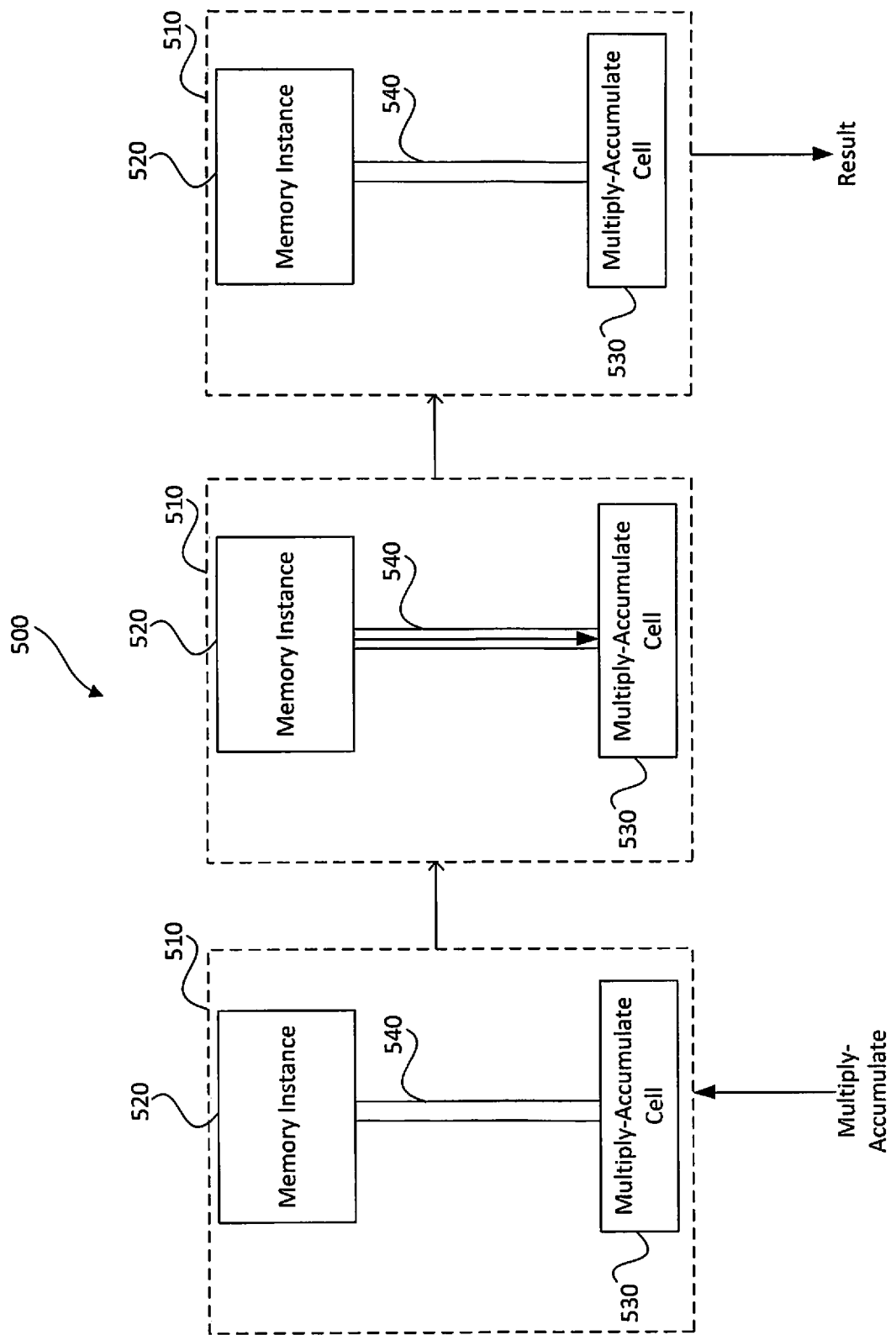
FIG. 5 is a diagrammatic representation of a specialized command executed by an exemplary hardware chip consistent with the disclosed embodiments.

FIG. 5 depicts an exemplary process 500 for executing a specialized command with processing group 510. For example, processing group 510 may comprise a portion of a hardware chip of the present disclosure, e.g., hardware chip 300, hardware chip 300', or the like.

As depicted in FIG. 5, a specialized command (e.g., a multiply-accumulate command) may be sent to processing element 530, which is paired with dedicated memory instance 520. An external host (e.g., host 350) may send the command to processing element 530 for execution. Accordingly, the command may be executed at a given signal from the host by processing element 530, a specialized processing element configurable to execute particular commands (including the received command). Alternatively, processing element 530 may retrieve the command from memory instance 520 for execution. Thus, in the example of FIG. 5, processing element 530 is a multiply-accumulate (MAC) circuit configured to execute MAC commands received from the external host or retrieved from memory instance 520. After execution of the command, processing group 410 may output the result of the command, e.g., to the external host or to a different processing group on the same hardware chip. Although depicted with a single command and a single result, a plurality of commands may be received or retrieved and executed, and a plurality of results may be combined on processing group 510 before output.

Although depicted as a MAC circuit in FIG. 5, additional or alternative specialized circuits may be included in processing group 510. For example, a MAX-read command (which returns the max value of a vector) a MAX0-read command (a common function also termed a rectifier, which returns the entire vector but also does MAX with 0), or the like may be implemented.

Although depicted separately, the generalized processing group 410 of FIG. 4 and the specialized processing group 510 of FIG. 5 may be combined. For example, a generic processor subunit may be coupled to one or more specialized processor subunits to form a processor subunit. Accordingly, the generic processor subunit may be used for all instructions not executable by the one or more specialized processor subunits.

One of ordinary skill will understand that neural network implementation and other memory-intensive tasks may be handled with specialized logic circuits. For example, database queries, packet inspection, string comparison, and other functions may increase in efficiency if executed by the hardware chips described herein.

A Memory-Based Architecture for Distributed Processing

On hardware chips consistent with the present disclosure, dedicated buses may transfer data between processor subunits on the chip and/or between the processor subunits and their corresponding dedicated memory banks. The use of dedicated buses may reduce arbitration costs because competing requests are either not possible or easily avoided using software rather than hardware.

Figure 6:
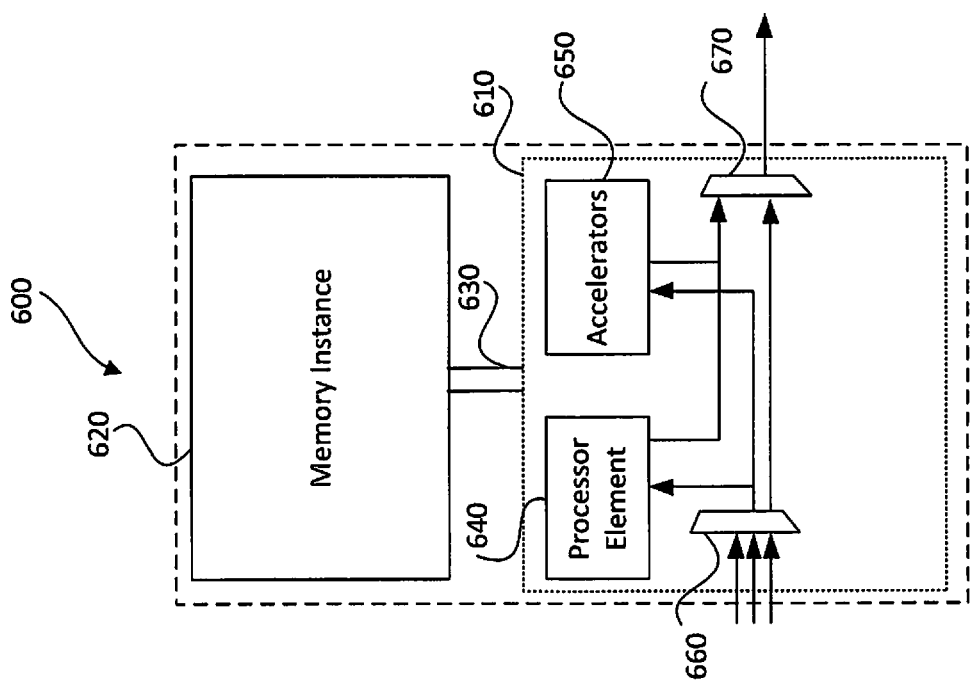
FIG. 6 is a diagrammatic representation of a processing group for use in an exemplary hardware chip consistent with the disclosed embodiments.

FIG. 6 schematically depicts a diagrammatic representation of a processing group 600. Processing group 600 may be for use in a hardware chip, e.g., hardware chip 300, hardware chip 300', or the like. Processor subunit 610 may be connected via buses 630 to memory 620. Memory 620 may comprise a Randomly Accessible Memory (RAM) element that stores data and code for execution by processor subunit 610. In some embodiments, memory 620 may be an N-Way memory (wherein N is a number equal to or larger than 1 that implies the number of segments in an interleaved memory 620). Because processor subunit 610 is coupled to memory 620 dedicated to processor subunit 610 via bus 630, N may be kept relatively small without compromising the execution performance. This represents an improvement over conventional multiway register files or caches where a lower N generally results in lower execution performance, and a higher N generally results in large area and power loss.

The size of memory 620, the number of ways, and the width of bus 630 may be adjusted to meet the requirements of tasks and application implementations of a system using processing group 600 according to, for instance, the size of data involved in the task or tasks. Memory element 620 may comprise one or more types of memory known in the art, e.g., volatile memory (such as RAM, DRAM, SRAM, phase-change RAM (PRAM), magnetoresistive RAM (MRAM), resistive RAM (ReRAM), or the like) or non-volatile memory (such as flash or ROM). According to some embodiments, a portion of memory element 620 may comprise a first memory type, while another portion may comprise another memory type. For instance, the code region of a memory element 620 may comprise a ROM element, while a data region of the memory element 620 may comprise a DRAM element. Another example for such partitioning is storing the weights of a neural network in flash while storing the data for calculation in DRAM.

Processor subunit 610 comprises a processing element 640 that may comprise a processor. The processor can be pipelined or not pipelined, a customized Reduced Instruction Set Computing (RISC) element or other processing scheme, implemented on any commercial Integrated Circuit (IC) known in the art (such as ARM, ARC, RISC-V, etc.), as appreciated by one of ordinary skill. Processing element 640 may comprise a controller that, in some embodiments, includes an Arithmetic Logic Unit (ALU) or other controller.

According to some embodiments, processing element 640, which executes received or stored code, may comprise a generic processing element and, therefore, be flexible and capable of performing a wide variety of processing operations. Non-dedicated circuitry typically consumes more power than specific-operation-dedicated circuitry when comparing the power consumed during performance for a specific operation. Therefore, when performing specific complex arithmetic calculations, processing element 640 may consume more power and perform less efficiently than dedicated hardware. Therefore, according to some embodiments, a controller of processing element 640 may be designed to perform specific operations (e.g., addition or "move" operations).

In one example, the specific operations may be performed by one or more accelerators 650. Each accelerator may be dedicated and programmed to perform a specific calculation (such as multiplication, floating point vector operations, or the like). By using accelerator(s), the average power consumed per calculation per processor subunit may be lowered, and the calculation throughput henceforth increases. Accelerator(s) 650 may be chosen according to an application that the system is designed to implement (e.g., execution of neural networks, execution of database queries, or the like). Accelerator(s) 650 may be configured by processing element 640 and may operate in tandem therewith for lowering power consumption and accelerating calculations and computations. The accelerators may additionally or alternatively be used to transfer data between memory and MUXs/DEMUXs/input/output ports (e.g., MUX 650 and DEMUX 660) of processing group 600, such as a smart DMA (direct memory access) peripheral.

Accelerator(s) 650 may be configured to perform a variety of functions. For instance, one accelerator may be configured to perform 16-bit floating point calculation or 8-bit integer calculations, which are often used in neural networks. Another example of an accelerator function is a 32-bit floating point calculation, which is often used during a training stage of a neural network. Yet another example of an accelerator function is query processing, such as that used in databases. In some embodiments, accelerator(s) 650 may comprise specialized processing elements to perform these functions and/or may be configured according to configuration data, stored on the memory element 620, such that it may be modified.

Accelerator(s) 650 may additionally or alternatively implement a configurable scripted list of memory movements to time movements of data to/from memory 620 or to/from other accelerators and/or inputs/outputs. Accordingly, as explained further below, all the data movement inside the hardware chip using processing group 600 may use software synchronization rather than hardware synchronization. For example, an accelerator in one processing group (e.g., group 600) may transfer data from its input to its accelerator every tenth cycle and then output data at the next cycle, thereby letting the information flow from the memory of the processing group to another one.

As further depicted in FIG. 6, in some embodiments, processing group 600 may further comprise at least one input multiplexer (MUX) 660 connected to its input port and at least one output DEMUX 670 connected to its output port. These MUXs/DEMUXs may be controlled by control signals (not shown) from processing element 640 and/or from one of accelerator(s) 650, determined according to a current instruction being carried out by processing element 640 and/or the operation executed by an accelerator of accelerator(s) 650. In some scenarios, processing group 600 may be required (according to a predefined instruction from its code memory) to transfer data from its input port to its output port. Accordingly, one or more of the input MUXs (e.g., MUX 660) may be directly connected via one or more buses to an output DEMUX (e.g., DEMUX 670), in addition to each of the DEMUXs/MUXs being connected to processing element 640 and accelerator(s) 650.

Figure 7A:
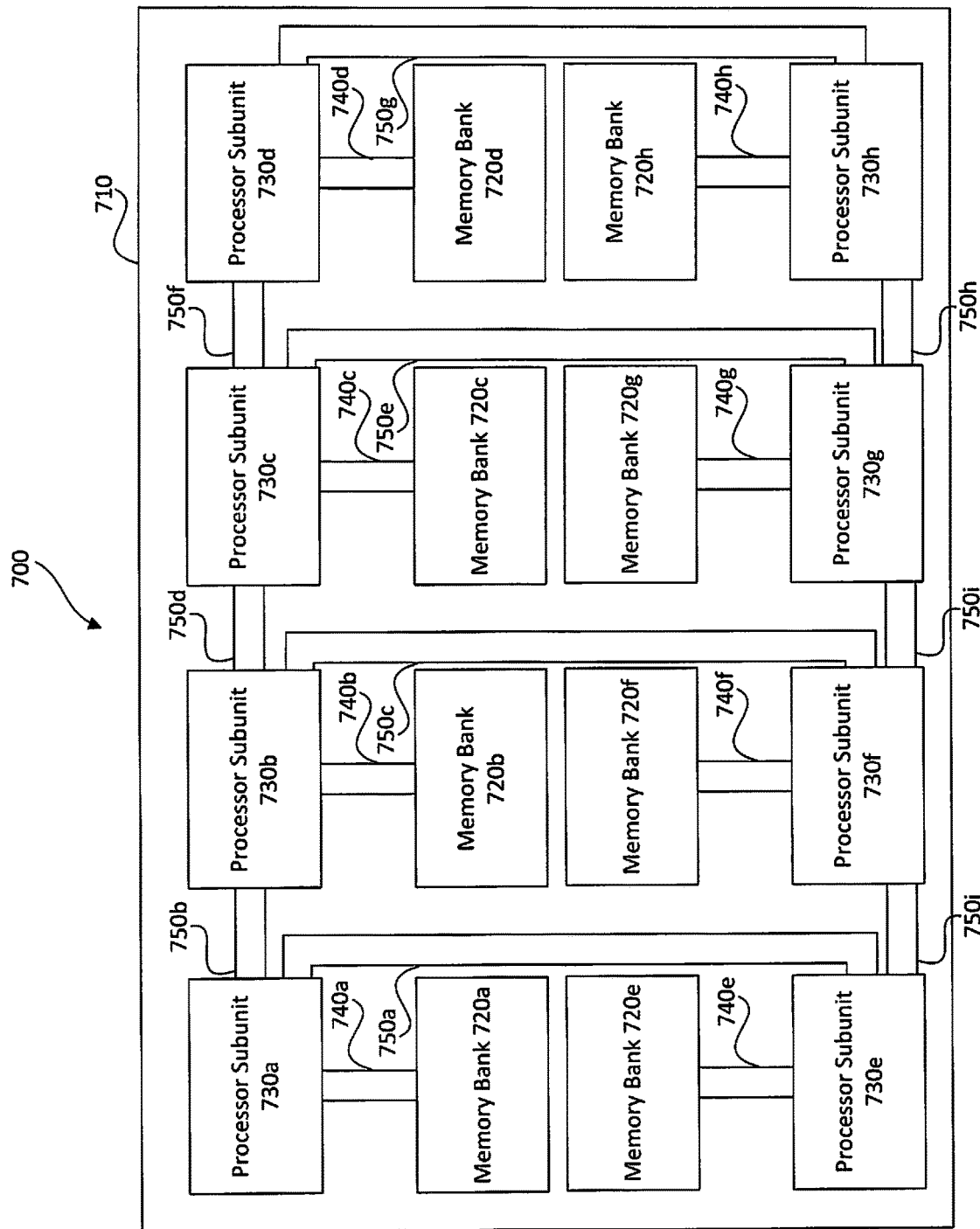
FIG. 7A is a diagrammatic representation of a rectangular array of processing groups consistent with the disclosed embodiments.

The processing group 600 of FIG. 6 may be arrayed to form a distributed processor, for example, as depicted in FIG. 7A. The processing groups may be disposed on substrate 710 to form an array. In some embodiments, substrate 710 may comprise a semiconductor substrate, such as silicon. Additionally or alternatively, substrate 710 may comprise a circuit board, such as a flexible circuit board.

As depicted in FIG. 7A, substrate 710 may include, disposed thereon, a plurality of processing groups, such as processing group 600. Accordingly, substrate 710 includes a memory array that includes a plurality of banks, such as banks 720a, 720b, 720c, 720d, 720e, 720f, 720g, and 720h. Furthermore, substrate 710 includes a processing array that may include a plurality of processor subunits, such as subunits 730a, 730b, 730c, 730d, 730e, 730f, 730g, and 730h.

Furthermore, as explained above, each processing group may include a processor subunit and one or more corresponding memory banks dedicated to the processor subunit. Accordingly, as depicted in FIG. 7A, each subunit is associated with a corresponding, dedicated memory bank, e.g.: Processor subunit 730a is associated with memory bank 720a, processor subunit 730b is associated with memory bank 720b, processor subunit 730c is associated with memory bank 720c, processor subunit 730d is associated with memory bank 720d, processor subunit 730e is associated with memory bank 720e, processor subunit 730f is associated with memory bank 720f, processor subunit 730g is associated with memory bank 720g, processor subunit 730h is associated with memory bank 720h.

To allow each processor subunit to communicate with its corresponding, dedicated memory bank(s), substrate 710 may include a first plurality of buses connecting one of the processor subunits to its corresponding, dedicated memory bank(s). Accordingly, bus 740a connects processor subunit 730a to memory bank 720a, bus 740b connects processor subunit 730b to memory bank 720b, bus 740c connects processor subunit 730c to memory bank 720c, bus 740d connects processor subunit 730d to memory bank 720d, bus 740e connects processor subunit 730e to memory bank 720e, bus 740f connects processor subunit 730f to memory bank 720f, bus 740g connects processor subunit 730g to memory bank 720g, and bus 740h connects processor subunit 730h to memory bank 720h. Moreover, to allow each processor subunit to communicate with other processor subunits, substrate 710 may include a second plurality of buses connecting one of the processor subunits to another of the processor subunits. In the example of FIG. 7A, bus 750a connects processor subunit 730a to processor subunit 750e, bus 750b connects processor subunit 730a to processor subunit 750b, bus 750c connects processor subunit 730b to processor subunit 750f, bus 750d connects processor subunit 730b to processor subunit 750c, bus 750e connects processor subunit 730c to processor subunit 750g, bus 750f connects processor subunit 730c to processor subunit 750d, bus 750g connects processor subunit 730d to processor subunit 750h, bus 750h connects processor subunit 730h to processor subunit 750g, bus 750i connects processor subunit 730g to processor subunit 750g, and bus 750j connects processor subunit 730f to processor subunit 750e.

Accordingly, in the example arrangement shown in FIG. 7A, the plurality of logic processor subunits is arranged in at least one row and at least one column. The second plurality of buses connect each processor subunit to at least one adjacent processor subunit in the same row and to at least one adjacent processor subunit in the same column. FIG. 7A may be referred to as a "partial tile connection."

The arrangement shown in FIG. 7A may be modified to form a "full tile connection." A full tile connection includes additional buses connecting diagonal processor subunits. For example, the second plurality of buses may include additional buses between processor subunit 730a and processor subunit 730f, between processor subunit 730b and processor subunit 730e, between processor subunit 730b and processor subunit 730g, between processor subunit 730c and processor subunit 730f, between processor subunit 730c and processor subunit 730h, and between processor subunit 730d and processor subunit 730g.

A full tile connection may be used for convolution calculations, in which data and results stored in a near processor subunit are used. For example, during convolutional image processing, each processor subunit may receive a tile of the image (such as a pixel or a group of pixels). In order to calculate the convolution results, each processor subunit may acquire data from all eight adjacent processor subunits, each of which have received a corresponding tile. In a partial tile connection, the data from the diagonal adjacents may be passed through other adjacent processor subunits connected to the processor subunit. Accordingly, the distributed processor on a chip may be an artificial intelligence accelerator processor.

In a specific example of a convolutional calculation, an N×M image may be divided across a plurality of processor subunits. Each processor subunit may perform a convolution with an A×B filter on its corresponding tile. To perform the filtering on one or more pixels on a boundary between tiles, each processor subunit may require data from neighboring processor subunits having tiles including pixels on the same boundary. Accordingly, the code generated for each processor subunit configures the subunit to calculate the convolutions and pull from one of the second plurality of buses whenever data is needed from an adjacent subunit. Corresponding commands to output data to the second plurality of buses are provided to the subunits to ensure proper timing of needed data transfers.

The partial tile connection of FIG. 7A may be modified to be an N-partial tile connection. In this modification, the second plurality of buses may further connect each processor subunit to processor subunits within a threshold distance of the processor subunit (e.g., within n processor subunits) in the four directions along which the buses of FIG. 7A run (i.e., up, down, left, and right). A similar modification may be made to the full-tile connection (to result in an N-full tile connection) such that the second plurality of buses further connects each processor subunit to processor subunits within a threshold distance of the processor subunit (e.g., within n processor subunits) in the four directions along which the buses of FIG. 7A run in additional to the two diagonal directions.

Other arrangements are possible. For example, in the arrangement shown in FIG. 7B, bus 750*a* connects processor subunit 730*a* to processor subunit 730*d*, bus 750*b* connects processor subunit 730*a* to processor subunit 730*b*, bus 750*c* connects processor subunit 730*b* to processor subunit 730*c*, and bus 750*d* connects processor subunit 730*c* to processor subunit 730*d*. Accordingly, in the example arrangement shown in FIG. 7B, the plurality of processor subunits is arranged in a star pattern. The second plurality of buses connect each processor subunit to at least one adjacent processor subunit within the star pattern.

Further arrangements (not shown) are possible. For example, a neighbor connection arrangement may be used such that the plurality of processor subunits is arranged in one or more lines (e.g., similar to that depicted in FIG. 7A). In a neighbor connection arrangement, the second plurality of buses connect each processor subunit to a processor subunit to the left in the same line, to a processor subunit to the right in the same line, to the processor subunits both to the left and to the right in the same line, etc.

In another example, an N-linear connection arrangement may be used. In an N-linear connection arrangement, the second plurality of buses connect each processor subunit to processor subunits within a threshold distance of the processor subunit (e.g., within n processor subunits). The N-linear connection arrangement may be used with the line array (described above), the rectangular array (depicted in FIG. 7A), the elliptical array (depicted in FIG. 7B), or any other geometrical array.

In yet another example, an N-log connection arrangement may be used. In an N-log connection arrangement, the second plurality of buses connect each processor subunit to processor subunits within a threshold power of two distance of the processor subunit (e.g., within $2^n$ processor subunits). The N-log connection arrangement may be used with the line array (described above), the rectangular array (depicted in FIG. 7A), the elliptical array (depicted in FIG. 7B), or any other geometrical array.

Any of the connection schemes described above may be combined for use in the same hardware chip. For example, a full tile connection may be used in one region while a partial tile connection is used in another region. In another example, an N-linear connection arrangement may be used in one region while an N-full tile connection is used in another region.

Alternatively to or in addition with dedicated buses between processor subunits of the memory chip, one or more shared buses may be used to interconnect all (or a subset of) the processor subunits of a distributed processor. Collisions on the shared buses may still be avoided by timing data transfers on the shared buses using code executed by the processor subunits, as explained further below. Additionally with or alternatively to shared buses, configurable buses may be used to dynamically connect processor subunits to form groups of processors units connected to separated buses. For example, the configurable buses may include transistors or other mechanisms that may be controlled by processor subunit to direct data transfers to a selected processor subunit.

Figure 7B:
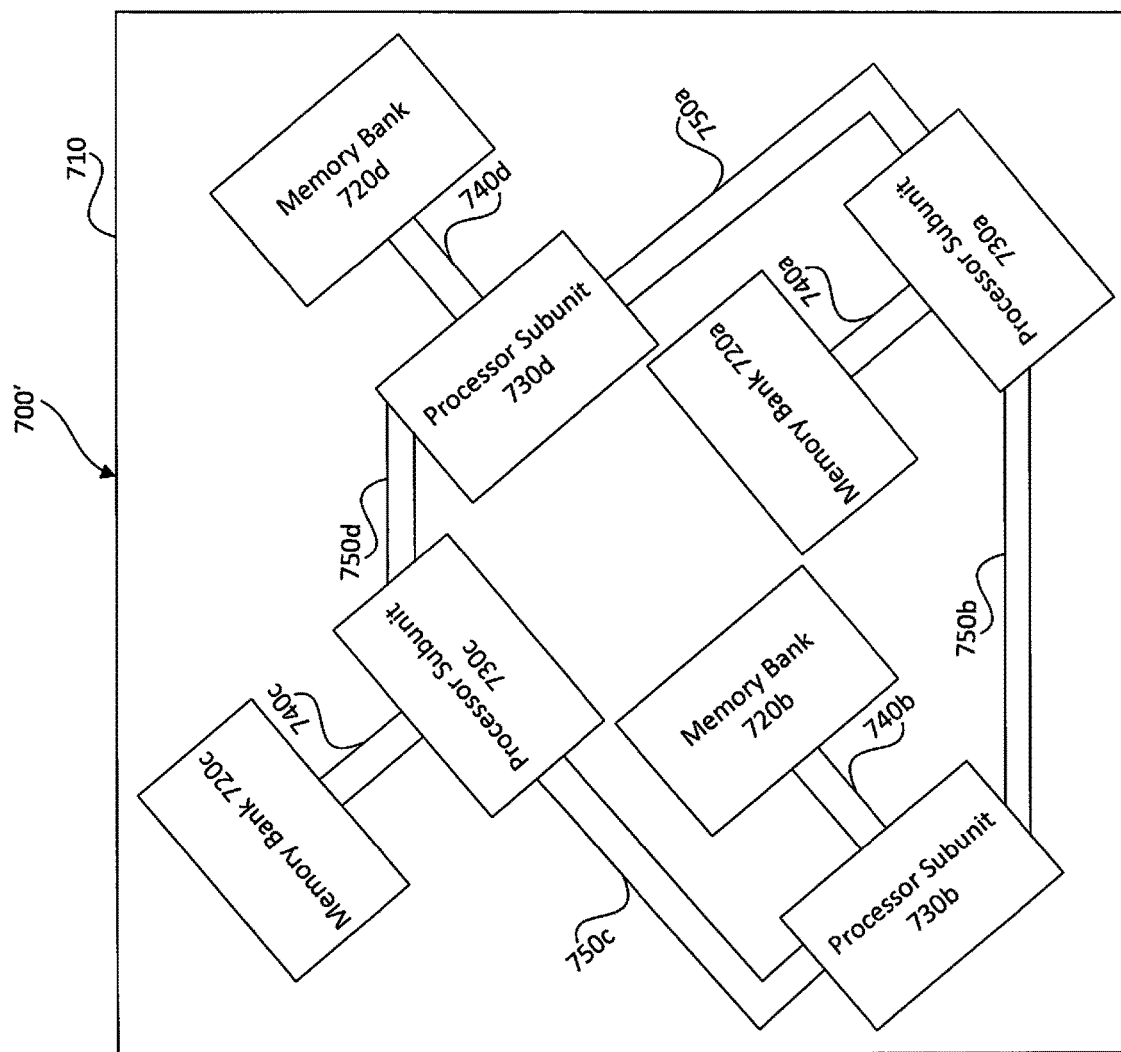
FIG. 7B is a diagrammatic representation of an elliptical array of processing groups consistent with the disclosed embodiments.

In both FIGS. 7A and 7B, the plurality of processor subunits of the processing array is spatially distributed among the plurality of discrete memory banks of the memory array. In other alternative embodiments (not shown), the plurality of processor subunits may be clustered in one or more regions of the substrate, and the plurality of memory banks may be clustered in one or more other regions of the substrate. In some embodiments, a combination of spatial distribution and clustering may be used (not shown). For example, one region of the substrate may include a cluster of processor subunits, another region of the substrate may include a cluster of memory banks, and yet another region of the substrate may include processing arrays distributed amongst memory banks.

One of ordinary skill will recognize that arraying processor groups 600 on a substrate is not an exclusive embodiment. For example, each processor subunit may be associated with at least two dedicated memory banks. Accordingly, processing groups 310*a*, 310*b*, 310*c*, and 310*d* of FIG. 3B may be used in lieu of or in combination with processing group 600 to form the processing array and the memory array. Other processing groups including, for example, three, four, or more dedicated memory banks (not shown) may be used.

Each of the plurality of processor subunits may be configured to execute software code associated with a particular application independently, relative to other processor subunits included in the plurality of processor subunits. For example, as explained below, a plurality of sub-series of instructions may be grouped as machine code and provided to each processor subunit for execution.

In some embodiments, each dedicated memory bank comprises at least one dynamic random access memory (DRAM). Alternatively, the memory banks may comprise a mix of memory types, such as static random access memory (SRAM), DRAM, Flash or the like.

In conventional processors, data sharing between processor subunits is usually performed with shared memory. Shared memory typically requires a large portion of chip area and/or performed a bus that is managed by additional hardware (such as arbiters). The bus results in bottlenecks, as described above. In addition, the shared memory, which may be external to the chip, typically includes cache coherency mechanisms and more complex caches (e.g., L1 cache, L2 cache, and shared DRAM) in order to provide accurate and up-to-date data to the processor subunits. As explained further below, the dedicated buses depicted in FIGS. 7A and 7B allow for hardware chips that are free of hardware management (such as arbiters). Moreover, the use of dedicated memories as depicted in FIGS. 7A and 7B allow for the elimination of complex caching layers and coherency mechanism.

Instead, in order to allow each processor subunit to access data calculated by other processor subunits and/or stored in memory banks dedicated to the other processor subunits, buses are provided whose timing is performed dynamically using code individually executed by each processor subunit. This allows for elimination of most, if not all, bus management hardware as conventionally used. Moreover, complex caching mechanisms are replaced with direct transfers over these buses, resulting in lower latency times during memory reads and writes.

Memory-Based Processing Arrays

As depicted in FIGS. 7A and 7B, a memory chip of the present disclosure may operate independently. Alternatively, memory chips of the present disclosure may be operably connected with one or more additional integrated circuits, such as a memory device (e.g., one or more DRAM banks), a system-on-a-chip, a field-programmable gate array (FPGA), or other processing and/or memory chip. In such embodiments, tasks in a series of instructions executed by the architecture may be divided (e.g., by a compiler, as described below) between processor subunits of the memory chip and any processor subunits of the additional integrated circuit(s). For example, the other integrated circuits may comprise a host (e.g., host 350 of FIG. 3A) that inputs instructions and/or data to the memory chip and receives output therefrom.

In order to interconnect memory chips of the present disclosure with one or more additional integrated circuits, the memory chip may include a memory interface, such as a memory interface complying with a Joint Electron Device Engineering Council (JEDEC) standard or any of its variants. The one or more additional integrated circuits may then connect to the memory interface. Accordingly, if the one or more additional integrated circuits are connected to a plurality of memory chips of the present disclosure, data may be shared between the memory chips through the one or more additional integrated circuits. Additionally or alternatively, the one or more additional integrated circuits may include buses to connect to buses on the memory chips of the present disclosure such that the one or more additional integrated circuits may execute code in tandem with the memory chips of the present disclosure. In such embodiments, the one or more additional integrated circuits further assist with distributed processing even though they may be on different substrates than the memory chips of the present disclosure.

Figure 7C:
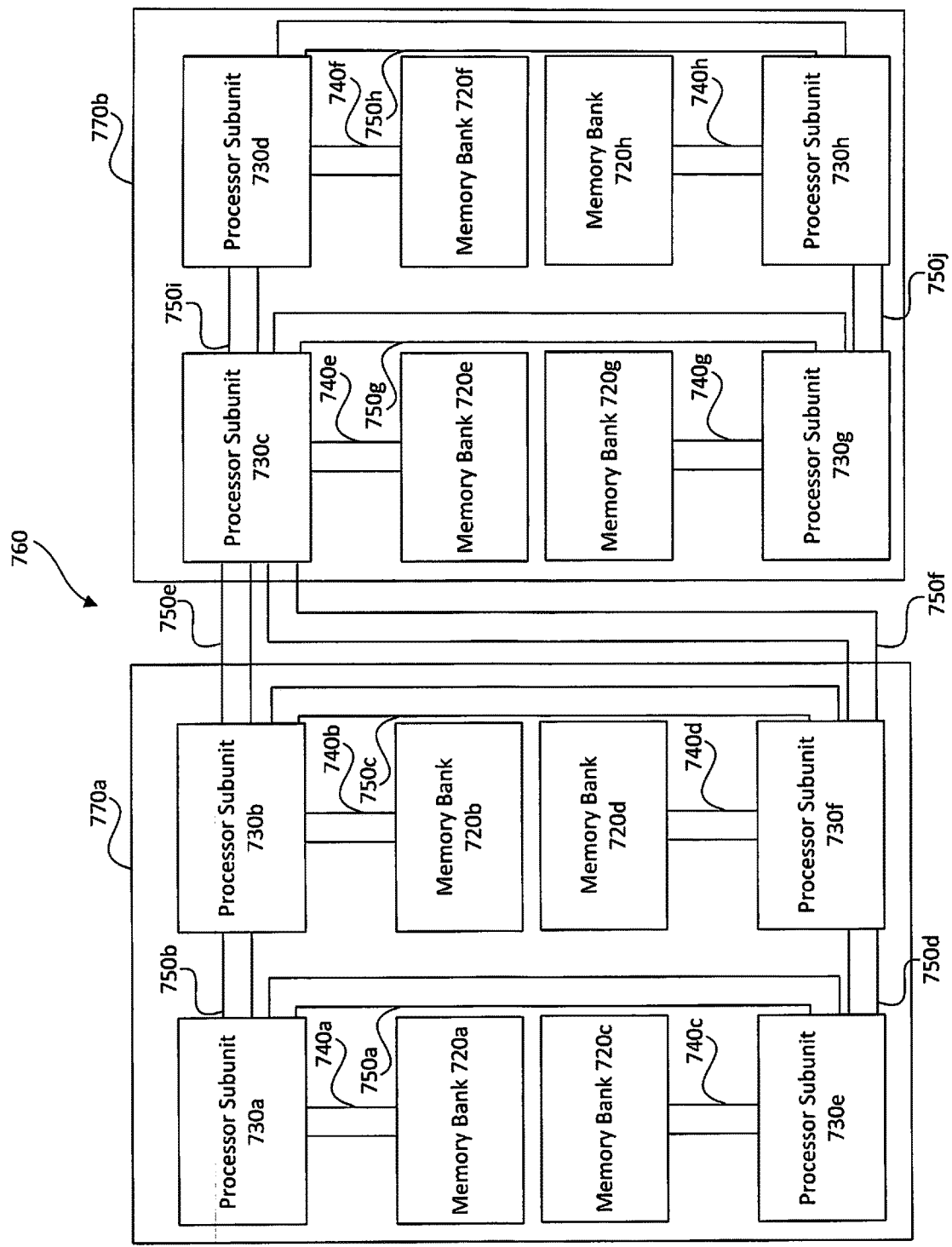
FIG. 7C is a diagrammatic representation an array of hardware chips consistent with the disclosed embodiments.
Figure 7D:
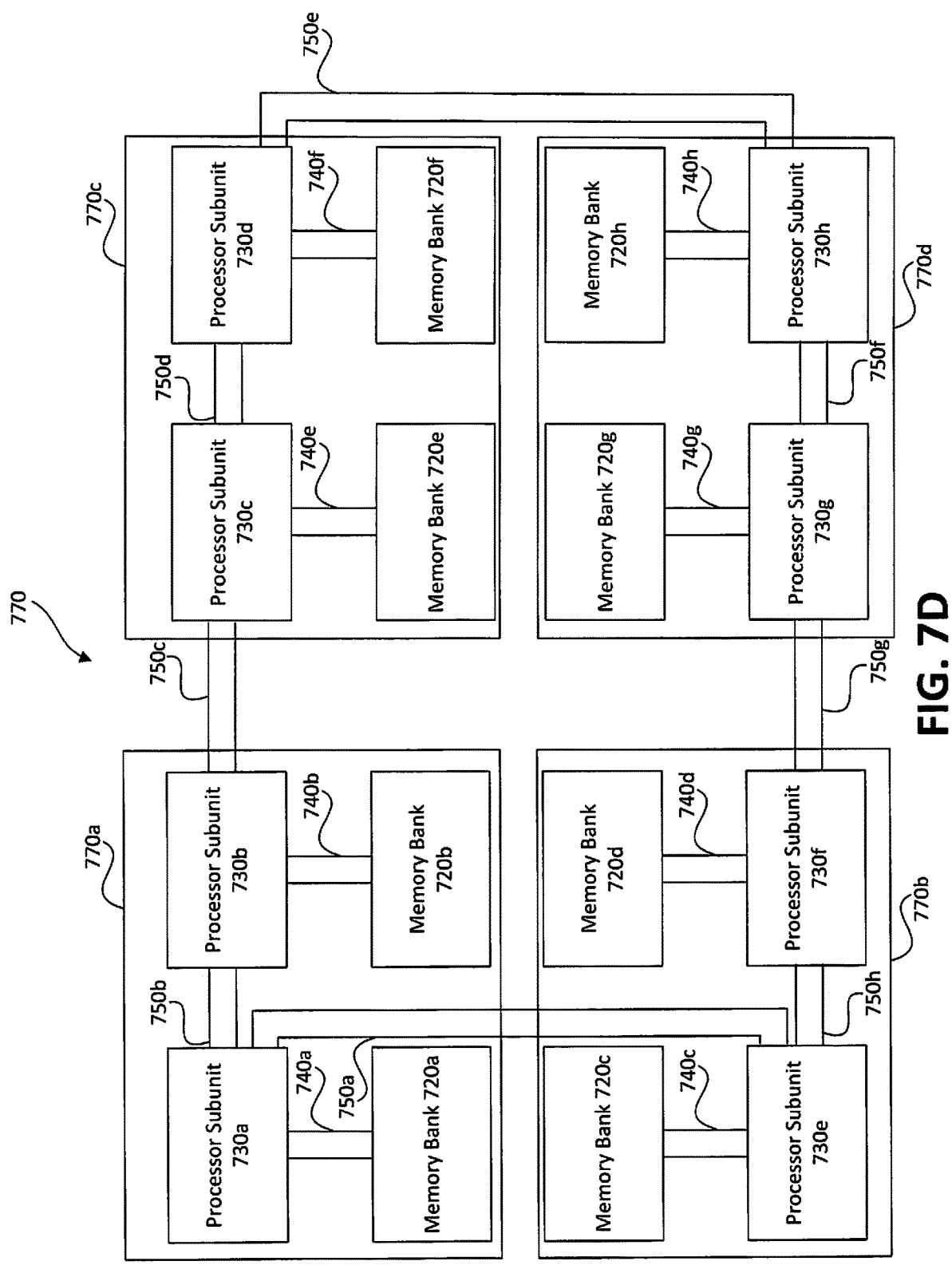
FIG. 7D is a diagrammatic representation another array of hardware chips consistent with the disclosed embodiments.

Furthermore, memory chips of the present disclosure may be arrayed in order to form an array of distributed processors. For example, one or more buses may connect a memory chip 770a to an additional memory chip 770b, as depicted in FIG. 7C. In the example of FIG. 7C, memory chip 770a includes processor subunits with one or more corresponding memory banks dedicated to each processor subunit, e.g.: Processor subunit 730a is associated with memory bank 720a, processor subunit 730b is associated with memory bank 720b, processor subunit 730e is associated with memory bank 720c, and processor subunit 730f is associated with memory bank 720d. Buses connect each processor subunit to its corresponding memory bank. Accordingly, bus 740a connects processor subunit 730a to memory bank 720a, bus 740b connects processor subunit 730b to memory bank 720b, bus 740c connects processor subunit 730e to memory bank 720c, and bus 740d connects processor subunit 730f to memory bank 720d. Moreover, bus 750a connects processor subunit 730a to processor subunit 750e, bus 750b connects processor subunit 730a to processor subunit 750b, bus 750c connects processor subunit 730b to processor subunit 750f, and bus 750d connects processor subunit 730e to processor subunit 750f. Other arrangements of memory chip 770a may be used, for example, as described above.

Similarly, memory chip 770b includes processor subunits with one or more corresponding memory banks dedicated to each processor subunit, e.g.: Processor subunit 730c is associated with memory bank 720e, processor subunit 730d is associated with memory bank 720f, processor subunit 730g is associated with memory bank 720g, and processor subunit 730h is associated with memory bank 720h. Buses connect each processor subunit to its corresponding memory bank. Accordingly, bus 740e connects processor subunit 730c to memory bank 720e, bus 740f connects processor subunit 730d to memory bank 720f, bus 740g connects processor subunit 730g to memory bank 720g, and bus 740h connects processor subunit 730h to memory bank 720h. Moreover, bus 750g connects processor subunit 730c to processor subunit 750g, bus 750h connects processor subunit 730d to processor subunit 750h, bus 750i connects processor subunit 730c to processor subunit 750d, and bus 750j connects processor subunit 730g to processor subunit 750h. Other arrangements of memory chip 770b may be used, for example, as described above.

The processor subunits of memory chip 770a and 770b may be connected using one or more buses. Accordingly, in the example of FIG. 7C, bus 750e may connect processor subunit 730b of memory chip 770a and processor subunit 730c of memory chip 770b, and bus 750f may connect processor subunit 730f of memory chip 770a and processor subunit 730c of memory 770b. For example, bus 750e may serve as an input bus to memory chip 770b (and thus an output bus for memory chip 770a) while bus 750f may serve as an input bus to memory chip 770a (and thus an output bus for memory chip 770b) or vice versa. Alternatively, buses 750e and 750f may both server as two-way buses between memory chips 770a and 770b.

Buses 750e and 750f may include direct wires or may be interleaved on a high-speed connection in order to reduce the pins used for the inter-chip interface between memory chip 770a and integrated circuit 770b. Moreover, any of the connection arrangements described above used in the memory chip itself may be used to connect the memory chip to one or more additional integrated circuits. For example, memory chip 770a and 770b may be connected using a full-tile or partial-tile connection rather than only two buses as shown in FIG. 7C.

Accordingly, although depicted using buses 750e and 750f, architecture 760 may include fewer buses or additional buses. For example, a single bus between processor subunits 730b and 730c or between processor subunits 730f and 730c may be used. Alternatively, additional buses, e.g., between processor subunits 730b and 730d, between processor subunits 730f and 730d, or the like, may be used.

Furthermore, although depicted as using a single memory chip and an additional integrated circuit, a plurality of memory chips may be connected using buses as explained above. For example, as depicted in the example of FIG. 7C, memory chips 770a, 770b, 770c, and 770d are connected in an array. Each memory chip includes processor subunits and dedicated memory banks similar to the memory chips described above. Accordingly, a description of these components is not repeated here.

In the example of FIG. 7C, memory chips 770a, 770b, 770c, and 770d are connected in a loop. Accordingly, bus 750a connects memory chips 770a and 770d, bus 750c connects memory chips 770a and 770b, bus 750e connects memory chips 770b and 770c, and bus 750g connects memory chips 770c and 770d. Although memory chips 770a, 770b, 770c, and 770d may be connected with full-tile connections, partial-tile connections, or other connection arrangements, the example of FIG. 7C allows for fewer pin connections between memory chips 770a, 770b, 770c, and 770d.

Relatively Large Memories

Embodiments of the present disclosure may use dedicated memories of relatively large size as compared with shared memories of conventional processors. The use of dedicated memories rather than shared memories allows for gains in efficiency to continue without tapering off with memory increases. This allows for memory-intensive tasks such as neural network processing and database queries to be performed more efficiently than in conventional processors, where the efficiency gains of increasing shared memory taper off due to the von Neumann bottleneck.

For example, in distributed processors of the present disclosure, a memory array disposed on the substrate of the distributed processor may include a plurality of discrete memory banks. Each of the discrete memory banks may have a capacity greater than one megabyte, as well as a processing array disposed on the substrate, including a plurality of processor subunits. As explained above, each one of the processor subunits may be associated with a corresponding, dedicated one of the plurality of discrete memory banks. In some embodiments, the plurality of processor subunits may be spatially distributed among the plurality of discrete memory banks within the memory array. By using dedicated memories of at least one megabyte, rather than shared caches of a few megabytes for a large CPU or GPU, the distributed processors of the present disclosure gain efficiencies that are not possible in conventional systems due to the von Neumann bottleneck in CPUs and GPUs.

Different memories may be used as the dedicated memories. For example, each dedicated memory bank may comprise at least one DRAM bank. Alternatively, each dedicated memory bank may comprise at least one static random access memory bank. In other embodiments, different types of memories may be combined on a single hardware chip.

As explained above, each dedicated memory may be at least one megabyte. Accordingly, each dedicated memory bank may be the same size or at least two of the plurality of memory banks may have different sizes.

Moreover, as described above, the distributed processor may include a first plurality of buses, each connecting one of the plurality of processor subunits to a corresponding dedicated memory bank and a second plurality of buses, each connecting one of the plurality of processor subunits to another one of the plurality of processor subunits.

Synchronization Using Software

As explained above, hardware chips of the present disclosure may manage data transfers using software rather than hardware. In particular, because the timings of transfers on the buses, reads and writes to the memories, and calculations of the processor subunits are set by the sub-series of instructions executed by the processor subunits, hardware chips of the present disclosure may execute code to prevent collisions on the buses. Accordingly, hardware chips of the present disclosure may avoid hardware mechanisms conventionally used to manage data transfers (such as network controllers within in a chip, packet parsers and packets transferors between processor subunits, bus arbitrators, a plurality of buses to avoid arbitration, or the like).

If hardware chips of the present disclosure transferred data conventionally, connecting N processor subunits with buses would require bus arbitration or wide MUXs controlled by an arbiter. Instead, as described above, embodiments of the present disclosure may use a bus that is only a wire, an optical cable, or the like between processor subunits, where the processor subunits individually execute code to avoid collision on the buses. Accordingly, embodiments of the present disclosure may preserve space on the substrate as well as materials cost and efficiency losses (e.g., due to power and time consumption by arbitration). The efficiency and space gains are even greater when compared to other architectures using first-in-first-out (FIFO) controllers and/or mailboxes.

Furthermore, as explained above, each processor subunit may include one or more accelerators in addition to one or more processing elements. In some embodiments, the accelerator(s) may read and write from the buses rather than the processing element(s). In such embodiments, additional efficiency may be obtained by allowing the accelerator(s) to transmit data during the same cycle in which the processing element(s) perform one or more calculations. Such embodiments, however, require additional materials for the accelerator(s). For example, additional transistors may be required for fabrication of the accelerator(s).

The code also may account for the internal behavior, including timing and latencies, of the processor subunits (e.g., including the processing elements and/or accelerators forming part of the processor subunit). For example, a compiler (as described below) may perform pre-processing that accounts for the timing and latencies when generating the sub-series of instructions that control the data transfers.

In one example, a plurality of processor subunits may be assigned a task of calculating a neural network layer containing a plurality of neurons fully-connected to a previous layer of a larger plurality of neurons. Assuming data of the previous layer is evenly spread between the plurality of processor subunits, one way to perform the calculation may be to configure each processor subunit to transmit the data of the previous layer to the main bus in turn and then each processor subunit will multiply this data by the weight of the corresponding neuron that the subunit implements. Because each processor subunit calculates more than one neuron, each processor subunit will transmit the data of the previous layer a number of times equal to the number of neurons. Thus, the code of each processor subunit is not the same as the code for other processor subunits because the subunits will transmit at different times.

In some embodiments, a distributed processor may comprise a substrate (e.g., a semiconductor substrate, such as silicon and/or a circuit board, such as a flexible circuit board) with a memory array disposed on the substrate, the memory array including a plurality of discrete memory banks, and a processing array disposed on the substrate, the processing array including a plurality of processor subunits, as depicted, e.g., in FIGS. 7A and 7B. As explained above, each one of the processor subunits may be associated with a corresponding, dedicated one of the plurality of discrete memory banks. Moreover, as depicted, e.g., in FIGS. 7A and 7B, the distributed processor may further comprise a plurality of buses, each one of the plurality of buses connecting one of the plurality of processor subunits to at least another one of the plurality of processor subunits.

As explained above, the plurality of buses may be controlled in software. Accordingly, the plurality of buses may be free of timing hardware logic components such that data transfers between processor subunits and across corresponding ones of the plurality of buses are uncontrolled by timing hardware logic components. In one example, the plurality of buses may be free of bus arbiters such that data transfers between processor subunits and across corresponding ones of the plurality of buses are uncontrolled by bus arbiters.

In some embodiments, as depicted, e.g., in FIGS. 7A and 7B, the distributed processor may further comprise a second plurality of buses connecting one of the plurality of processor subunits to a corresponding, dedicated memory bank. Similar to the plurality of buses described above, the second plurality of buses may be free of timing hardware logic components such that data transfers between processor subunits and corresponding, dedicated memory banks are uncontrolled by timing hardware logic components. In one example, the second plurality of buses may be free of bus arbiters such that data transfers between processor subunits and corresponding, dedicated memory banks are uncontrolled by bus arbiters.

As used herein, the phrase "free of" does not necessarily imply the absolute absence of components, such as timing hardware logic components (e.g., bus arbiters, arbitration trees, FIFO controllers, mailboxes, or the like). Such components may still be included in a hardware chip described as "free of" those components. Instead, the phrase "free of" refers to the function of the hardware chip; that is, a hardware chip "free of" timing hardware logic components controls the timing of its data transfers without use of the timing hardware logic components, if any, included therein. For example, a hardware chip that executes code including sub-series of instructions that control data transfers between processor subunits of the hardware chip, even if the hardware chip includes timing hardware logic components as a secondary precaution to protect against collisions due to errors in the executed code.

As explained above, the plurality of buses may comprise at least one of wires or optical fibers between corresponding ones of the plurality of processor subunits. Accordingly, in one example, a distributed processor free of timing hardware logic components may include only wires or optical fibers without bus arbiters, arbitration trees, FIFO controllers, mailboxes, or the like.

In some embodiments, the plurality of processor subunits is configured to transfer data across at least one of the plurality of buses in accordance with code executed by the plurality of processor subunits. Accordingly, as explained below, a compiler may organize sub-series of instructions, each sub-series comprising code executed by a single processor subunit. The sub-series instructions may instruct the processor subunit when to transfer data onto one of the buses and when to retrieve data from the buses. When the sub-series are executed in tandem across the distributed processor, the timing of transfers between the processor subunits may be governed by the instructions to transfer and retrieve included in the sub-series. Thus, the code dictates timing of data transfers across at least one of the plurality of buses. The compiler may generate code to be executed by a single processor subunit. Additionally, the compiler may generate code to be executed by groups of processor subunits. In some cases, the compiler may treat all the processor subunits together as if they were one super-processor (e.g., a distributed processor), and the compiler may generate code for execution by that defined super-processor/distributed processor.

As explained above and depicted in FIGS. 7A and 7B, the plurality of processor subunits may be spatially distributed among the plurality of discrete memory banks within the memory array. Alternatively, the plurality of processor subunits may be clustered in one or more regions of the substrate, and the plurality of memory banks may be clustered in one or more other regions of the substrate. In some embodiments, a combination of spatial distribution and clustering may be used, as explained above.

In some embodiments, a distributed processor may comprise a substrate (e.g., a semiconductor substrate, including silicon and/or a circuit board, such as a flexible circuit board) with a memory array disposed on the substrate, the memory array including a plurality of discrete memory banks. A processing array may also be disposed on the substrate, the processing array including a plurality of processor subunits, as depicted, e.g., in FIGS. 7A and 7B. As explained above, each one of the processor subunits may be associated with a corresponding, dedicated one of the plurality of discrete memory banks. Moreover, as depicted, e.g., in FIGS. 7A and 7B, the distributed processor may further comprise a plurality of buses, each one of the plurality of buses connecting one of the plurality of processor subunits to a corresponding, dedicated one of the plurality of discrete memory banks.

As explained above, the plurality of buses may be controlled in software. Accordingly, the plurality of buses may be free of timing hardware logic components such that data transfers between a processor subunit and a corresponding, dedicated one of the plurality of discrete memory banks and across a corresponding one of the plurality of buses are not controlled by timing hardware logic components. In one example, the plurality of buses may be free of bus arbiters such that data transfers between processor subunits and across corresponding ones of the plurality of buses are uncontrolled by bus arbiters.

In some embodiments, as depicted, e.g., in FIGS. 7A and 7B, the distributed processor may further comprise a second plurality of buses connecting one of the plurality of processor subunits to at least another one of the plurality of processor subunits. Similar to the plurality of buses described above, the second plurality of buses may be free of timing hardware logic components such that data transfers between processor subunits and corresponding, dedicated memory banks are uncontrolled by timing hardware logic components. In one example, the second plurality of buses may be free of bus arbiters such that data transfers between processor subunits and corresponding, dedicated memory banks are uncontrolled by bus arbiters.

In some embodiments, the distributed processor may use a combination of software timing with hardware timing components. For example, a distributed processor may comprise a substrate (e.g., a semiconductor substrate, including silicon and/or a circuit board, such as a flexible circuit board) with a memory array disposed on the substrate, the memory array including a plurality of discrete memory banks. A processing array may also be disposed on the substrate, the processing array including a plurality of processor subunits, as depicted, e.g., in FIGS. 7A and 7B. As explained above, each one of the processor subunits may be associated with a corresponding, dedicated one of the plurality of discrete memory banks. Moreover, as depicted, e.g., in FIGS. 7A and 7B, the distributed processor may further comprise a plurality of buses, each one of the plurality of buses connecting one of the plurality of processor subunits to at least another one of the plurality of processor subunits. Moreover, as explained above, the plurality of processor subunits may be configured to execute software that controls timing of data transfers across the plurality of buses to avoid colliding data transfers on at least one of the plurality of buses. In such an example, the software may control the timing of the data transfers, but the transfers themselves may be controlled, at least in part, by one or more hardware components.

In such embodiments, the distributed processor may further comprise a second plurality of buses connecting one of the plurality of processor subunits to a corresponding, dedicated memory bank. Similar to the plurality of buses described above, the plurality of processor subunits may be configured to execute software that controls timing of data transfers across the second plurality of buses to avoid colliding data transfers on at least one of the second plurality of buses. In such an example, as explained above, the software may control the timing of the data transfers, but the transfers themselves may be controlled, at least in part, by one or more hardware components.

Division of Code

As explained above, hardware chips of the present disclosure may execute code in parallel across processor subunits included on a substrate forming the hardware chip. Additionally, hardware chips of the present disclosure may perform multitasking. For example, hardware chips of the present disclosure may perform area multitasking, in which one group of processor subunits of the hardware chip execute one task (e.g., audio processing) while another group of processor subunits of the hardware chip execute another task (e.g., image processing). In another example, hardware chips of the present disclosure may perform timing multitasking, in which one or more processor subunits of the hardware chip execute one task during a first period of time and another task during a second period of time. A combination of area and timing multitasking may also be used such that one task may be assigned to a first group of processor subunits during a first period of time while another task may be assigned to a second group of processor subunits during the first period of time, after which a third task may be assigned to processor subunits included in the first group and the second group during a second period of time.

In order to organize machine code for execution on memory chips of the present disclosure, machine code may be divided between processor subunits of the memory chip. For example, a processor on a memory chip may comprise a substrate and a plurality of processor subunits disposed on the substrate. The memory chip may further comprise a corresponding plurality of memory banks disposed on the substrate, each one of the plurality processor subunits being connected to at least one dedicated memory bank not shared by any other processor subunit of the plurality of processor subunits.

Each processor subunit on the memory chip may be configured to execute a series of instructions independent from other processor subunits. Each series of instructions may be executed by configuring one or more general processing elements of the processor subunit in accordance with code defining the series of instructions and/or by activating one or more special processing elements (e.g., one or more accelerators) of the processor subunit in accordance with a sequence provided in the code defining the series of instructions.

Accordingly, each series of instructions may define a series of tasks to be performed by a single processor subunit. A single task may comprise an instruction within an instruction set defined by the architecture of one or more processing elements in the processor subunit. For example, the processor subunit may include particular registers, and a single task may push data onto a register, pull data from a register, perform an arithmetic function on data within a register, perform a logic operation on data within a register, or the like. Moreover, the processor subunit may be configured for any number of operands, such as a 0-operand processor subunit (also called a "stack machine"), a 1-operand processor subunit (also called an accumulator machine), a 2-operand processor subunit (such as a RISC), a 3-operand processor subunit (such as a complex instruction set computer (CISC)), or the like. In another example, the processor subunit may include one or more accelerators, and a single task may activate an accelerator to perform a specific function, such as a MAC function, a MAX function, a MAX-0 function, or the like.

The series of instructions may further include tasks for reading and writing from the dedicated memory banks of the memory chip. For example, a task may include writing a piece of data to a memory bank dedicated to the processor subunit executing the task, reading a piece of data from a memory bank dedicated to the processor subunit executing the task, or the like. In some embodiments, the reading and writing may be performed by the processor subunit in tandem with a controller of the memory bank. For example, the processor subunit may execute a read or write task by sending a control signal to the controller to perform the read or write. In some embodiments, the control signal may include a particular address to use for reads and writes. Alternatively, the processor subunit may defer to the memory controller to select an available address for the reads and writes.

Additionally or alternatively, the reading and writing may be performed by one or more accelerators in tandem with a controller of the memory bank. For example, the accelerators may generate the control signals for the memory controller, similar to how the processor subunit generates control signals, as described above.

In any of the embodiments described above, an address generator may also be used to direct the reads and writes to specific addresses of a memory bank. For example, the address generator may comprise a processing element configured to generate memory addresses for reads and writes. The address generator may be configured to generate addresses in order to increase efficiency, e.g., by writing results of a later calculation to the same address as the results of a former calculation that are no longer needed. Accordingly, the address generator may generate the controls signals for the memory controller, either in response to a command from the processor subunit (e.g., from a processing element included therein or from one or more accelerator (s) therein) or in tandem with the processor subunit. Additionally or alternatively, the address generator may generate the addresses based on some configuration or registers for example generating a nested loop structure to iterate on certain addresses in the memory at a certain pattern.

In some embodiments, each series of instructions may comprise a set of machine code defining a corresponding series of tasks. Accordingly, the series of tasks described above may be encapsulated within machine code comprising the series of instructions. In some embodiments, as explained below with respect to FIG. 8, the series of tasks may be defined by a compiler configured to distribute a higher-level series of tasks amongst the plurality of logic circuits as a plurality of series of tasks. For example, the compiler may generate the plurality of series of tasks based on the higher-level series of tasks such that the processor subunits, executing each corresponding series of tasks in tandem, perform the same function as outlined by the higher-level series of tasks.

As explained further below, the higher-level series of tasks may comprise a set of instructions in a human-readable programming language. Correspondingly, the series of tasks for each processor subunit may comprise lower-level series of tasks, each of which comprises a set of instructions in a machine code.

As explained above with respect to FIGS. 7A and 7B, the memory chip may further comprise a plurality of buses, each bus connecting one of the plurality of processor subunits to at least one other of the plurality of processor subunits. Moreover, as explained above, data transfers on the plurality of buses may be controlled using software. Accordingly, data transfers across at least one of the plurality of buses may be predefined by the series of instructions included in a processor subunit connected to the at least one of the plurality of buses. Therefore, one of the tasks included in the series of instructions may include outputting data to one of the buses or pulling data from one of the buses. Such tasks may be executed by a processing element of the processor subunit or by one or more accelerators included in the processor subunit. In the latter embodiment, the processor subunit may perform a calculation or send a control signal to a corresponding memory bank in the same cycle during which accelerator(s) pull data from or place data on one of the buses.

In one example, the series of instructions included in the processor subunit connected to the at least one of the plurality of buses may include a sending task that comprises a command for the processor subunit connected to the at least one of the plurality of buses to write data to the at least one of the plurality of buses. Additionally or alternatively, the series of instructions included in the processor subunit connected to the at least one of the plurality of buses may include a receiving task that comprises a command for the processor subunit connected to the at least one of the plurality of buses to read data from the at least one of the plurality of buses.

Additionally or alternatively to distribution of code amongst processor subunits, data may be divided between memory banks of the memory chip. For example, as explained above, a distributed processor on a memory chip may comprise a plurality of processor subunits disposed on the memory chip and a plurality of memory banks disposed on the memory chip. Each one of the plurality of memory banks may be configured to store data independent from data stored in other ones of the plurality of memory banks, and each one of the plurality of processor subunits may be connected to at least one dedicated memory bank from among the plurality of memory banks. For example, each processor subunit may have access to one or more memory controllers of one or more corresponding memory banks dedicated to the processor subunit, and no other processor subunit may have access to these corresponding one or more memory controllers. Accordingly, the data stored in each memory bank may be unique to the dedicated processor subunit. Moreover, the data stored in each memory bank may be independent of the memory stored in other memory banks because no memory controllers may be shared between memory banks.

In some embodiments, as described below with respect to FIG. 8, the data stored in each of the plurality of memory banks may be defined by a compiler configured to distribute data amongst the plurality of memory banks. Moreover, the compiler may be configured to distribute data defined in a higher-level series of tasks amongst the plurality of memory banks using a plurality of lower-level tasks distributed amongst corresponding processor subunits.

As explained further below, the higher-level series of tasks may comprise a set of instructions in a human-readable programming language. Correspondingly, the series of tasks for each processor subunit may comprise lower-level series of tasks, each of which comprises a set of instructions in a machine code.

As explained above with respect to FIGS. 7A and 7B, the memory chip may further comprise a plurality of buses, each bus connecting one of the plurality of processor subunits to one or more corresponding, dedicated memory banks from among the plurality of memory banks. Moreover, as explained above, data transfers on the plurality of buses may be controlled using software. Accordingly, data transfers across a particular one of the plurality of buses may be controlled by a corresponding processor subunit connected to the particular one of the plurality of buses. Therefore, one of the tasks included in the series of instructions may include outputting data to one of the buses or pulling data from one of the buses. As explained above, such tasks may be executed by (i) a processing element of the processor subunit or (ii) one or more accelerators included in the processor subunit. In the latter embodiment, the processor subunit may perform a calculation or use buses connecting the processor subunit to other processor subunits in the same cycle during which accelerator(s) pull data from or place data on one of the buses connected to the one or more corresponding, dedicated memory banks.

Therefore, in one example, the series of instructions included in the processor subunit connected to the at least one of the plurality of buses may include a sending task. The sending task may comprise a command for the processor subunit connected to the at least one of the plurality of buses to write data to the at least one of the plurality of buses for storage in the one or more corresponding, dedicated memory banks. Additionally or alternatively, the series of instructions included in the processor subunit connected to the at least one of the plurality of buses may include a receiving task. The receiving task may comprise a command for the processor subunit connected to the at least one of the plurality of buses to read data from the at least one of the plurality of buses for storage in the one or more corresponding, dedicated memory banks. Accordingly, the sending and receiving tasks in such embodiments may comprise control signals that are sent, along the at least one of the plurality of buses, to one or more memory controllers of the one or more corresponding, dedicated memory banks. Moreover, the sending and receiving tasks may be executed by one portion of the processing subunit (e.g., by one or more accelerators thereof) concurrently with a calculation or other task executed by another portion of the processing subunit (e.g., by one or more different accelerators thereof). An example of such a concurrent execution may include a MAC-relay command, in which receiving, multiplying, and sending are executed in tandem.

In addition to distributing data amongst the memory banks, particular portions of data may be duplicated across different memory banks. For example, as explained above, a distributed processor on a memory chip may comprise a plurality of processor subunits disposed on the memory chip and a plurality of memory banks disposed on the memory chip. Each one of the plurality of processor subunits may be connected to at least one dedicated memory bank from among the plurality of memory banks, and each memory bank of the plurality of memory banks may be configured to store data independent from data stored in other ones of the plurality of memory banks. Moreover, at least some of the data stored in one particular memory bank from among the plurality of memory banks may comprise a duplicate of data stored in at least another one of the plurality of memory banks. For example, a number, string, or other type of data used in the series of instructions may be stored in a plurality of memory banks dedicated to different processor subunits rather than being transferred from one memory bank to other processor subunits in the memory chip.

In one example, parallel string matching may use data duplication described above. For example, a plurality of strings may be compared to the same string. A conventional processor would compare each string in the plurality to the same string in sequence. On a hardware chip of the present disclosure, the same string may be duplicated across the memory banks such that the processor subunits may compare a separate string in the plurality to the duplicated string in parallel.

In some embodiments, as described below with respect to FIG. 8, the at least some data duplicated across the one particular memory bank from among the plurality of memory banks and the at least another one of the plurality of memory banks is defined by a compiler configured to duplicate data across memory banks. Moreover, the compiler may be configured to duplicate the at least some data using a plurality of lower-level tasks distributed amongst corresponding processor subunits.

Duplication of data may be useful for certain tasks that re-use the same portions of data across different calculations. By duplicating these portions of data, the different calculations may be distributed amongst processor subunits of the memory chip for parallel execution while each processor subunit may store the portions of data in, and access the stored portions from, a dedicated memory bank (rather than pushing and pulling the portions of data across buses connecting the processor subunits). In one example, the at least some data duplicated across the one particular memory bank from among the plurality of memory banks and the at least another one of the plurality of memory banks may comprise weights of a neural network. In this example, each node in the neural network may be defined by at least one processor subunit from among the plurality of processor subunits. For example, each node may comprise machine code executed by the at least one processor subunit defining the node. In this example, duplication of the weights may allow each processor subunit to execute machine code to effect, at least in part, a corresponding node while only accessing one or more dedicated memory banks (rather than performing data transfers with other processor subunits). Because the timing of reads and writes to the dedicated memory bank(s) are independent of other processor subunits while the timing of data transfers between processor subunits requires timing synchronization (e.g., using software, as explained above), duplication of memory to avoid data transfers between processor subunits may produce further efficiencies in overall execution.

As explained above with respect to FIGS. 7A and 7B, the memory chip may further comprise a plurality of buses, each bus connecting one of the plurality of processor subunits to one or more corresponding, dedicated memory banks from among the plurality of memory banks. Moreover, as explained above, data transfers on the plurality of buses may be controlled using software. Accordingly, data transfers across a particular one of the plurality of buses may be controlled by a corresponding processor subunit connected to the particular one of the plurality of buses. Therefore, one of the tasks included in the series of instructions may include outputting data to one of the buses or pulling data from one of the buses. As explained above, such tasks may be executed by (i) a processing element of the processor subunit or (ii) one or more accelerators included in the processor subunit. As further explained above, such tasks may include a sending task and/or a receiving tasks that comprise control signals that are sent, along the at least one of the plurality of buses, to one or more memory controllers of the one or more corresponding, dedicated memory banks.

Figure 8:
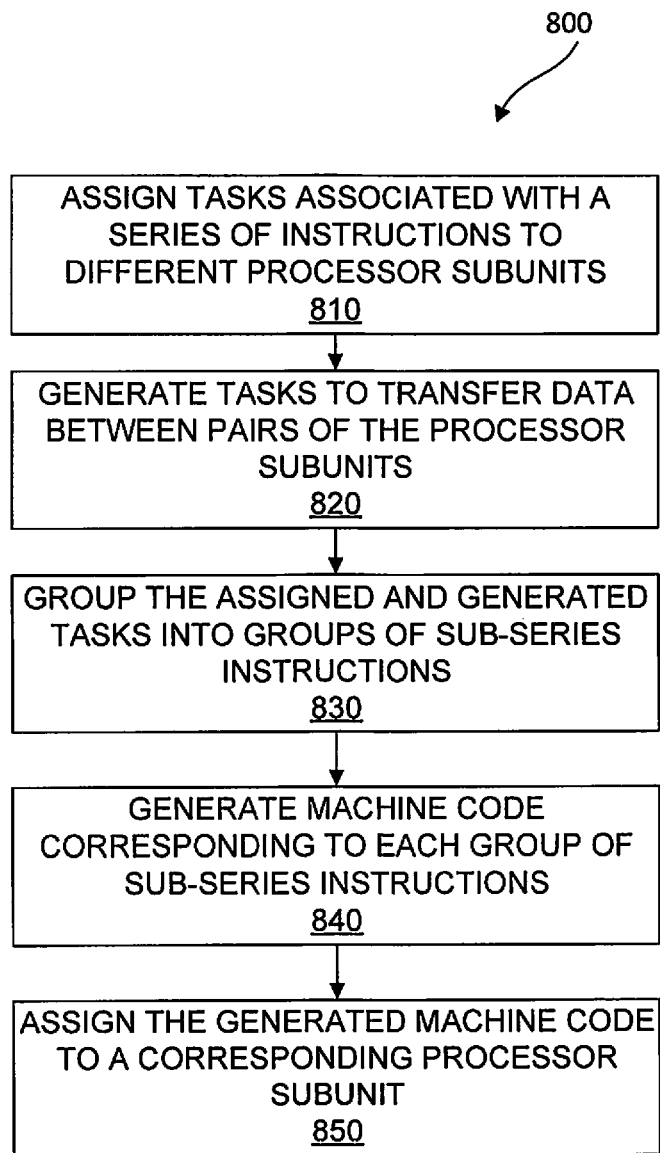
FIG. 8 is a flowchart depicting an exemplary method for compiling a series of instructions for execution on an exemplary hardware chip consistent with the disclosed embodiments.

FIG. 8 depicts a flowchart of a method 800 for compiling a series of instructions for execution on an exemplary memory chip of the present disclosure, e.g., as depicted in FIGS. 7A and 7B. Method 800 may be implemented by any conventional processor, whether generic or special-purpose.

Method 800 may be executed as a portion of a computer program forming a compiler. As used herein, a "compiler" refers to any computer program that converts a higher-level language (e.g., a procedural language, such as C, FORTRAN, BASIC, or the like; an object-oriented language, such as Java, C++, Pascal, Python, or the like; etc.) to a lower-level language (e.g., assembly code, object code, machine code, or the like). The compiler may allow a human to program a series of instructions in a human-readable language, which is then converted to a machine-executable language.

At step 810, the processor may assign tasks associated with the series of instructions to different ones of the processor subunits. For example, the series of instructions may be divided into subgroups, the subgroups to be executed in parallel across the processor subunits. In one example, a neural network may be divided into its nodes, and one or more nodes may be assigned to separate processor subunits. In this example, each subgroup may comprise a plurality of nodes connected across different layers. Thus, a processor subunit may implement a node from a first layer of the neural network, a node from a second layer connected to the node from the first layer implemented by the same processor subunit, and the like. By assigning nodes based on their connections, data transfers between the processor subunits may be lessened, which may result in greater efficiency, as explained above.

As explained above depicted in FIGS. 7A and 7B, the processor subunits may be spatially distributed among the plurality of memory banks disposed on the memory chip. Accordingly, the assignment of tasks may be, at least in part, a spatial divisional as well as a logical division.

At step 820, the processor may generate tasks to transfer data between pairs of the processor subunits of the memory chip, each pair of processor subunits being connected by a bus. For example, as explained above, the data transfers may be controlled using software. Accordingly, processor subunits may be configured to push and pull data on buses at synchronized times. The generated tasks may thus include tasks for performing this synchronized pushing and pulling of data.

As explained above, step 820 may include pre-processing to account for the internal behavior, including timing and latencies, of the processor subunits. For example, the processor may use known times and latencies of the processor subunits (e.g., the time to push data to a bus, the time to pull data from a bus, the latency between a calculation and a push or pull, or the like) to ensure that the generated tasks synchronize. Therefore, the data transfers comprising at least one push by one or more processor subunits and at least one pull by one or more processor subunits may occur simultaneously rather than incurring a delay due to timing differences between the processor subunits, latencies of the processor subunits, or the like.

At step 830, the processor may group the assigned and generated tasks into the plurality of groups of sub-series instructions. For example, the sub-series instructions may each comprise a series of tasks for execution by a single processor subunit. Therefore, each of the plurality of groups of sub-series instructions may correspond to a different one of the plurality of processor sub-units. Accordingly, steps 810, 820, and 830 may result in dividing the series of instructions into a plurality of groups of sub-series instructions. As explained above, step 820 may ensure that any data transfers between the different groups are synchronized.

At step 840, the processor may generate machine code corresponding to each of the plurality of groups of subs-series instructions. For example, the higher-level code representing sub-series instructions may be converted to lower-level code, such as machine code, executable by corresponding processor subunits.

At step 850, the processor may assign the generated machine code corresponding to each of the plurality of groups of subs-series instructions to a corresponding one of the plurality of processor subunits in accordance with the division. For example, the processor may label each sub-series instructions with an identifier of the corresponding processor subunit. Thus, when the sub-series instructions are uploaded to a memory chip for execution (e.g., by host 350 of FIG. 3A), each sub-series may configure a correct processor subunit.

In some embodiments, assigning tasks associated with the series of instructions to the different ones of the processor subunits may depend, at least in part, on a spatial proximity between two or more of the processor subunits on the memory chip. For example, as explained above, efficiency may be increased by lessening the number of data transfers between processor subunits. Accordingly, the processor may minimize data transfers that move data across more than two of processor subunits. Therefore, the processor may use a known layout of the memory chip in combination with one or more optimization algorithms (such as a greedy algorithm) in order to assign sub-series to processor subunits in a way that maximizes (at least locally) adjacent transfers and minimizes (at least locally) transfers to non-neighboring processor subunits.

Method 800 may include further optimizations for the memory chips of the present disclosure. For example, the processor may group data associated with the series of instructions based on the division and assign the data to the memory banks in accordance with the grouping. Accordingly, the memory banks may hold data used for the sub-series instructions assigned to each processor subunit to which each memory bank is dedicated.

In some embodiments, grouping the data may include determining at least a portion of the data to duplicate in two or more of the memory banks. For example, as explained above, some data may be used across more than one sub-series instructions. Such data may be duplicated across the memory banks dedicated to the plurality of processor subunits to which the different sub-series instructions are assigned. This optimization may further reduce data transfers across processor subunits.

The output of method 800 may be input to a memory chip of the present disclosure for execution. For example, a memory chip may comprise a plurality of processor subunits and a corresponding plurality of memory banks, each processor subunit being connected to at least one memory bank dedicated to the processor subunit, and the processor subunits of the memory chip may be configured to execute the machine code generated by method 800. As explained above with respect to FIG. 3A, host 350 may input the machine code generated by method 800 to the processor subunits for execution.

Sub-Banks and Sub-Controllers

In conventional memory banks, controllers are provided at the bank level. Each bank includes a plurality of mats, which are typically arranged in a rectangular manner but may be arranged in any geometrical shape. Each mat includes a plurality of memory cells, which are also typically arranged in a rectangular manner but may be arranged in any geometrical shape. Each cell may store a single bit of data (e.g., depending on whether the cell is retained at a high voltage or a low voltage).

Figure 9:
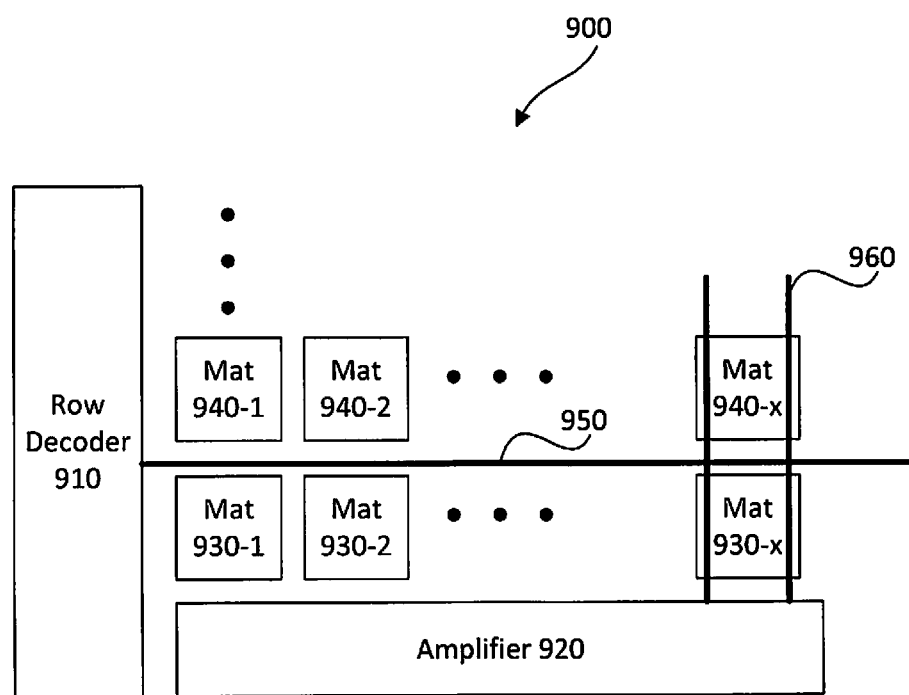
FIG. 9 is a diagrammatic representation of a memory bank.
Figure 10:
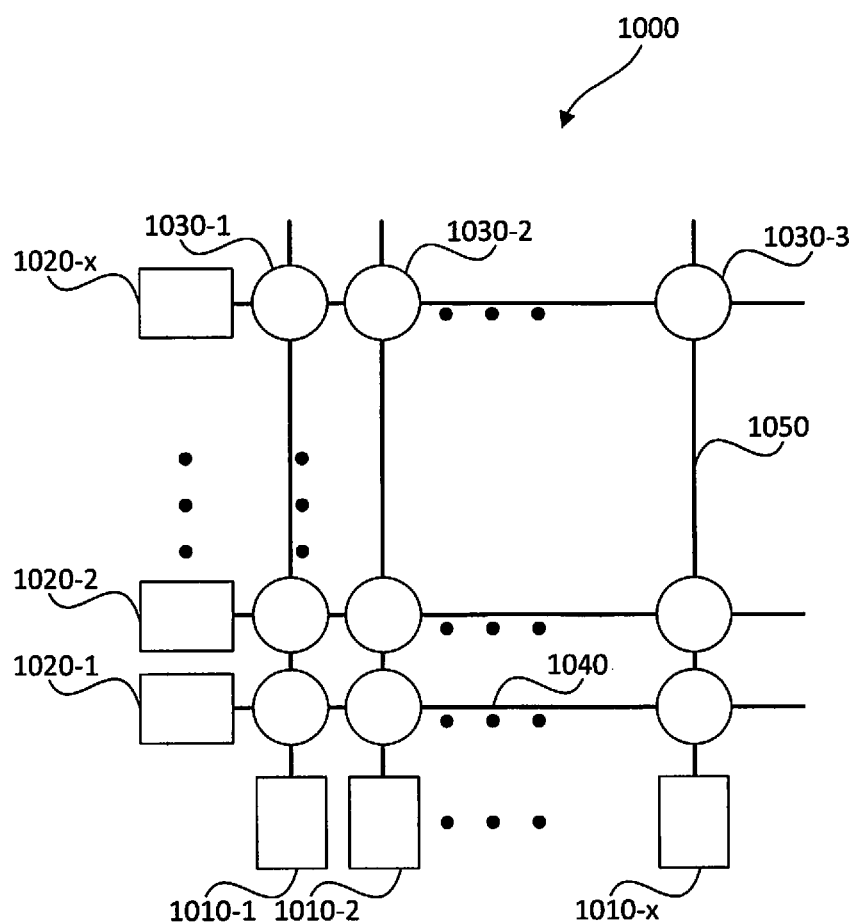
FIG. 10 is a diagrammatic representation of a memory bank.

An example of this conventional architecture is depicted in FIGS. 9 and 10. As shown in FIG. 9, at the bank level, a plurality of mats (e.g., mats 930-1, 930-2, 940-1, and 940-2) may form bank 900. In a conventional rectangular organization, bank 900 may be controlled across global wordlines (e.g., wordline 950) and global bitlines (e.g., bitline 960). Accordingly, row decoder 910 may select the correct wordline based on an incoming control signal (e.g., a request for a read from an address, a request for a write to an address, or the like) and global sense amplifier 920 (and/or a global column decoder, not shown in FIG. 9) may select the correct bitline based on the control signal. Amplifier 920 may also amplify any voltage levels from a selected bank during a read operation. Although depicted as using a row decoder for initial selecting and performing amplification along columns, a bank may additionally or alternatively use a column decoder for initial selecting and perform amplification along rows.

FIG. 10 depicts an example of a mat 1000. For example, mat 1000 may form a portion of a memory bank, such as bank 900 of FIG. 9. As depicted in FIG. 10, a plurality of cells (e.g., cells 1030-1, 1030-2, and 1030-3) may form mat 1000. Each cell may comprise a capacitor, a transistor, or other circuitry that stores at least one bit of data. For example, a cell may comprise a capacitor that is charged to represent a '1' and discharged to represent a '0' or may comprise a flip-flop having a first state representing a '1' and a second state representing a '0.' A conventional mat may comprise, for example, 512 bits by 512 bits. In embodiments where mat 1000 forms a portion of MRAM, ReRAM, or the like, a cell may comprise a transistor, resistor, capacitor or other mechanism for isolating an ion or portion of a material that stores at least one bit of data. For example, a cell may comprise an electrolyte ion, a portion of chalcogenide glass, or the like, having a first state representing a '1' and a second state representing a '0.'

As further depicted in FIG. 10, in a conventional rectangular organization, mat 1000 may be controlled across local wordlines (e.g., wordline 1040) and local bitlines (e.g., bitline 1050). Accordingly, wordline drivers (e.g., wordline driver 1020-1, 1020-2, . . . , 1020-*x*) may control the selected wordline to perform a read, write, or refresh based on a control signal from a controller associated with the memory bank of which mat 1000 forms a part (e.g., a request for a read from an address, a request for a write to an address, a refresh signal). Moreover, local sense amplifiers (e.g., local amplifiers 1010-1, 1010-2, . . . , 1010-*x*) and/or local column decoders (not shown in FIG. 10) may control the selected bitline to perform a read, write, or refresh. The local sense amplifiers may also amplify any voltage levels from a selected cell during a read operation. Although depicted as using a wordline driver for initial selecting and performing amplification along columns, a mat may instead use a bitline driver for initial selecting and perform amplification along rows.

As explained above, a large number of mats are duplicated to form a memory bank. Memory banks may be grouped to form a memory chip. For example, a memory chip may comprise eight to thirty-two memory banks. Accordingly, pairing processor subunits with memory banks on a conventional memory chip may result in only eight to thirty-two processor subunits. Accordingly, embodiments of the present disclosure may include memory chips with additional sub-bank hierarchy. These memory chips of the present disclosure may then include processor subunits with memory sub-banks used as the dedicated memory banks paired with the processor subunits allowing for a larger number of sub processors, which may then achieve higher parallelism and performance of in-memory computing.

In some embodiments of the present disclosure, the global row decoder and global sense amplifier of bank 900 may be replaced with sub-bank controllers. Accordingly, rather than sending control signals to a global row decoder and a global sense amplifier of the memory bank, a controller of the memory bank may direct the control signal to the appropriate sub-bank controller. The direction may be controlled dynamically or may be hard-wired (e.g., via one or more logic gates). In some embodiments, fuses may be used to indicate the controller of each sub bank or mat whether to block or pass the control signal to the appropriate sub-bank or mat. In such embodiments, faulty sub-banks may thus be deactivated using the fuses.

In one example of such embodiments, a memory chip may include a plurality of memory banks, each memory bank having a bank controller and a plurality of memory sub-banks, each memory sub-bank having a sub-bank row decoder and a sub-bank column decoder for allowing reads and writes to locations on the memory sub-bank. Each sub-bank may comprise a plurality of memory mats, each memory mat having a plurality of memory cells and may have internally local row decoders, column decoders, and/or local sense amplifiers. The sub-bank row decoders and the sub-bank column decoders may process read and write requests from the bank controller or from a sub-bank processor subunit used for in memory computations on the sub-bank memory, as described below. Additionally, each memory sub-bank may further have a controller configured to determine whether to process read requests and write requests from the bank controller and/or to forward them to the next level (e.g., of row and column decoders on a mat) or to block the requests, e.g., to allow an internal processing element or processor subunit to access the memory. In some embodiments, the bank controller may be synchronized to a system clock. However, the sub-bank controllers may be not synchronized to the system clock.

As explained above, the use of sub-banks may allow for the inclusion of a larger number of processor subunits in the memory chip than if processor subunits were paired with memory banks of conventional chips. Accordingly, each sub-bank may further have a processor subunit using the sub-bank as a dedicated memory. As explained above, the processor subunit may comprise a RISC, a CISC, or other general-purpose processing subunit and/or may comprise one or more accelerators. Additionally, the processor subunit may include an address generator, as explained above. In any of the embodiments described above, each processor subunit may be configured to access a sub-bank dedicated to the processor subunit using the row decoder and the column decoder of the sub-bank without using the bank controller. The processor sub-unit associated with the sub-bank may also handle the memory mats (including the decoder and memory redundancy mechanisms, described below) and/or determine whether a read or write request from an upper level (e.g., the bank level or the memory level) is forwarded and handled accordingly.

In some embodiments, the sub-bank controller may further include a register that stores a state of the sub-bank. Accordingly, the sub-bank controller may return an error if the sub-bank controller receives a control signal from the memory controller while the register indicates that the sub-bank is in use. In embodiments where each sub-bank further includes a processor subunit, the register may indicate an error if the processor subunit in the sub-bank is accessing the memory in conflict with an external request from the memory controller.

Figure 11:
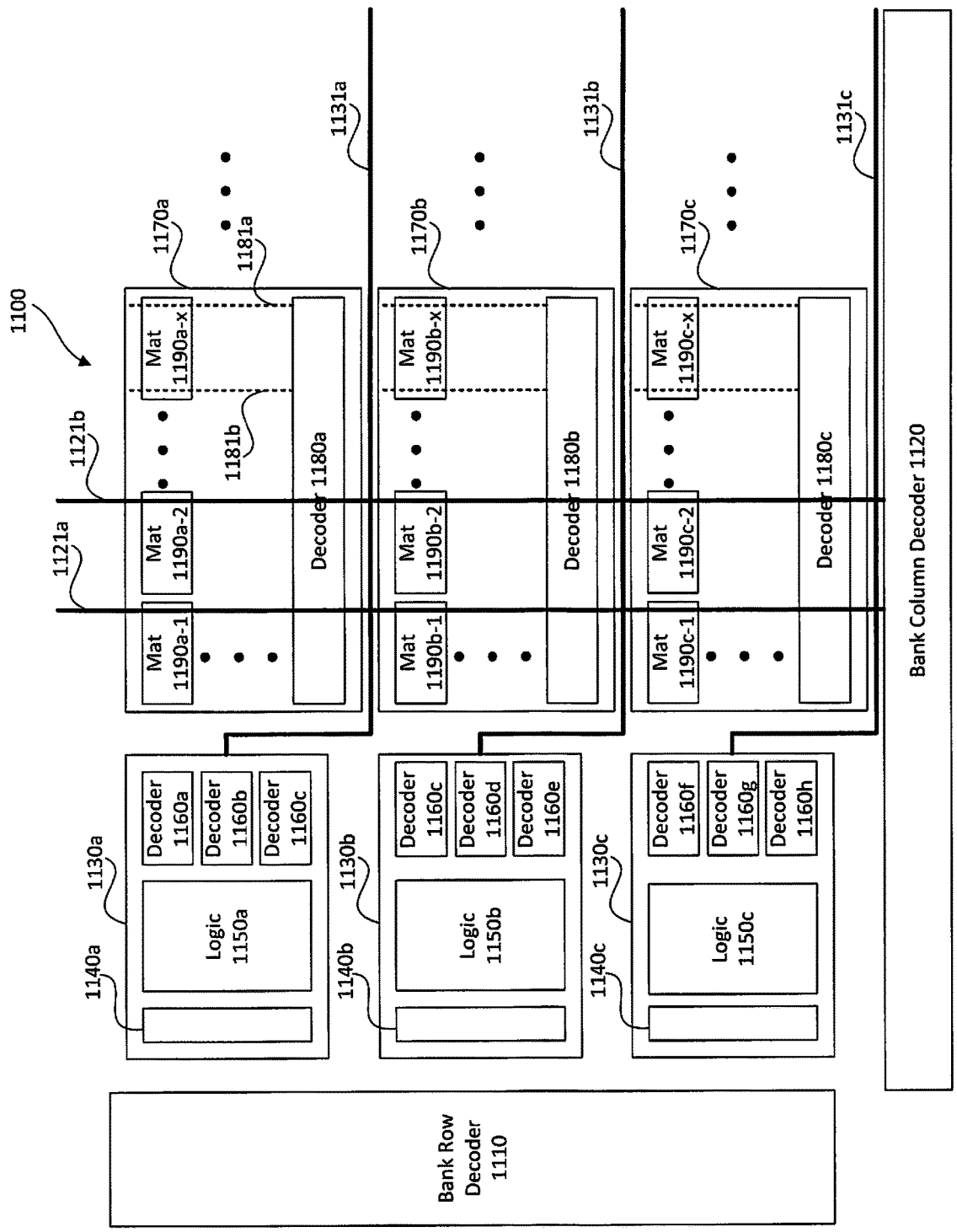
FIG. 11 is a diagrammatic representation of an embodiment of an exemplary memory bank with sub-bank controls consistent with the disclosed embodiments.

FIG. 11 shows an example of another embodiment of a memory bank using sub-bank controllers. In the example of FIG. 11, bank 1100 has a row decoder 1110, a column decoder 1120, and a plurality of memory sub-banks (e.g., sub-banks 1170a, 1170b, and 1170c) with sub-bank controllers (e.g., controllers 1130a, 1130b, and 1130c). The sub-bank controllers may include address resolvers (e.g., resolvers 1140a, 1140b, and 1140c), which may determine whether to pass a request to one or more sub-banks controlled by the sub-bank controller.

The sub-bank controllers may further include one or more logic circuits (e.g., logic 1150a, 1150b, and 1150c). For example, a logic circuit comprising one or more processing elements may allow for one or more operations, such as refreshing of cells in the sub-bank, clearing of cells in the sub-bank, or the like, to be performed without processing requests externally from bank 1100. Alternatively, the logic circuit may comprise a processor subunit, as explained above, such that the processor sub-unit has any sub-banks controlled by the sub-bank controller as corresponding, dedicated memory. In the example of FIG. 11, logic 1150a may have sub-bank 1170a as a corresponding, dedicated memory, logic 1150b may have sub-bank 1170b as a corresponding, dedicated memory, and logic 1150c may have sub-bank 1170c as a corresponding, dedicated memory. In any of the embodiments described above, the logic circuits may have buses to the sub-banks, e.g., buses 1131a, 1131b, or 1131c. As further depicted in FIG. 11, the sub-bank controllers may each include a plurality of decoders, such as a sub-bank row decoder and a sub-bank column decoder for allowing reads and writes, either by a processing element or processor subunit or by a higher-level memory controller issuing commands, to locations on the memory sub-bank(s). For example, sub-bank controller 1130a includes decoders 1160a, 1160b, and 1160c, sub-bank controller 1130b includes decoders 1160d, 1160e, and 1160f, and sub-bank controller 1130c includes decoders 1160g, 1160h, and 1160i. The sub-bank controllers may, based on a request from bank row decoder 1110, select a wordline using the decoders included in the sub-bank controllers. The described system may allow a processing element or processor subunit of the sub-bank to access the memory without interrupting other banks and even other sub-banks, thereby allowing each sub-bank processor subunit to perform memory computations in parallel with the other sub-bank processor subunits.

Furthermore, each sub-bank may comprise a plurality of memory mats, each memory mat having a plurality of memory cells. For example, sub-bank 1170a includes mats 1190a-1, 1190a-2, . . . , 1190a-x; sub-bank 1170b includes mats 1190b-1, 1190b-2, . . . , 1190b-x; and sub-bank 1170c includes mats 1190c-1, 1190c-2, . . . , 1190c-3. As further depicted in FIG. 11, each sub-bank may include at least one decoder. For example, sub-bank 1170a includes decoder 1180a, sub-bank 1170b includes decoder 1180b, and sub-bank 1170c includes decoder 1180c. Accordingly, bank column decoder 1120 may select a global bitline (e.g., bitline 1121a or 1121b) based on external requests while the sub-bank selected by bank row decoder 1110 may use its column decoder to select a local bitline (e.g., bitline 1181a or 1181*b*) based on local requests from the logic circuit to which the sub-bank is dedicated. Accordingly, each processor subunit may be configured to access a sub-bank dedicated to the processor subunit using the row decoder and the column decoder of the sub-bank without using the bank row decoder and the bank column decoder. Thus, each processor subunit may access a corresponding sub-bank without interrupting other sub-banks. Moreover, sub-bank decoders may reflect accessed data to the bank decoders when the request to the sub-bank is external to the processor subunit. Alternatively, in embodiments where each sub-bank has only one row of memory mats, the local bitlines may be the bitlines of the mat rather than bitlines of the sub-bank.

A combination of embodiments using sub-bank row decoders and sub-bank column decoders with the embodiment depicted in FIG. 11 may be used. For example, the bank row decoder may be eliminated but the bank column decoder retained and local bitlines used.

Figure 12:
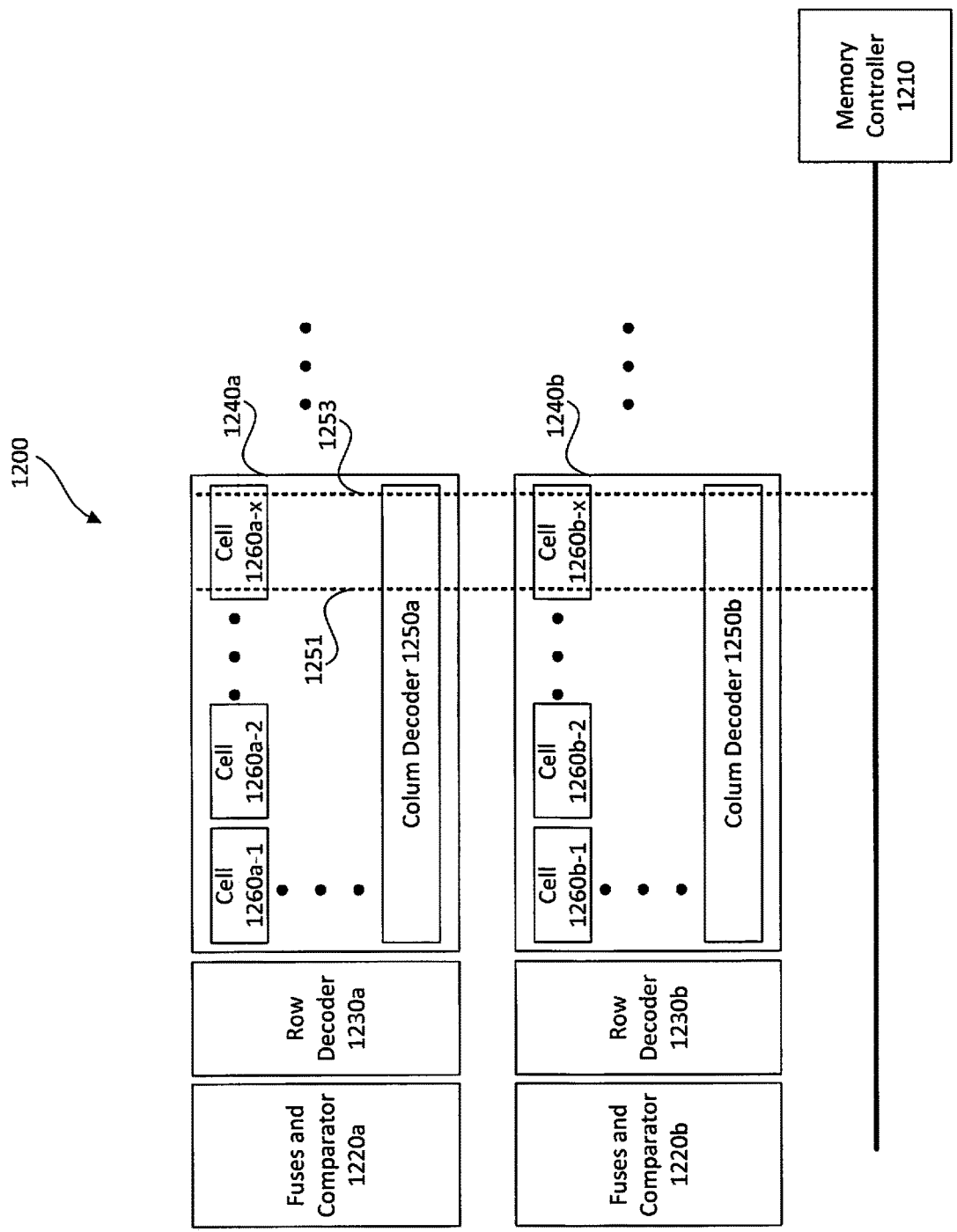
FIG. 12 is a diagrammatic representation of another embodiment of an exemplary memory bank with sub-bank controls consistent with the disclosed embodiments.

FIG. 12 shows an example of an embodiment of a memory sub-bank 1200 having a plurality of mats. For example, sub-bank 1200 may represent a portion of sub-bank 1100 of FIG. 11 or may represent an alternative implementation of a memory bank. In the example of FIG. 12, sub-bank 1200 includes a plurality of mats (e.g., mats 1240*a* and 1240*b*). Moreover, each mat may include a plurality of cells. For example, mat 1240*a* includes cells 1260*a*-1, 1260*a*-2, . . . , 1260*a*-*x*, and mat 1240*b* includes cells 1260*b*-1, 1260*b*-2, . . . , 1260*b*-*x*.

Each mat may be assigned a range of addresses that will be assigned to the memory cells of the mat. These addresses may be configured at production such that mats may be shuffled around and such that faulted mats may be deactivated and left unused (e.g., using one or more fuses, as explained further below).

Sub-bank 1200 receives read and write requests from memory controller 1210. Although not depicted in FIG. 12, requests from memory controller 1210 may be filtered through a controller of sub-bank 1200 and directed to an appropriate mat of sub-bank 1200 for address resolution. Alternatively, at least a portion (e.g., higher bits) of an address of a request from memory controller 1210 may be transmitted to all mats of sub-bank 1200 (e.g., mats 1240*a* and 1240*b*) such that each mat may process the full address and the request associated with the address only if the mat's assigned address range includes the address specified in the command. Similar to the sub-bank direction described above, the mat determination may be dynamically controlled or may be hardwired. In some embodiments, fuses may be used to determine the address range for each mat, also allowing for disabling of faulty mats by assigning an illegal address range. Mats may additionally or alternatively be disabled by other common methods or connection of fuses.

In any of the embodiments described above, each mat of the sub-bank may include a row decoder (e.g., row decoder 1230*a* or 1230*b*) for selection of a wordline in the mat. In some embodiments, each mat may further include fuses and comparators (e.g., 1220*a* and 1220*b*). As described above, the comparators may allow each mat to determine whether to process an incoming request, and the fuses may allow each mat to deactivate if faulty. Alternatively, row decoders for the bank and/or sub-bank may be used rather than a row decoder in each mat.

Furthermore, in any of the embodiments described above, a column decoder included in the appropriate mat (e.g., column decoder 1250*a* or 1250*b*) may select a local bitline (e.g., bitline 1251 or 1253). The local bitline may be connected to a global bitline of the memory bank. In embodiments where the sub-bank has local bitlines of its own, the local bitline of the cell may be further connected to the local bitline of the sub-bank. Accordingly, data in the selected cell may be read through the column decoder (and/or sense amplifier) of the cell, then through the column decoder (and/or sense amplifier) of the sub-bank (in embodiments including a sub-bank column decoder and/or sense amplifier), and then through the column decoder (and/or sense amplifier) of the bank.

Mat 1200 may be duplicated and arrayed to form a memory bank (or a memory sub-bank). For example, a memory chip of the present disclosure may comprise a plurality of memory banks, each memory bank having a plurality of memory sub-banks, and each memory sub-bank having a sub-bank controller for processing reads and writes to locations on the memory sub-bank. Furthermore, each memory sub-bank may comprise a plurality of memory mats, each memory mat having a plurality of memory cells and having a mat row decoder and a mat column decoder (e.g., as depicted in FIG. 12). The mat row decoders and the mat column decoders may process read and write requests from the sub-bank controller. For example, the mat decoders may receive all requests and determine (e.g., using a comparator) whether to process the request based on a known address range of each mat, or the mat decoders may only receive requests within the known address range based on selection of a mat by the sub-bank (or bank) controller.

Controller Data Transfers

Any of the memory chips of the present disclosure may also share data using memory controllers (or sub-bank controllers or mat controllers) in addition to sharing data using processing subunits. For example, a memory chip of the present disclosure may comprise a plurality of memory banks (e.g., an SRAM bank, a DRAM bank, or the like), each memory bank having a bank controller, a row decoder, and a column decoder for allowing reads and writes to locations on the memory bank, as well as a plurality of buses connecting each controller of the plurality of bank controllers to at least one other controller of the plurality of bank controllers. The plurality of buses may be similar to the buses connecting the processing subunits, as described above, but connecting the bank controllers directly rather than through the processing subunits. Furthermore, although described as connecting the bank controllers, buses may additionally or alternatively connect sub-bank controllers and/or mat controllers.

In some embodiments, the plurality of buses may be accessed without interruption of data transfers on main buses of the memory banks connected to one or more processor subunits. Accordingly, a memory bank (or sub-bank) may transmit data to or from a corresponding processor subunit in the same clock cycle as transmitting data to or from a different memory bank (or sub-bank). In embodiments where each controller is connected to a plurality of other controllers, the controllers may be configurable for selection of one other of the other controllers for sending or receiving of data. In some embodiments, each controller may be connected to at least one neighboring controller (e.g., pairs of spatially adjacent controllers may be connected to one another).

Redundant Logic in Memory Circuits

The disclosure is generally directed to a memory chip with primary logic portions for on-chip data processing. The memory chip may include redundant logic portions, which may replace defective primary logic portions to increase the fabrication yield of the chip. Thus, the chip may include on-chip components that allow a configuration of logic blocks in the memory chip based on individual testing of the logic portions. This feature of the chip may increase yields because a memory chip with larger areas dedicated to logic portions is more susceptible to fabrication failures. For example, DRAM memory chips with large redundant logic portions may be susceptible to fabrication issues that reduce yield. However, implementing redundant logic portions may result in increased yield and reliability because it provides a manufacturer or user of DRAM memory chips to turn on or off full logic portions while maintaining the ability of high parallelism. It should be noted that here and throughout the disclosure, example of certain memory types (such as DRAM) may be identified in order to facilitate the explanation of disclosed embodiments. It is to be understood, however, that in such instances the identified memory types are not intended to be limiting. Rather, memory types such as DRAM, Flash, SRAM, ReRAM, PRAM, MRAM, ROM, or any other memory may be used together with the disclosed embodiments even if fewer examples are specifically identified in a certain section of the disclosure.

Figure 13:
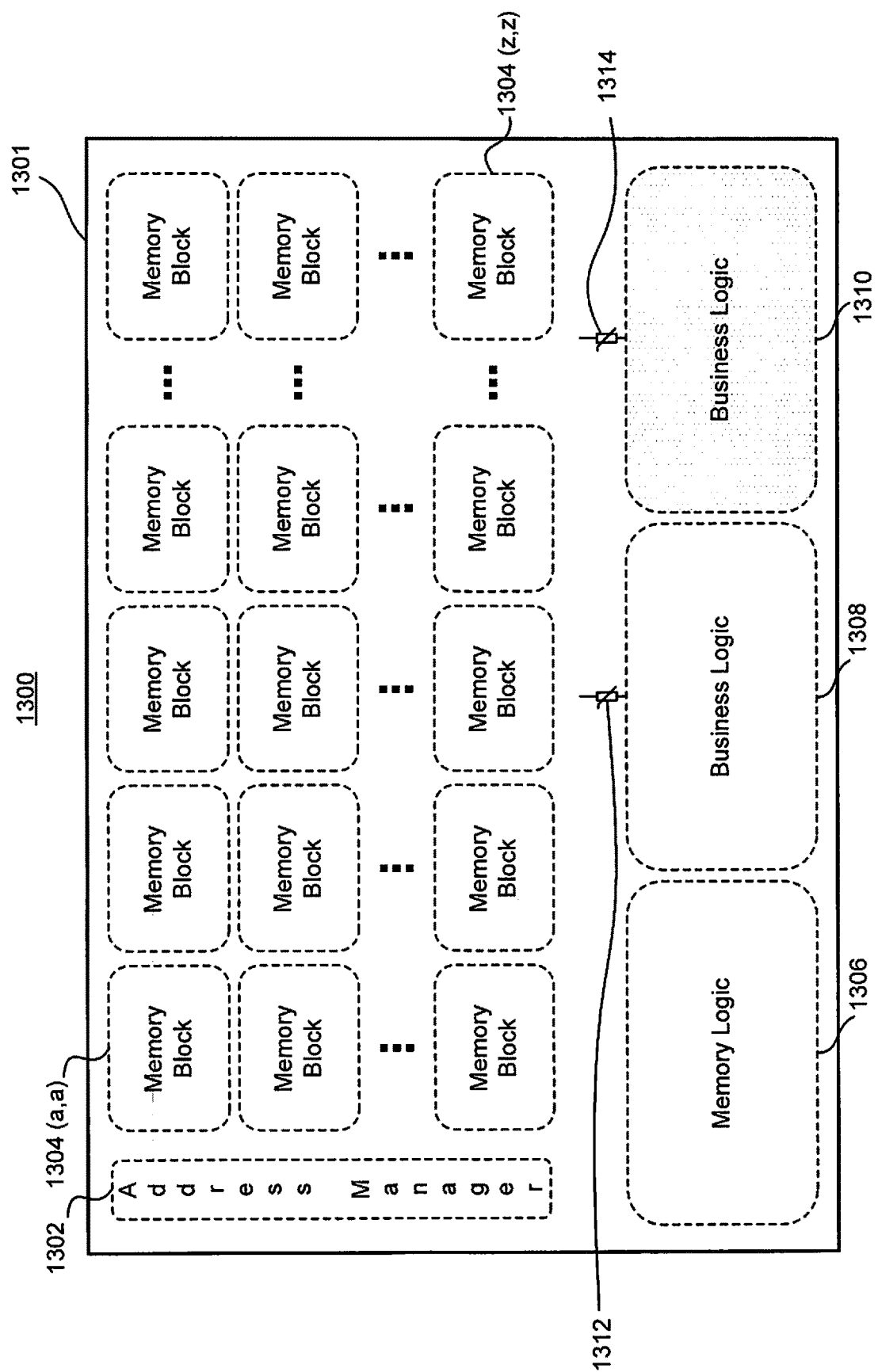
FIG. 13 is a block diagram of an exemplary memory chip, consistent with disclosed embodiments.

FIG. 13 is a block diagram of an exemplary memory chip 1300, consistent with disclosed embodiments. Memory chip 1300 may be implemented as a DRAM memory chip. Memory chip 1300 may also be implemented as any type of memory volatile or non-volatile, such as Flash, SRAM, ReRAM, PRAM, and/or MRAM, etc. Memory chip 1300 may include a substrate 1301 in which an address manager 1302, a memory array 1304 including a plurality of memory banks, 1304(a,a) to 1304(z,z), a memory logic 1306, a business logic 1308, and a redundant business logic 1310 are disposed. Memory logic 1306 and business logic 1308 may constitute primary logic blocks, while redundant business logic 1310 may constitute redundant blocks. In addition, memory chip 1300 may include configuration switches, which may include deactivation switches 1312, and an activation switches 1314. Deactivation switches 1312 and activation switches 1314 may also be disposed in the substrate 1301. In this Application, memory logic 1306, business logic 1308, and redundant business logic 1310 may also be collectively referred to as the "logic blocks."

Address manager 1302 may include row and column decoders or other type of memory auxiliaries. Alternatively, or additionally, address manager 1302 may include a microcontroller or processing unit.

In some embodiments, as shown in FIG. 13, memory chip 1300 may include a single memory array 1304 that may arrange the plurality of memory blocks in a two-dimensional array on substrate 1301. In other embodiments, however, memory chip 1300 may include multiple memory arrays 1304 and each of the memory arrays 1304 may arrange memory blocks in different configurations. For example, memory blocks in at least one of the memory arrays (also known as memory banks) may be arranged in a radial distribution to facilitate routing between address manager 1302 or memory logic 1306 to the memory blocks.

Business logic 1308 may be used to do the in-memory computation of an application that is not related to the logic used to manage the memory itself. For example, business logic 1308 may implement functions related to AI such as floating, integer, or MAC operations used as activation functions. In addition, business logic 1308 may implement data base related functions like min, max, sort, count, among others. Memory logic 1306 may perform tasks related to memory management, including (but not limited to) read, write, and refresh operations. Therefore, business logic may be added in one or more of the bank level, mats level, or a group of mats level. Business logic 1308 may have one or more address outputs and one or more data inputs/outputs. For instance, business logic 1308 can address by row\column lines to address manager 1302. In certain embodiments, however, the logic blocks may be additionally or alternatively addressed via data inputs\outputs.

Redundant business logic 1310 may be a replicate of business logic 1308. In addition, redundant business logic 1310 may be connected to deactivation switches 1312 and/or activation switches 1314, which may include small fuse\anti-fuse, and used for logic disabling or enabling one of the instances (e.g., an instance which is connected by default) and enable one of the other logic blocks (e.g., an instance which is disconnected by default). In some embodiments, as further described in connection to FIG. 15, the redundancy of blocks may be local within a logic block, such as business logic 1308.

In some embodiments, the logic blocks in memory chip 1300 may be connected to subsets of memory array 1304 with dedicated buses. For example, a set of memory logic 1306, business logic 1308, and redundant business logic 1310 may be connected to the first row of memory blocks in memory array 1304 (i.e., memory blocks 1304(a,a) to 1304(a,z)). The dedicated buses may allow associated logic blocks to quickly access data from the memory blocks without requirements of opening communication lines through, for example, address manager 1302.

Each of the plurality of primary logic blocks may be connected to at least one of the plurality of memory banks 1304. Also, redundant blocks, such as redundant business block 1310, may be connected to at least one of the memory instances 1304(a,a)-(z,z). Redundant blocks may replicate at least one of the plurality of primary logic blocks, such as memory logic 1306 or business logic 1308. Deactivation switches 1312 may be connected to at least one of the plurality of primary logic blocks and activation switches 1314 may be connected to at least one of the plurality of redundant blocks.

In these embodiments, upon detecting of a fault associated with one of the plurality of primary logic blocks (memory logic 1306 and/or business logic 1308), deactivation switches 1312 may be configured to disable the one of the plurality of primary logic blocks. Simultaneously, activation switches 1314 may be configured to enable one of the plurality of redundant blocks, such as redundant logic block 1310, that replicates the one of the plurality of primary logic blocks.

In addition, activation switches 1314 and deactivation switches 1312, which may collectively be referred to as "configuration switches," may include an external input to configure the status of the switch. For instance, activation switches 1314 may be configured so an activation signal in the external input causes a closed switch condition, while deactivation switches 1312 may be configured so a deactivation signal in the external input causes an open switch condition. In some embodiments, all configuration switches in 1300 may be deactivated by default and become activated or enabled after a test indicates an associated logic block is functional and a signal is applied in the external input. Alternatively, in some cases, all configuration switches in 1300 may be enabled by default and may be deactivated or disabled after a test indicates an associated logic block is not functional and a deactivation signal is applied in the external input.

Regardless of whether a configuration switch is initially enabled or disabled, upon detection of a fault associated with an associated logic block, the configuration switch may disable the associated logic block. In cases where the configuration switch is initially enabled, the state of the configuration switch may be changed to disabled in order to disable the associated logic block. In cases where the configuration switch is initially disabled, the state of the configuration switch may be left in its disabled state in order to disable the associated logic block. For example, the result of an operability test may indicate that a certain logic block is nonoperational or that it fails to operate within certain specifications. In such cases, the logic block may be disabled my not enabling its corresponding configuration switch.

In some embodiments, configuration switches may be connected to two or more logic blocks and may be configured to choose between different logic blocks. For example, a configuration switch may be connected to both business logic 1308 and redundant logic block 1310. Configuration switch may enable redundant logic block 1310 while disabling business logic 1308.

Alternatively, or additionally, at least one of the plurality of primary logic blocks (memory logic 1306 and/or business logic 1308) may be connected to a subset of the plurality of memory banks or memory instances 1304 with a first dedicated connection. Then, at least one of the plurality of redundant blocks (such as redundant business logic 1310), which replicates the at least one of the plurality of primary logic blocks, may be connected to the subset of the same plurality of memory banks or instances 1304 with a second dedicated connection.

Moreover, memory logic 1306 may have different functions and capabilities than business logic 1308. For example, while memory logic 1306 may be designed to enable read and write operations in the memory bank 1304, business logic 1308 may be designed to perform in-memory computations. Therefore, if the business logic 1308 includes a first business logic block, and the business logic 1308 includes a second business logic block (like redundant business logic 1310), it is possible to disconnect defective business logic 1308 and reconnect redundant business logic 1310 without missing any capability.

In some embodiments, configuration switches (including deactivation switches 1312 and activation switches 1314) may be implemented with a fuse, an anti-fuse, or a programmable device (including a one-time programmable device), or other form of non-volatile memory.

Figure 14:
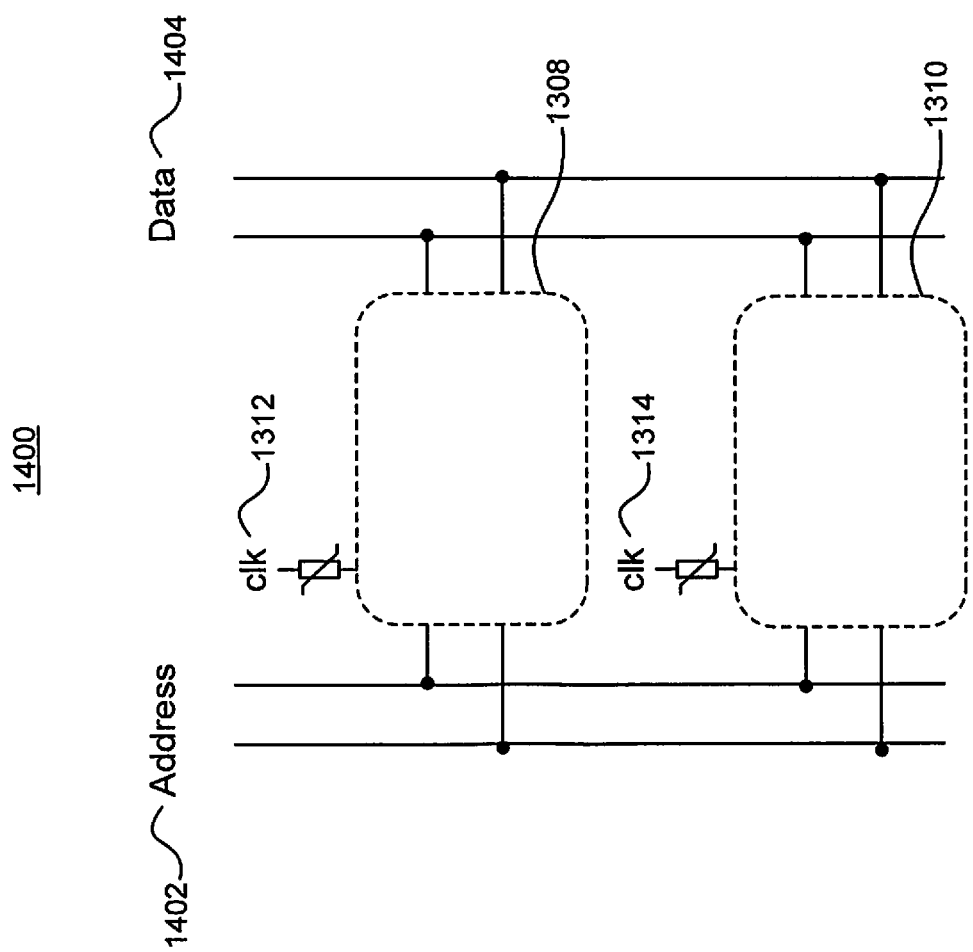
FIG. 14 is a block diagram of an exemplary redundant logic block set, consistent with disclosed embodiments.

FIG. 14 is a block diagram of an exemplary redundant logic block set 1400, consistent with disclosed embodiments. In some embodiments, redundant logic block set 1400 may be disposed in substrate 1301. Redundant logic block set 1400 may include at least one of business logic 1308, and redundant business logic 1310, connected to switches 1312 and 1314, respectively. In addition, business logic 1308 and redundant business logic 1310 may be connected to an address bus 1402 and a data bus 1404.

In some embodiments, as shown in FIG. 14, the switches 1312 and 1314 may connect logic blocks to a clock node. In this way, the configuration switches may engage or disengage the logic blocks from the clock signal, effectively activating or deactivating the logic blocks. In other embodiments, however, switches 1312 and 1314 may connect logic blocks to other nodes for activation or deactivation. For instance, configuration switches may connect logic blocks to a voltage supply node (e.g., VCC) or to the ground node (e.g., GND) or clock signal. In this way, the logic blocks may be enabled or disabled by the configuration switches because they would create an open circuit or cut-off the logic block power supply.

In some embodiments, as shown in FIG. 14, address bus 1402 and data bus 1404 may be in opposite sides of the logic blocks, which are connected in parallel to each one of the buses. In this way, routing of the different on-chip components may be facilitated by the logic block set 1400.

In some embodiments, each one of the plurality of deactivation switches 1312 couple at least one of the plurality of primary logic blocks with a clock node, and each one of the plurality of activation switches 1314 may be couple at least one of the plurality of redundant blocks with the clock node allowing to connect\disconnect the clock as a simple activation\deactivation mechanism.

Redundant business logic 1310 of redundant logic block set 1400 allows the designer to choose, based on area and routing, the blocks that are worth duplication. For example, a chip designer may select larger blocks for duplication because larger blocks may be more error prone. Thus, a chip designer may decide to duplicate large logic blocks. On the other hand, a designer may prefer to duplicate smaller logic blocks because they are easily duplicated without a significant loss of space. Moreover, using the configuration in FIG. 14, a designer may easily choose to duplicate logic blocks depending on the statistics of errors per area.

Figure 15:
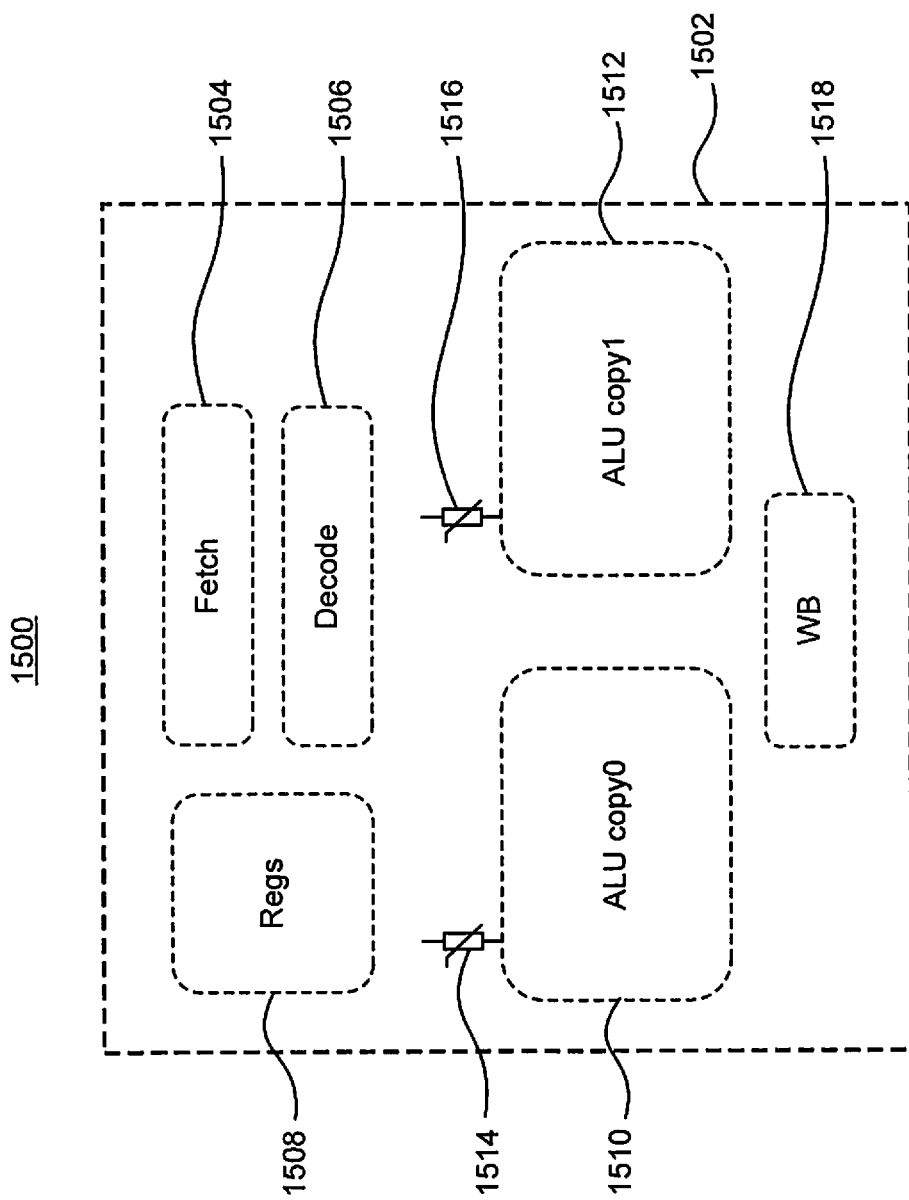
FIG. 15 is a block diagram for an exemplary logic block, consistent with disclosed embodiments.

FIG. 15 is a block diagram for an exemplary logic block 1500, consistent with disclosed embodiments. The logic block may be business logic 1308 and/or redundant business logic 1310. In other embodiments, however, the exemplary logic block may describe memory logic 1306 or other component of memory chip 1300.

Logic block 1500 presents yet another embodiment where the logic redundancy is used within a small processor pipeline. The logic block 1500 may include a register 1508, a fetch circuit 1504, decoder 1506, and a write-back circuit 1518. In addition, logic block 1500 may include a computation unit 1510 and a duplicated computing unit 1512. However, in other embodiments, logic block 1500 may include other units that do not comprise a controller pipeline but include sporadic processing elements that comprise a required business logic.

Computation unit 1510 and duplicated computation unit 1512 may include a digital circuit capable of performing digital calculations. For example, computation unit 1510 and duplicated computation unit 1512 may include an arithmetic logic unit (ALU) to perform arithmetic and bitwise operations on binary numbers. Alternatively, computation unit 1510 and duplicated computation unit 1512 may include a floating-point unit (FPU), which operates on floating point numbers. In addition, in some embodiments computation unit 1510 and duplicated computation unit 1512 may implement data base related functions like min, max, count, and compare operations, among others.

In some embodiments, as shown in FIG. 15, computation unit 1510 and duplicated computation unit 1512 may be connected to switching circuits 1514 and 1516. When activated the switching circuits may enable or disable the computing units.

In logic block 1500, the duplicated computation unit 1512 may replicate the computation unit 1510. Moreover, in some embodiments, register 1508, fetch circuit 1504, decoder 1506, and write-back circuit 1518 (collectively referred to as the local logic units) may be smaller in size than the computation unit 1510. Because larger elements are more prone to issues during fabrication, a designer may decide to replicate larger units (such as computation unit 1510) instead of smaller units (such as the local logic units). Depending on historic yields and error rates, however, a designed may elect to duplicate local logic units additionally or alternatively to large units (or the entire block). For example, computation unit 1510 may be larger, and thus more error prone, than register 1508, fetch circuit 1504, decoder 1506, and write-back circuit 1518. A designer may choose to duplicate computation unit 1510 instead of the other elements in logic block 1500 or the whole block.

Logic block 1500 may include a plurality of local configuration switches, each one of the plurality of local configuration switches being connected to at least one of the at least one of computation unit 1510 or duplicated computation unit 1512. Local configuration switches may be configured to disable computation unit 1510 and enable duplicated computation unit 1512 when a fault is detected in the computation unit 1510.

Figure 16:
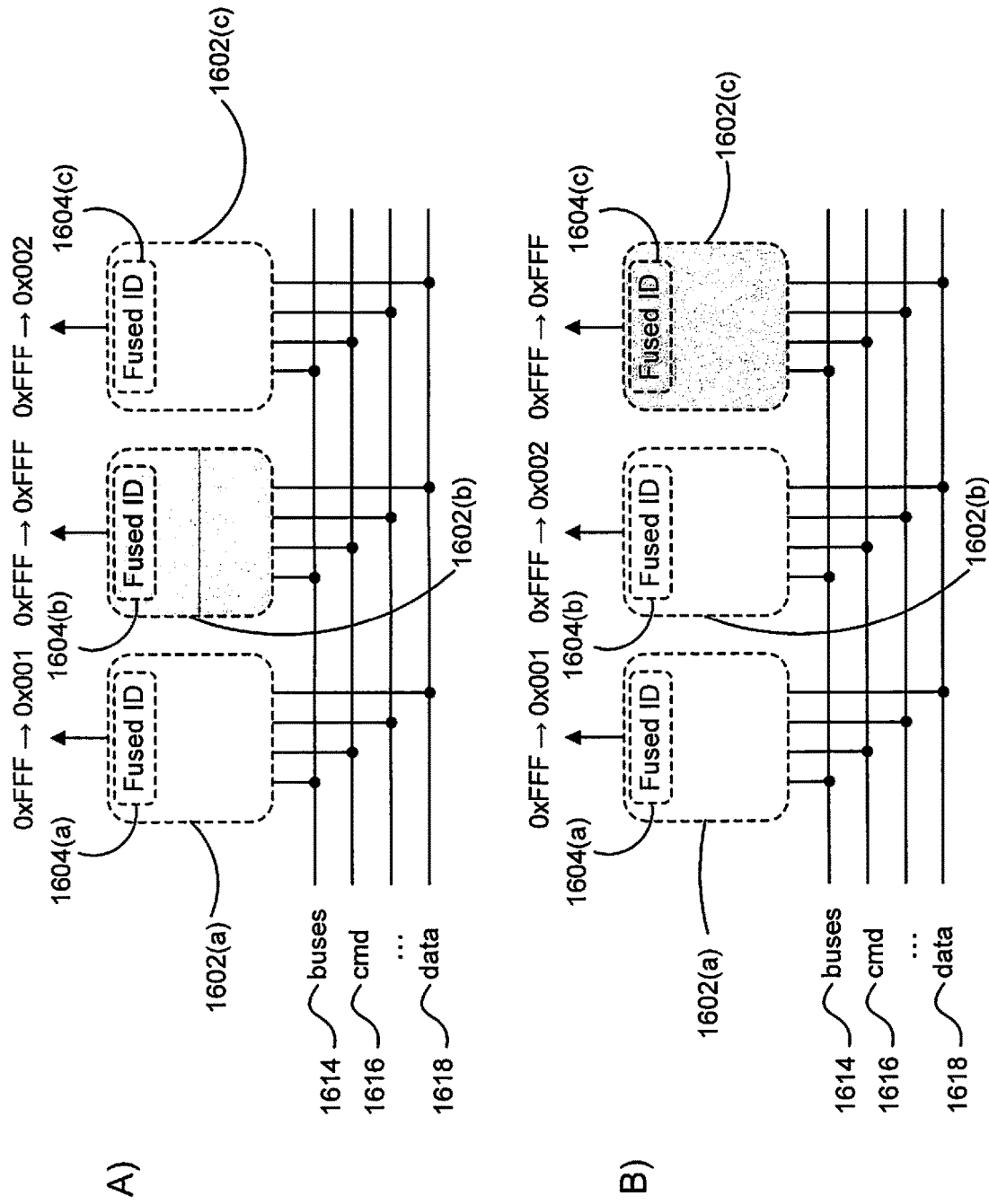
FIG. 16 are block diagrams of exemplary logic blocks connected with a bus, consistent with disclosed embodiments.

FIG. 16 shows block diagrams of exemplary logic blocks connected with a bus, consistent with disclosed embodiments. In some embodiments, logic blocks 1602 (which may represent memory logic 1306, business logic 1308, or redundant business logic 1310) may be independent of each other, may be connected via a bus, and may be activated externally by addressing them specifically. For example, memory chip 1300 may include many logic blocks, each logic block having an ID number. In other embodiments, however, logic blocks 1602 may represent larger units comprised of a plurality one or more of memory logic 1306, business logic 1308, or redundant business logic 1310.

In some embodiments, each one of logic blocks 1602 may be redundant with the other logic blocks 1602. This complete redundancy, in which all blocks may operate as primary or redundant blocks, may improve fabrication yields because a designer may disconnect faulty units while maintaining functionality of the overall chip. For example, a designer may have the ability to disable logic areas that are prone to errors but maintain similar computation capabilities because the all duplicate blocks may be connected to the same address and data buses. For example, the initial number of logic blocks 1602 may greater than a target capability. Then, disabling some logic blocks 1602 would not affect the target capability.

A bus connected to the logic blocks may include address bus 1614, command lines 1616, and data lines 1618. As shown in FIG. 16, each one of the logic blocks may be connected independently from each line in the bus. In certain embodiments, however, logic blocks 1602 may be connected in a hierarchical structure to facilitate routing. For instance, each line in the bus may be connected to a multiplexer that routes the line to different logic blocks 1602.

In some embodiments, to allow external access without knowing the internal chip structure, which may change due to enable and disabled units, each one of the logic blocks may include Fused IDs such as fused identification 1604. Fused identification 1604 may include an array of switches (like fuses) that determine an ID and may be connected to a managing circuit. For example, fused identification 1604 may be connected to address manager 1302. Alternatively, fused identification 1604 may be connected to higher memory address units. In these embodiments, fused identification 1604 may be configurable to for a specific address. For example, fused identification 1604 may include a programmable, non-volatile device that determines a final ID based on instructions received form a managing circuit.

A distributed processor on a memory chip may be designed with the configuration depicted in FIG. 16. A testing procedure executed as BIST at chip wakeup or at factory testing may assign running ID numbers to blocks in the plurality of primary logic blocks (memory logic 1306 and business logic 1308) that pass a testing protocol. A testing procedure may also assign illegal ID numbers to blocks in the plurality of primary logic blocks that do not pass the testing protocol. The test procedure may also assign running ID numbers to blocks in the plurality of redundant blocks (redundant logic block 1310) that pass the testing protocol. Because redundant blocks replace failing primary logic blocks, the blocks in the plurality of redundant blocks assigned running ID numbers may be equal to, or greater than, the blocks in the plurality of primary logic blocks assigned illegal ID numbers, thereby disabling the block. In addition, each one of the plurality of primary logic blocks and each one of the plurality of redundant blocks may include at least one fused identification 1604. Also, as shown in FIG. 16, the bus connecting logic blocks 1602 may include a command line, a data line, and an address line.

In other embodiments, however, all logic blocks 1602 that are connected to the bus will start disabled and with no ID number. Tested one by one, each good logic block will get a running ID number, and those logic blocks not working will remain with illegal ID, which would disable these blocks. In this manner, redundant logic blocks may improve the fabrication yields by replacing blocks that are known to be defective during the testing process.

Address bus 1614 may couple a managing circuit to each one of the plurality of memory banks, each one of the plurality of primary logic blocks, and each one of the plurality of redundant blocks. These connections allow the managing circuit to, upon detection of the fault associated with a primary logic blocks (such as business logic 1308), assign an invalid address to the one of the plurality of primary logic blocks and assign a valid address to the one of the plurality of redundant blocks.

For example, as shown in FIG. 16A, illegal IDs are configured to all logic blocks 1602(*a*)-(*c*) (e.g., address 0xFFF). After testing logic blocks 1602(*a*) and 1602(*c*) are verified to be functional while logic block 1602(*b*) is not functional. In FIG. 16A unshaded logic blocks may represent logic blocks that passed the functionality test successfully, while shaded logic blocks may represent logic blocks that failed the test for functionality. Then, the test procedure changes the illegal IDs to legal IDs for logic blocks that are functional while leaving the illegal IDs for logic blocks that are not functional. As an example, in FIG. 16A, the address for logic blocks 1602(*a*) and 1602(*c*) is changed from 0xFFF to 0x001 and 0x002, respectively. In contrast, the address for logic block 1602(*b*) remains the illegal address 0xFFF. In some embodiments, the ID is changed by programming a corresponding fused identification 1604.

Different results from the testing of logic blocks 1602 may result in a different configuration. For example, as shown in FIG. 16B, address manager 1302 may initially assign illegal IDs to all logic blocks 1602 (i.e., 0xFFF). The testing results, however, may indicate that both logic blocks 1602(*a*) and 1602(*b*) are functional. In these cases, testing of logic block 1602(*c*) may not be necessary because memory chip 1300 may require only two logic blocks. Therefore, to minimize testing resources, logic blocks may be tested only according to the minimum number of functional logic blocks needed by the product definition of 1300, leaving other logic blocks untested. FIG. 16B also shows unshaded logic blocks, which represent tested logic blocks that passed the test for functionality, and shaded logic blocks, which represent untested logic blocks.

In these embodiments, a production tester (external or internal, automatic or manual) or a controller executing a BIST at startup, may change illegal IDs to running IDs for tested logic blocks that are functional while leaving the illegal IDs to untested logic blocks. As an example, in FIG.

16B, the address for logic blocks 1602(*a*) and 1602(*b*) is changed from 0xFFF to 0x001 and 0x002, respectively. In contrast, the address for untested logic block 1602(*c*) remains with the illegal address 0xFFF.

Figure 17:
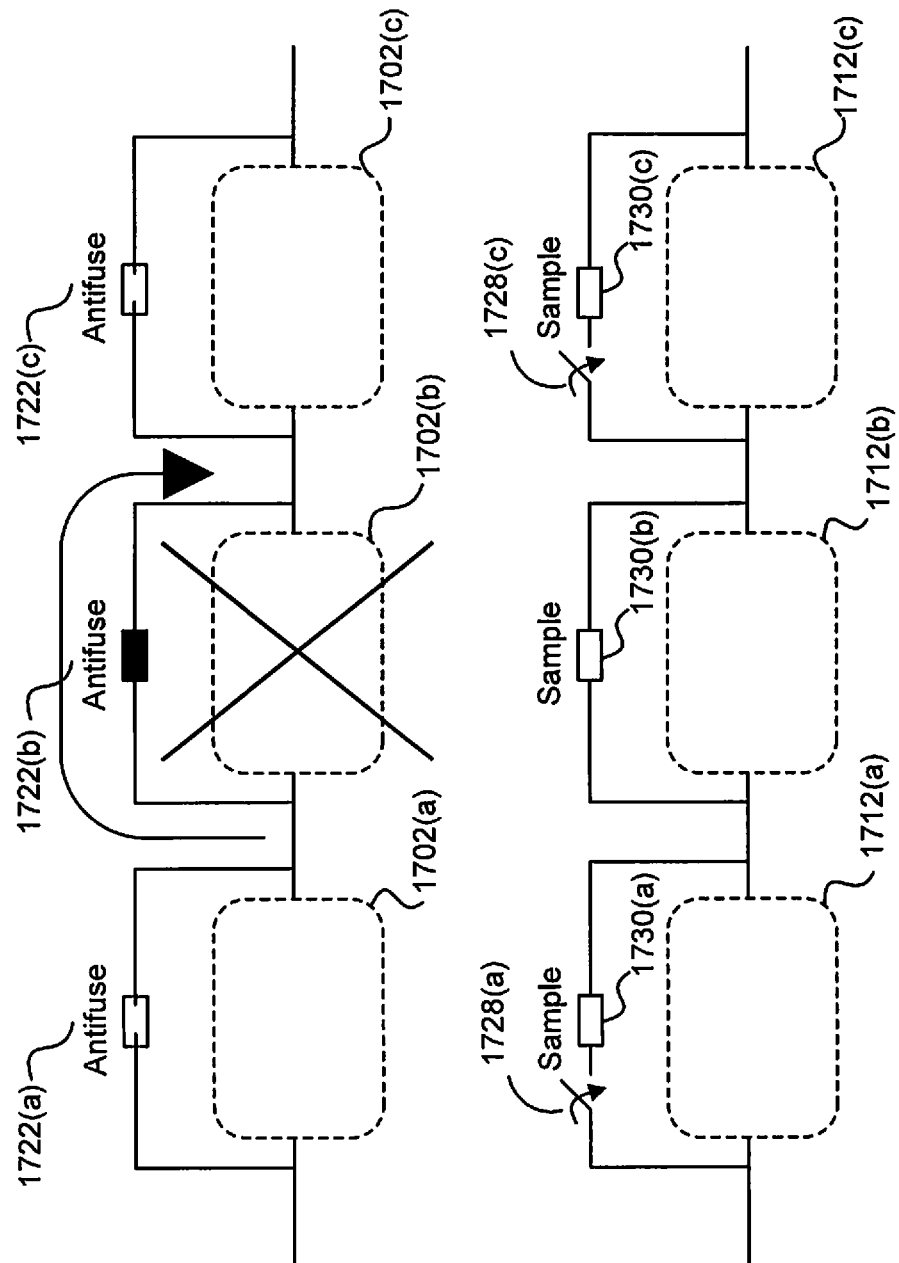
FIG. 17 is a block diagram for exemplary logic blocks connected in series, consistent with disclosed embodiments.

FIG. 17 is a block diagram for exemplary units 1702 and 1712 connected in series, consistent with disclosed embodiments. FIG. 17 may represent an entire system or chip. Alternatively, FIG. 17 may represent a block in a chip containing other functional blocks.

Units 1702 and 1712 may represent complete units that include a plurality of logic blocks such as memory logic 1306 and/or business logic 1308. In these embodiments units 1702 and 1712 may also include elements required to perform operations such as address manager 1302. In other embodiments, however, units 1702 and 1712 may represent logic units such as business logic 1308 or redundant business logic 1310.

FIG. 17 presents embodiments in which units 1702 and 1712 may need to communicate between themselves. In such cases, units 1702 and 1712 may be connected in series. However, a non-working unit may break the continuity between the logic blocks. Therefore, the connection between units may include a bypass option when a unit needs to be disabled due to a defect. The bypass option can also be a part of the bypassed unit itself.

In FIG. 17 units may be connected in series (e.g., 1702 (*a*)-(*c*)), and a failing unit (e.g., 1702(*b*)) may be bypassed when it is defective. The units may further be connected in parallel with switching circuits. For example, in some embodiments units 1702 and 1712 may be connected with switching circuits 1722 and 1728, as depicted in FIG. 17. In the example depicted in FIG. 17, unit 1702(*b*) is defective. For example, unit 1702(*b*) does not pass a test for a circuit functionality. Therefore, unit 1702(*b*) may be disabled using, for example, activation switches 1314 (not shown in FIG. 17) and/or switching circuit 1722(*b*) may be activated to bypass unit 1702(*b*) and sustain the connectivity between logic blocks.

Accordingly, when a plurality of primary units are connected in series, each one of the plurality of units may be connected in parallel with a parallel switch. Upon detection of a fault associated with the one of the plurality of units, the parallel switch connected to the one of the plurality of units may be activated to connect two of the plurality of units.

In other embodiments, as shown in FIG. 17, switching circuits 1728 may include a sampling point or more that would cause a cycle or cycles delay maintaining synchronization between different lines of units. When a unit is disabled, shorting the connection between adjacent logic blocks may generate synchronization errors with other calculations. For example, if a task requires data from both A and B lines, and each of A and B is carried by an independent series of units, disabling a unit would cause a desynchronization between the lines that would require further data management. To prevent desynchronizations, sample circuits 1730 may simulate the delay caused by the disabled unit 1712(*b*). Nonetheless, in some embodiments, the parallel switch may include an anti-fuse instead of a sampling circuit 1730.

Figure 18:
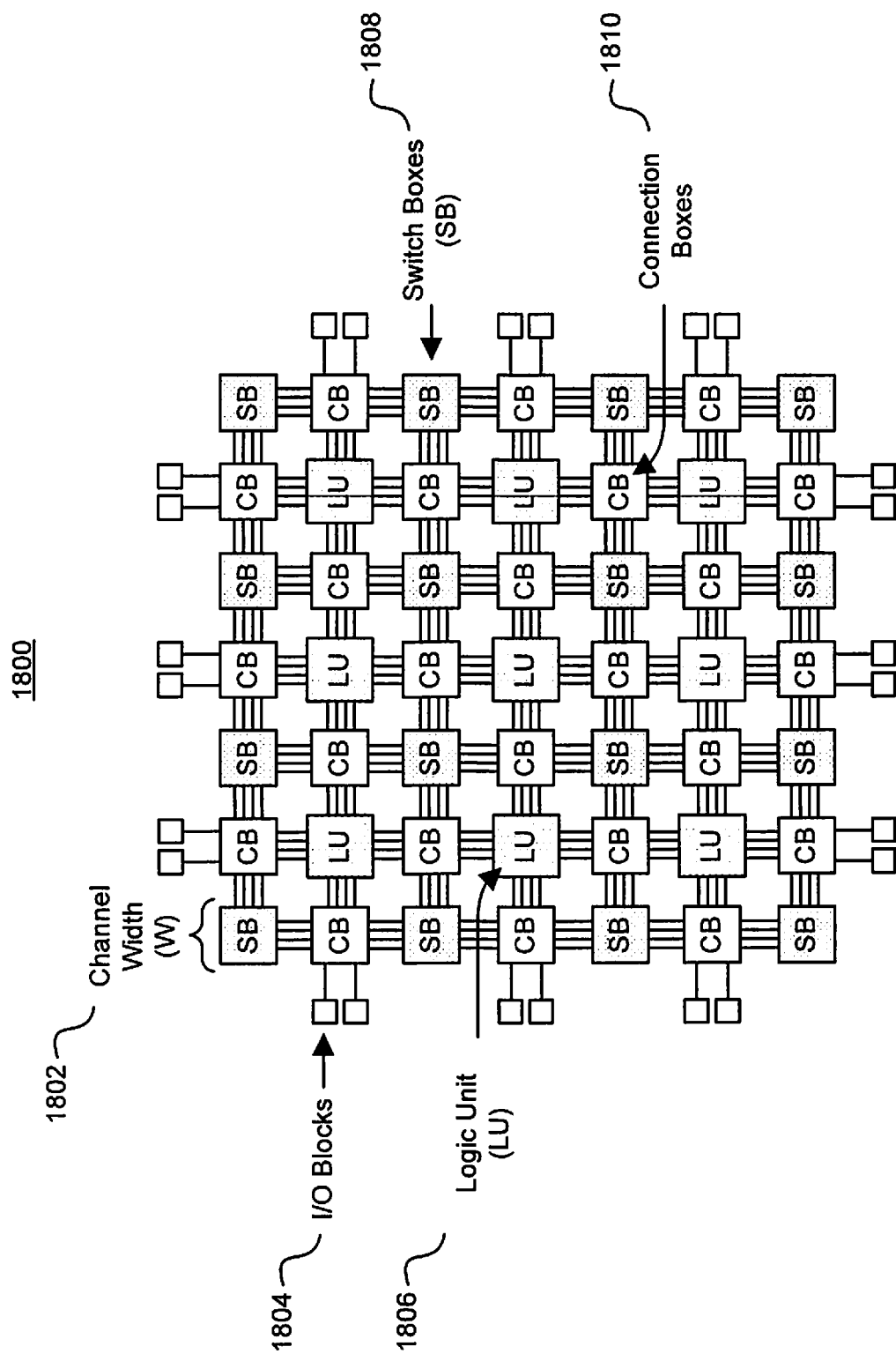
FIG. 18 is a block diagram of exemplary logic blocks connected in a two-dimension array, consistent with disclosed embodiments.

FIG. 18 is a block diagram of exemplary units connected in a two-dimension array, consistent with disclosed embodiments. FIG. 18 may represent an entire system or chip. Alternatively, FIG. 18 may represent a block in a chip containing other functional blocks.

Units 1806 may represent autonomous units that include a plurality of logic blocks such as memory logic 1306 and/or business logic 1308. However, in other embodiments units 1806 may represent logic units such as business logic 1308. Where convenient, discussion of FIG. 18 may refer to elements identified in FIG. 13 (e.g., memory chip 1300) and discussed above.

As shown in FIG. 18, units may be arranged in a two-dimensional array in which units 1806 (which may include or represent one or more of memory logic 1306, business logic 1308, or redundant business logic 1310) are interconnected via switching boxes 1808 and connection boxes 1810. In addition, in order to control the configuration of the two-dimensional array, the two-dimensional array may include I/O blocks 1804 in the periphery of the two-dimensional array.

Connection boxes 1810 may be programmable and reconfigurable devices that may respond to signals inputted from the I/O blocks 1804. For example, connection boxes may include a plurality of input pins from units 1806 and may also be connected to switching boxes 1808. Alternatively, connection boxes 1810 may include a group of switches connecting pins of programmable logic cells with routing tracks, while switching boxes 1808 may include a group of switches connecting different tracks.

In certain embodiments, connection boxes 1810 and switching boxes 1808 may be implemented with configuration switches such as switches 1312 and 1314. In such embodiments, connection boxes 1810 and switching boxes 1808 may be configured by a production tester or a BIST executed at chip startup.

In some embodiments, connection boxes 1810 and switching boxes 1808 may be configured after units 1806 are tested for a circuit functionality. In such embodiments, I/O blocks 1804 may be used to send testing signals to units 1806. Depending on the test results, I/O blocks 1804 may send programming signals that configure connection boxes 1810 and switching boxes 1808 in a manner disabling the units 1806 that fail the testing protocol and enabling units 1806 that pass the testing protocol.

In such embodiments, the plurality of primary logic blocks and the plurality of redundant blocks may be disposed on the substrate in a two-dimensional grid. Therefore, each one of the plurality of primary units 1806 and each one of the plurality of redundant blocks, such as redundant business logic 1310, may be interconnected with switching boxes 1808, and an input block may be disposed in the periphery of each line and each column of the two-dimensional grid.

Figure 19:
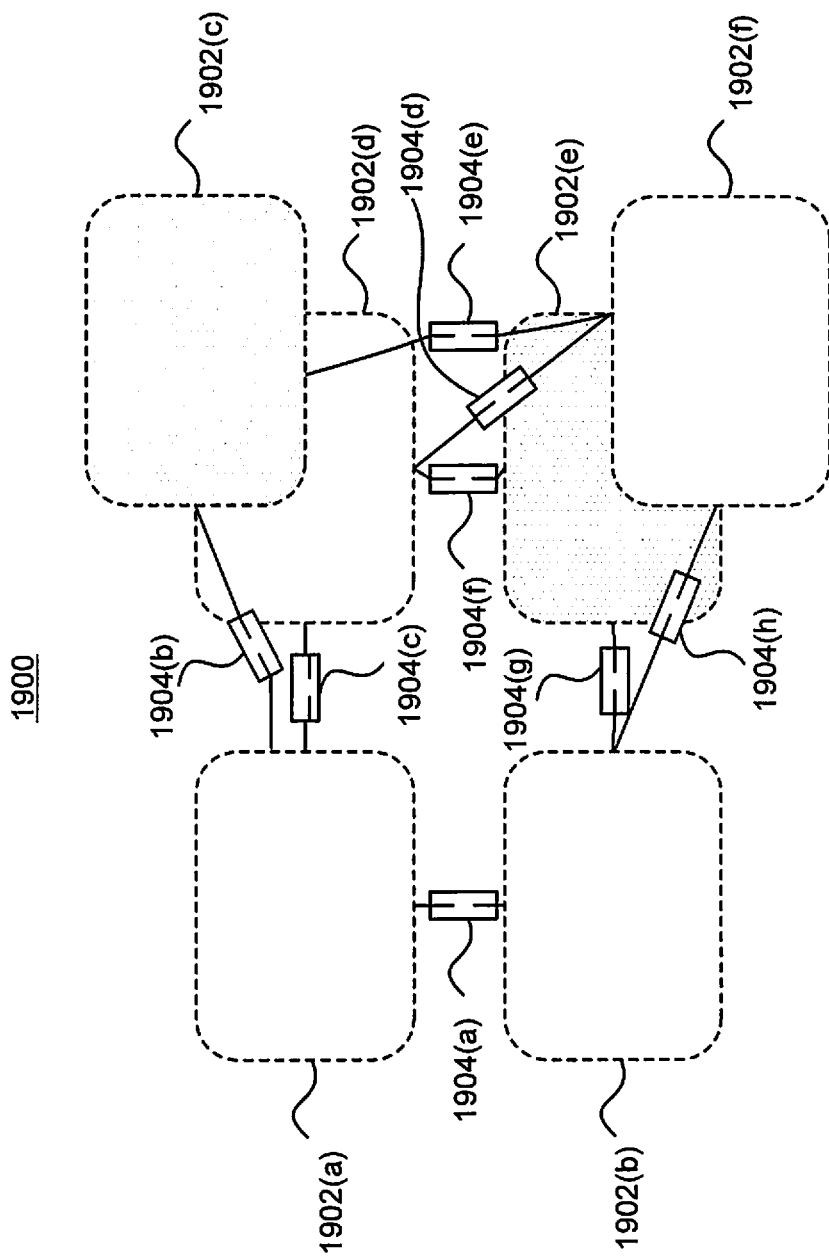
FIG. 19 is a block diagram for exemplary logic blocks in a complex connection, consistent with disclosed embodiments.

FIG. 19 is a block diagram for exemplary units in a complex connection, consistent with disclosed embodiments. FIG. 19 may represent an entire system. Alternatively, FIG. 19 may represent a block in a chip containing other functional blocks.

The complex connection of FIG. 19 includes units 1902 (*a*)-(*f*) and configuration switches 1904(*a*)-(*h*). Units 1902 may represent autonomous units that include a plurality of logic blocks such as memory logic 1306 and/or business logic 1308. However, in other embodiments units 1902 may represent logic units such as memory logic 1306, business logic 1308, or redundant business logic 1310. Configuration switches 1904 may include any of deactivation switches 1312 and activation switches 1314.

As shown in FIG. 19, the complex connection may include units 1902 in two planes. For example, the complex connection may include two independent substrates separated in the z-axis. Alternatively, or additionally, units 1902 may be arranged in two surfaces of a substrate. For example, with the objective to reduce the area of memory chip 1300, substrate 1301 may be arranged in two overlapping surfaces and connected with configuration switches 1904 arranged in three dimensions. Configuration switches may include deactivation switches 1312 and/or activation switches 1314.

A first plane of the substrate may include "main" unit 1902. These blocks may be enabled by default. In such embodiments, a second plain may include "redundant" unit 1902. These units may be disabled by default.

In some embodiments, configuration switches 1904 may include anti-fuses. Thus, after testing of units 1902, the blocks may be connected in a tile of functional units by switching certain anti-fuses to "always-on" and disable selected units 1902, even if they are in a different plane. In the example presented in FIG. 19, one of the 'main' units (unit 1902(*e*)) is not working. FIG. 19 may represent non-functional or untested blocks as shaded blocks while tested or functional blocks may be unshaded. Therefore, configuration switches 1904 are configured so one of the logic blocks in a different plane (e.g., unit 1902(*f*)) becomes active. In this way even though one of the main logic blocks was defective, the memory chip is still working by replacing a spare logic unit.

FIG. 19 additionally shows that one of the units 1902 (i.e., 1902(*c*)) in the second plane is not tested or enabled because the main logic blocks are functional. For example, in FIG. 19, both main units 1902(*a*) and 1902(*d*) passed a test for functionality. Thus, units 1902(*c*) was not tested or enabled. Therefore, FIG. 19 shows the ability to specifically select the logic blocks that become active depending on testing results.

In some embodiments, as shown in FIG. 19, not all units 1902 in a first plain may have a corresponding spare or redundant blocks. However, in other embodiments, all units may be redundant with each other for complete redundancy where all units are both primary or redundant. In addition, while some implementations may follow the star network topology depicted in FIG. 19, other implementation may use parallel connections, serial connections, and/or couple the different elements with configuration switches in parallel or in series.

Figure 20:
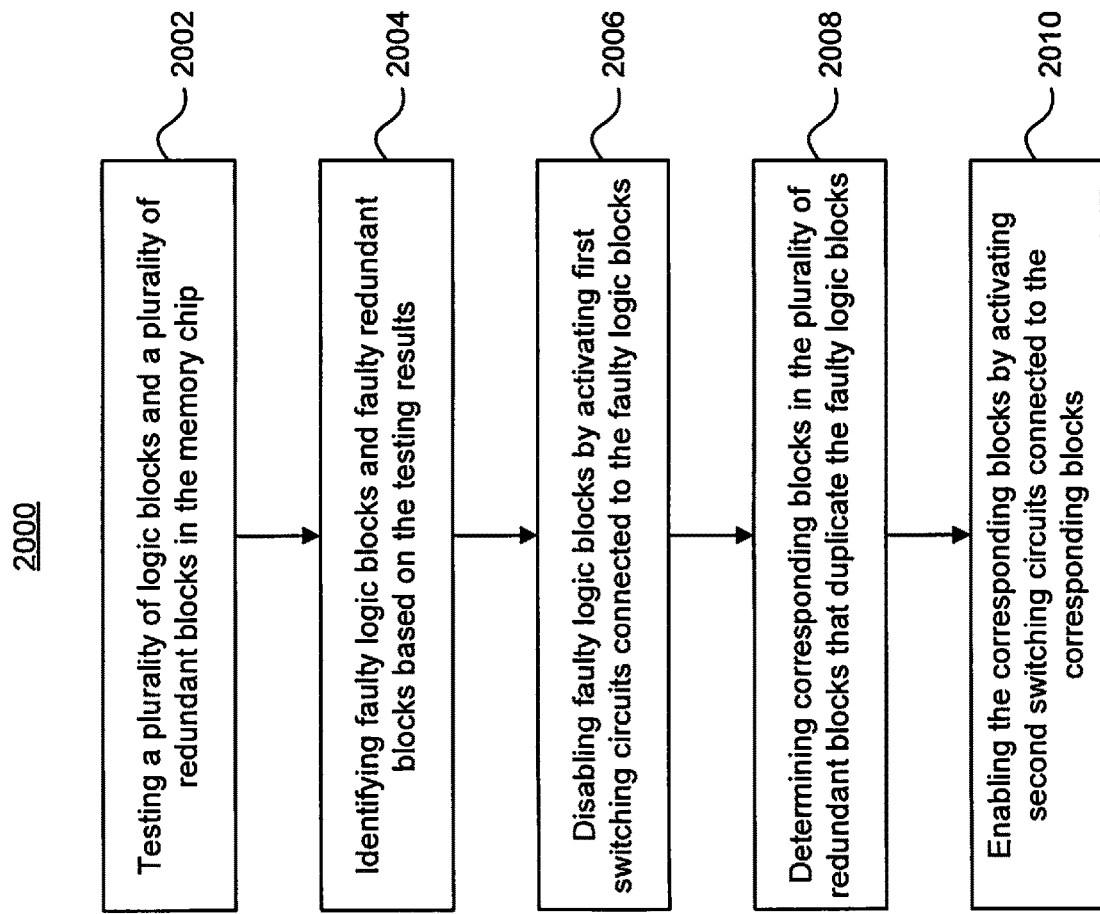
FIG. 20 is an exemplary flow chart illustrating a redundant block enabling process, consistent with disclosed embodiments.

FIG. 20 is an exemplary flowchart illustrating a redundant block enabling process 2000, consistent with disclosed embodiments. The enabling process 2000 may be implemented for memory chip 1300 and specially for DRAM memory chips. In some embodiments, process 2000 may include steps of testing each one of a plurality of logic blocks on the substrate of the memory chip for at least one circuit functionality, identifying faulty logic blocks in the plurality of primary logic blocks based on the testing results, testing at least one redundant or additional logic block on the substrate of the memory chip for the at least one circuit functionality, disabling the at least one faulty logic block by applying an external signal to a deactivation switch, and enabling the at least one redundant block by applying the external signal to an activation switch, the activation switch being connected with the at least one redundant block and being disposed on the substrate of the memory chip. The description of FIG. 20 below further elaborates on each step of process 2000.

Process 2000 may include testing a plurality of logic blocks (step 2002), such as business block 1308 and a plurality of redundant blocks (e.g., redundant business block 1310). The testing may be before packaging using, for example, probing stations for on-wafer testing. Step 2000, however, may also be performed after packaging.

The testing in step 2002 may include applying a finite sequence of testing signals to every logic block in memory chip 1300 or a subset of logic blocks in memory chip 1300. The testing signals may include requesting a computation that is expected to yield a 0 or a 1. In other embodiments, the testing signal may request reading a specific address in a memory bank or writing in a specific memory bank.

Testing techniques may be implemented to test the response of the logic blocks under iterative processes in step 2002. For example, the test may involve testing logic blocks by transmitting instructions to write data in a memory bank and then verifying the integrity of the written data. In some embodiments, the testing may include repeating the algorithm with data inversed.

In alternative embodiments, the testing of step 2002 may include running a model of the logic blocks to generate a target memory image based on a set of testing instructions. Then, the same sequence of instructions may be executed to the logic blocks in the memory chip, and the results may be recorded. The residual memory image of the simulation may also be compared to the image taken from the test, and any mismatch may be flagged as a failure.

Alternatively, in step 2002, testing may include shadow modeling, where a diagnostic is generated but the results are not necessarily predicted. Instead, the test using shadow modeling may be run in parallel on both the memory chip and a simulation. For example, when the logic blocks in the memory chip complete an instruction or task, the simulation may be signaled to execute the same instruction. Once the logic blocks in the memory chip finalize the instructions, the two models' architectural states may be compared. If there is a mismatch, then a failure is flagged.

In some embodiments, all logic blocks (including, e.g., each one of memory logic 1306, business logic 1308, or redundant business logic 1310) may be tested in step 2002. In other embodiments, however, only subsets of the logic blocks may be tested in different testing rounds. For example, in a first round of testing only memory logic 1306 and associated blocks may be tested. In a second round, only business logic 1308 and associated blocks may be tested. In a third round, depending on the results of the first two rounds, logic blocks associated with redundant business logic 1310 may be tested.

Process 2000 may continue to step 2004. In step 2004, faulty logic blocks may be identified, and faulty redundant blocks may also be identified. For example, logic blocks that do not pass the testing of step 2002 may be identified as faulty logic blocks in step 2004. In other embodiments, however, only certain faulty logic blocks may be initially identified. For example, in some embodiments, only logic blocks associated with business logic 1308 may be identified, and faulty redundant blocks are only identified if they are required for substituting a faulty logic block. In addition, identifying faulty blocks may include writing on a memory bank or a nonvolatile memory the identification information of the identified faulty blocks.

In step 2006, faulty logic blocks may be disabled. For example, using a configuration circuit, the faulty logic blocks may be disabled by disconnecting them from clock, ground, and/or power nodes. Alternatively, faulty logic blocks may be disabled by configuring connection boxes in an arrangement that avoids the logic blocks. Yet, in other embodiments, faulty logic blocks may be disabled by receiving an illegal address from address manager 1302.

In step 2008, redundant blocks that duplicate the faulty logic blocks may be identified. To support the same capabilities of the memory chips even though some logic blocks have failed, in step 2008, redundant blocks that are available and can duplicate faulty logic blocks may be identified. For example, if a logic block that performs multiplications of vectors is determined to be faulty, in step 2008, an address manager 1302 or an on-chip controller may identify an available redundant logic block that also performs multiplication of vectors.

In step 2010, the redundant blocks identified in step 2008 may be enabled. In contrast to the disable operation of step 2006, in step 2010, the identified redundant blocks may be enabled by connecting them to clock, ground, and/or power nodes. Alternatively, identified redundant blocks may be enabled by configuring connection boxes in an arrangement that connects the identified redundant blocks. Yet, in other embodiments, identified redundant blocks may be enabled by receiving a running address at the test procedure execution time.

Figure 21:
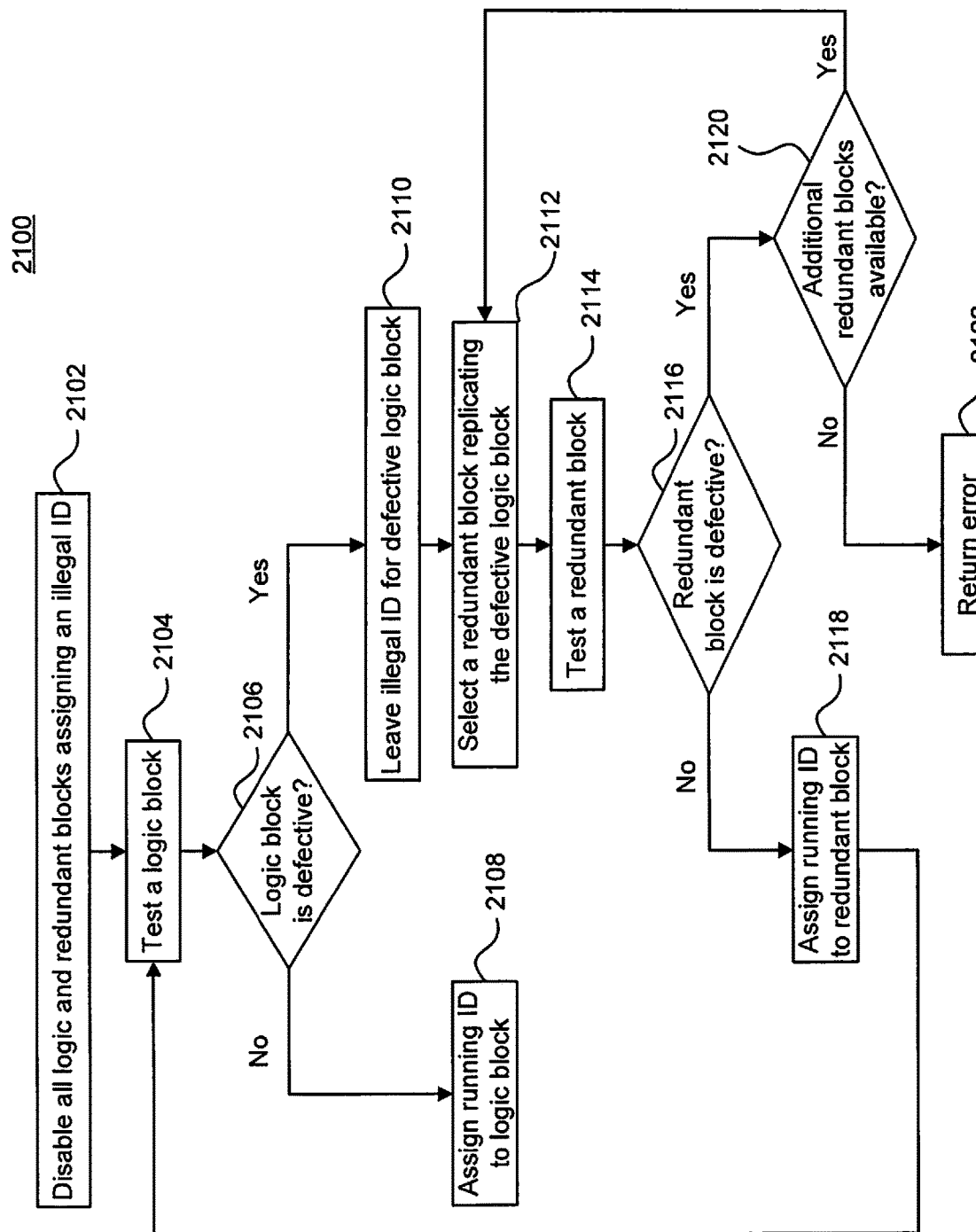
FIG. 21 is an exemplary flow chart illustrating an address assignment process, consistent with disclosed embodiments.

FIG. 21 is an exemplary flow chart illustrating an address assignment process 2100, consistent with disclosed embodiments. The address assignment process 2100 may be implemented for memory chip 1300 and specially for a DRAM memory chips. As described in relation to FIG. 16, in some embodiments, logic blocks in memory chip 1300 may be connected to a data bus and have an address identification. Process 2100 describes an address assignment method that disables faulty logic blocks and enables logic blocks that pass a test. The steps described in process 2100 will be described as being performed by a production tester or a BIST executed at chip startup; however, other components of memory chip 1300 and/or external devices may also perform one or more steps of process 2100.

In step 2102, the tester may disable all logic and redundant blocks by assigning an illegal identification to each logic block at a chip level.

In step 2104, the tester may execute a testing protocol of a logic block. For example, the tester may run testing methods described in step 2002 for one or more of the logic blocks in memory chip 1300.

In step 2106, depending on the results of the test in step 2104, the tester may determine whether the logic block is defective. If the logic block is not defective (step 2106: no), address manager may assign a running ID to the tested logic block in step 2108. If the logic block is defective (step 2106: yes), address manager 1302 may leave the illegal ID for the defective logic block in step 2110.

In step 2112, address manager 1302 may select a redundant logic block that replicates the defective logic block. In some embodiments, the redundant logic block that replicates the defective logic block may have the same components and connections to the defective logic blocks. In other embodiments, however, the redundant logic block may have different components and/or connections to the defective logic blocks but be able to perform an equivalent operation. For example, if the defective logic block is designed to perform multiplication of vectors, the selected redundant logic block would also be capable of performing multiplication of vectors, even if it does not have the same architecture as the defective unit.

In step 2114, address manager 1302 may test the redundant block. For instance, the tester may apply the testing techniques applied in step 2104 to the identified redundant block.

In step 2116, based on the results of testing in step 2114, the tester may determine whether the redundant block is defective. In step 2118, if the redundant block is not defective (step 2116: no), the tester may assign a running ID to the identified redundant block. In some embodiments, process 2100 may return to step 2104 after step 2118, creating an iteration loop to test all logic blocks in the memory chip.

If the tester determines the redundant block is defective (step 2116: yes), in step 2120, the tester may determine if additional redundant blocks are available. For example, the tester may query a memory bank with information regarding available redundant logic blocks. If redundant logic blocks are available (step 2120: yes), the tester may return to step 2112 and identify a new redundant logic block replicating the defective logic block. If redundant logic blocks are not available (step 2120: no), in step 2122, the tester may generate an error signal. The error signal may include information of the defective logic block and the defective redundant block.

Coupled Memory Banks

The presently disclosed embodiments also include a distributed high-performance processor. The processor may include a memory controller that interfaces memory banks and processing units. The processor may be configurable to expedite delivery of data to the processing units for calculations. For example, if a processing unit requires two data instances to perform a task, the memory controller may be configured so communication lines independently provide access to the information from two data instances. The disclosed memory architecture seeks to minimize hardware requirements that are associated with complex cache memory and complex register files schemes. Normally, processor chips include cache hierarchies that allow cores to work directly with registers. However, the cache operations require significant die area and consume additional power. The disclosed memory architecture avoids the use of a cache hierarchy by adding logic components in the memory.

The disclosed architecture also enables strategic (or even optimized) placement of data in memory banks. Even if the memory banks have a single port and high latency, the disclosed memory architecture may enable high performance and avoid memory accessing bottlenecks by strategically positioning data in different blocks of memory banks. With the goal of providing a continuous stream of data to the processing units, a compilation optimization step may determine how data should be stored in memory banks for specific or generic tasks. Then, the memory controller, which interfaces processing units and memory banks, may be configured to grant access to specific processing units when they require data to perform operations.

The configuration of the memory chip may be performed by a processing unit (e.g., a configuration manager) or an external interface. The configuration may be also written by a compiler or other SW tool. In addition, the configuration of the memory controller may be based on the available ports in the memory banks and the organization of data in the memory banks. Accordingly, the disclosed architecture may provide processing units with a constant flow of data or simultaneous information from different memory blocks. In this way, computation tasks within the memory may be quickly processed by avoiding latency bottlenecks or cache memory requirements.

Moreover, data stored in the memory chip may be arranged based on compilation optimization steps. The compilation may allow for building of processing routines in which the processor efficiently assigns tasks to processing units without memory latency associated delays. The compilation may be performed by a compiler and transmitted to a host connected to an external interface in the substrate. Normally, high latency for certain access patterns and/or low numbers of ports would result in data bottlenecks for processing units requiring the data. The disclosed compilation, however, may position data in memory banks in a way that enables processing units to continuously receive data even with disadvantageous memory types.

Furthermore, in some embodiments, a configuration manager may signal required processing units based on computations that are required by a task. Different processing units or logic blocks in the chip may have specialized hardware or architectures for different tasks. Therefore, depending on the task that will be performed, a processing unit, or a group of processing units, may be selected to perform the task. The memory controller on the substrate may be configurable to route data, or grant access, according to the selection of processing subunits to improve data transfer rates. For example, based on the compilation optimization and the memory architecture, processing units may be granted access to memory banks when they are required to perform a task.

Moreover, the chip architecture may include on-chip components that facilitate transfer of data by reducing the time required to access data in the memory banks. Therefore, the present disclosure describes chip architecture(s), along with a compilation optimization step, for a high-performanceprocessor capable of performing specific or generic tasks using simple memory instances. The memory instances may have high latency in random access and/or low number of ports, such as those used in a DRAM device or other memory-oriented technologies, but the disclosed architecture may overcome these shortcomings by enabling a continuous (or nearly continuous) flow of data from memory banks to processing units.

In this application, simultaneous communication may refer to communication within a clock cycle. Alternatively, simultaneous communication may refer to sending information within a predetermine amount of time. For example, simultaneous communication may refer to communication within a few nanoseconds.

Figure 22:
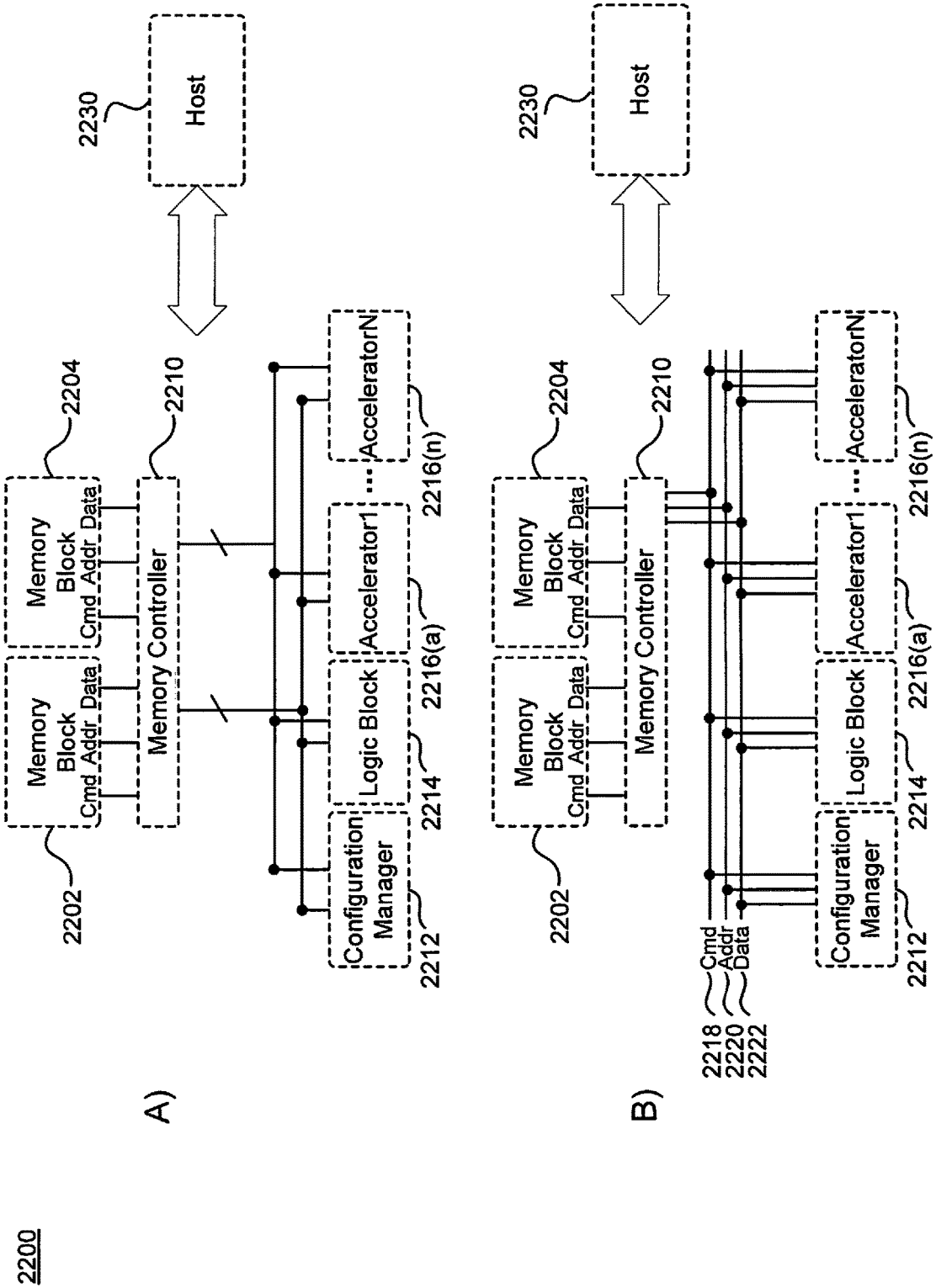
FIG. 22 provides block diagrams for exemplary processing devices, consistent with disclosed embodiments.

FIG. 22 provides block diagrams for exemplary processing devices, consistent with disclosed embodiments. FIG. 22A shows a first embodiment of a processing device 2200 in which a memory controller 2210 connects a first memory block 2202 and a second memory block 2204 using multiplexers. Memory controller 2210 may also connect at least a configuration manager 2212, a logic block 2214, and multiple accelerators 2216(a)-(n). FIG. 22B shows a second embodiment of processing device 2200 in which memory controller 2210 connects memory blocks 2202 and 2204 using a bus that connects memory controller 2210 with at least a configuration manager 2212, a logic block 2214, and multiple accelerators 2216(a)-(n). In addition, host 2230 may be external and connected to processing device 2200 through, for example, an external interface.

Memory blocks 2202 and 2204 may include a DRAM mats or group of mats, DRAM banks, MRAM\PRAM\RERAM\SRAM units, Flash mats, or other memory technologies. Memory blocks 2202 and 2204 may alternatively include non-volatile memories, a flash memory device, a Resistive Random Access Memory (ReRAM) device, or a Magnetoresistive Random Access Memory (MRAM) device.

Memory blocks 2202 and 2204 may additionally include a plurality of memory cells arranged in rows and columns between a plurality of word lines (not shown) and a plurality of bit lines (not shown). The gates of each row of memory cells may be connected to a respective one of the plurality of word lines. Each column of memory cells may be connected to a respective one of the plurality of bit lines.

In other embodiments, a memory area (including memory blocks 2202 and 2204) is built from simple memory instances. In this application, the term "memory instance" may be used interchangeably with the term "memory block." The memory instances (or blocks) may have poor characteristics. For example, the memories may be only one port memories and may have high random-access latency. Alternatively, or additionally, the memories may be inaccessible during column and line changes and face data access problems related to, for example, capacity charging and/or circuitry setups. Nonetheless, the architecture presented in FIG. 22 still facilitates parallel processing in the memory device by allowing dedicated connections between memory instances and processing units and arranging the data in a certain manner that takes the characteristics of the blocks into account.

In some device architectures, memory instances may include several ports, facilitating the parallel operations. Nonetheless, in such embodiments, the chip may still achieve an improved performance when data is compiled and organized based on the chip architecture. For example, a compiler may improve the efficiency of access in the memory area by providing instructions and organizing data placement, so it can be readily access even using one-port memories.

Furthermore, memory blocks 2202 and 2204 may be multiple types for memory in a single chip. For example, memory blocks 2202 and 2204 may be eFlash and eDRAM. Also, memory blocks may include DRAM with instances of ROM.

Memory controller 2210 may include a logic circuit to handle the memory access and return the results to the rest of the modules. For example, memory controller 2210 may include an address manager and selection devices, such as multiplexers, to route data between the memory blocks and processing units or grant access to the memory blocks. Alternatively, Memory controller 2210 may include double data rate (DDR) memory controllers used to drive DDR SDRAM, where data is transferred on both rising and falling edges of the system's memory clock.

In addition, memory controller 2210 may constitute Dual Channel memory controllers. The incorporation of dual channel memory may facilitate control of parallel access lines by memory controller 2210. The parallel access lines may be configured to have identical lengths to facilitate synchronization of data when multiple lines are used in conjunction. Alternatively, or additionally, the parallel access lines may allow access of multiple memory ports of the memory banks.

In some embodiments processing device 2200 may include one or more muxes that may be connected to processing units. The processing units may include configuration manager 2212, logic block 2214, and accelerators 2216, which may be connected directly to the mux. Also, memory controller 2210 may include at least one data input from a plurality of memory banks or blocks 2202 and 2204 and at least one data output connected to each one of the plurality of processing units. With this configuration, memory controller 2210 may simultaneously receive data from memory banks or memory blocks 2202 and 2204 via the two data inputs, and simultaneously transmits data received via to the at least one selected processing unit via the two data outputs. In some embodiments, however, the at least one data input and at least one data output may be implemented in a single port allowing only read or write operations. In such embodiments, the single port may be implemented as a data bus including data, address, and command lines.

Memory controller 2210 may be connected to each one of the plurality of memory blocks 2202 and 2204, and may also connect to processing units via, for example, a selection switch. Also processing units on the substrate, including configuration manager 2212, logic block 2214, and accelerators 2216, may be independently connected to memory controller 2210. In some embodiments, configuration manager 2212 may receive an indication of a task to be performed and, in response, configure memory controller 2210, accelerators 2216, and/or logic blocks 2214 according to a configuration stored in memory or supplied externally. Alternatively, memory controller 2210 may be configured by an external interface. The task may require at least one computation that may be used to select at least one selected processing unit from the plurality of processing units. Alternatively, or additionally, the selection may be based at least in part upon a capability of the selected processing unit for performing the at least one computation. In response, memory controller 2210 may grant access to the memory banks, or route data between the at least one selected processing unit and at least two memory banks, using dedicated buses and/or in a pipelined memory access.

In some embodiments, first memory block 2202 of at least two memory blocks may be arranged on a first side of the plurality of processing units; and second memory bank 2204 of the at least two memory banks may be arranged on a second side of the plurality of processing units opposite to the first side. Further, a selected processing unit to perform the task, for instance accelerator 2216(*n*), may be configured to access second memory bank 2204 during a clock cycle in which a communication line is opened to the first memory bank or first memory block 2202. Alternatively, the selected processing unit may be configured to transfer data to second memory block 2204 during a clock cycle in which a communication line is opened to first memory block 2202.

In some embodiments, memory controller 2210 may be implemented as an independent element, as shown in FIG. 22. In other embodiments, however, memory controller 2210 may be embedded in the memory area or may be disposed along accelerators 2216(*a*)-(*n*).

A processing area in processing device 2200 may include configuration manager 2212, logic block 2214, and accelerators 2216(*a*)-(*n*). Accelerators 2216 may include multiple processing circuits with pre-defined functions and may be defined by a specific application. For example, an accelerator may be a vector multiply accumulate (MAC) unit or a Direct Memory Access (DMA) unit handling memory moving between modules. Accelerators 2216 may also be able to calculate their own address and request the data from memory controller 2210 or write data to it. For example, configuration manager 2212 may signal at least one of accelerators 2216 that he can access the memory bank. Then accelerators 2216 may configure memory controller 2210 to route data or grant access to themselves. In addition, accelerators 2216 may include at least one arithmetic logic unit, at least one vector handling logic unit, at least one string compare logic unit, at least one register, and at least one direct memory access.

Configuration manager 2212 may include digital processing circuits to configure accelerators 2216 and instructs execution of tasks. For example, configuration manager 2212 may be connected to memory controller 2210 and each one of the plurality of accelerators 2216. Configuration manager 2212 may have its own dedicated memory to hold the configurations of accelerators 2216. Configuration manager 2212 may use the memory banks to fetch commands and configurations via memory controller 2210. Alternatively, configuration manager 2212 may be programmed through an external interface. In certain embodiments, configuration manager 2212 may be implemented with an on-chip reduced instruction set computer (RISC) or an on-chip complex CPU with its own cache hierarchy. In some embodiments, configuration manager 2212 may also be omitted and the accelerators can be configured through an external interface.

Processing device 2200 may also include an external interface (not shown). The external interface allows access to the memory from an upper level, such a memory bank controller which receives the command from external host 2230 or on-chip main processor or access to the memory from external host 2230 or on-chip main processor. The external interface may allow programming of the configuration manager 2212 and the accelerators 2216 by writing configurations or code to the memory via memory controller 2210 to be used later by configuration manager 2212 or the units 2214 and 2216 themselves. The external interface, however, may also directly program processing units without being routed through memory controller 2210. In case configuration manager 2212 is a microcontroller, configuration manager 2212 may allow loading of code from a main memory to the controller local memory via the external interface. Memory controller 2210 may be configured to interrupt the task in response to receiving a request from the external interface.

The external interface may include multiple connectors associated with logic circuits that provide a glue-less interface to a variety of elements on the processing device. The external interface may include: Data I/O Inputs for data reads and output for data writes; External address outputs; External CEO chip select pins; Active-low chip selectors; Byte enable pins; a pin for wait states on the memory cycle; a Write enable pin; an Output enable-active pin; and read-write enable pin. Therefore, the external interface has the required inputs and outputs to control processes and obtain information from the processing device. For example, the external interface may conform to JEDEC DDR standards. Alternatively, or additionally, external interface may conform to other standards such as SPI\OSPI or UART.

In some embodiments, the external interface may be disposed on the chip substrate and may be connected external host 2230. The external host may gain access to memory blocks 2202 and 2204, memory controller 2210, and processing units via the external interface. Alternatively, or additionally, external host 2230 may read and write to the memory or may signal configuration manager 2212, through read and write commands, to perform operations such as starting a process and/or stopping a process. In addition, external host 2230 may configure the accelerators 2216 directly. In some embodiments, external host 2230 be able to perform read/write operations directly on memory blocks 2202 and 2204.

In some embodiments, configuration manager 2212 and accelerators 2216 may be configured to connect the device area with the memory area using direct buses depending on the target task. For example, a subset of accelerators 2216 may connect with memory instances 2204 when the subset of accelerators has the capability to perform computations required to execute the task. By doing such a separation, it is possible to assure that dedicated accelerators get the bandwidth (BW) needed to memory blocks 2202 and 2204. Moreover, this configuration with dedicated buses may allow splitting a large memory to smaller instances or blocks because connecting memory instances to memory controller 2210 allows quick access to data in different memories even with high row latency time. To achieve the parallelization of connection, memory controller 2210 may be connected to each of the memory instances with data, address, and/or control buses.

The above-discussed inclusion of memory controller 2210 may eliminate the requirement of a cache hierarchy or complex register file in the processing device. Although the cache hierarchy can be added to give added capabilities, the architecture in processing device processing device 2200 may allow a designer to add enough memory blocks or instances based on the processing operations and manage the instances accordingly without a cache hierarchy. For example, the architecture in processing device processing device 2200 may eliminate requirements of a cache hierarchy by implementing a pipelined memory access. In the pipelined memory access, processing units may receive a sustaining flow of data in every cycle certain data lines may be opened (or activated) while other data lines receive or transmit data. The sustained flow of data using independent communication lines may allow an improved execution speed and minimum latency due to line changes.

Moreover, the disclosed architecture in FIG. 22 enables a pipelined memory access it may be possible to organize data in a low number of memory blocks and save power losses caused by line switching. For example, in some embodiments, a compiler may communicate host 2230 the organization of, or a method to organize, data in memory banks to facilitate access to data during a given task. Then, configuration manager 2212 may define which memory banks, and in some cases which ports of the memory banks, may be accessed by the accelerators. This synchronization between the location of data in memory banks and the access method to data, improves computing tasks by feeding data to the accelerators with minimum latency. For example, in embodiments in which configuration manager 2212 includes a RISC\CPU, the method may be implemented in offline software (SW) and then the configuration manager 2212 may be programmed to execute the method. The method may be developed in any language executable by RISC/CPU computers and may be executed on any platform. The inputs of the method may include configuration of the memories behind memory controller and the data itself along with the pattern of memory accesses. In addition, the method may be implemented in a language or machine language specific to the embodiment and may also be just a series of configuration values in binary or text.

As discussed above, in some embodiments, a compiler may provide instructions to host 2230 for organizing data in memory blocks 2202 and 2204 in preparation of a pipelined memory access. The pipelined memory access may generally include steps of: receiving a plurality of addresses of a plurality of memory banks or memory blocks 2202 and 2204; accessing the plurality of memory banks according to the received addresses using independent data lines; supplying data from a first address through a first communication line to at least one of the plurality of processing units and opening a second communication line to a second address, the first address being in a first memory bank of the plurality of memory banks, the second address being in second memory bank 2204 of the plurality of memory banks; and supplying data from the second address through the second communication line to the at least one of the plurality of processing units and opening a third communication line to a third address in the first memory bank in the first line within a second clock cycle. In some embodiments, the pipelined memory access may be executed with two memory blocks being connected to a single port. In such embodiments, memory controller 2210 may hide the two memory blocks behind a single port but transmit data to the processing units with the pipelined memory access approach.

In some embodiments, a compiler can run on host 2230 before executing a task. In such embodiments, the compiler may be able to determine a configuration of data flow based on the architecture of the memory device since the configuration would be known to the compiler.

In other embodiments, if the configuration of memory blocks 2204 and 2202 is unknown at offline time, the pipelined method can run on host 2230 which may arrange data in memory blocks before starting calculations. For example, host 2230 may directly write data in memory blocks 2204 and 2202. In such embodiments, processing units, such as configuration manager 2212 and memory controller 2210 may not have information regarding required hardware until run time. Then, it may be necessary to delay the selection of an accelerator 2216 until a task starts running. In these situations, the processing units or memory controller 2210 may randomly select an accelerator 2216 and create a test data access pattern, which may be modified as the task is executed.

Nonetheless, when the task is known in advance, a compiler may organize data and instructions in memory banks for host 2230 to provide to a processing unit, such as configuration manager 2212, to set signal connections that minimize access latency. For example, in some cases n words may be needed at the same time by accelerators 2216. However, each memory instance supports retrieving only m words at a time, where "m" and "n" are integers and m<n. Thus, the compiler may place the needed data across different memory instances or blocks facilitating data access. Also, to avoid line miss latencies, a host may split data in different lines of different memory instances if processing device 2200 includes multiple memory instances. The division of data may allow accessing the next line of data in the next instance while still using data from the current instance.

For example, accelerator 2216(*a*) may be configured to multiply two vectors. Each one of the vectors may be stored in independent memory blocks, such as memory blocks 2202 and 2204, and each vector may include multiple words. Therefore, to complete a task requiring a multiplication by accelerator 2216(*a*), it may be necessary to access the two memory blocks and retrieve multiple words. However, in some embodiments, memory blocks only allow access of one word per clock cycle. For instance, memory blocks may have a single port. In these cases, to expedite data transmittal during an operation, a compiler may organize the words composing vectors in different memory blocks allowing parallel and/or simultaneous reading of the words. In these situations, a compiler may store words in memory blocks that have a dedicated line. For instance, if each vector includes two words and memory controller has direct access to four memory blocks, a compiler may arrange data in four memory blocks, each one transmitting a word and expediting data delivery. Moreover, in embodiments when memory controller 2210 may have more than a single connection to each memory block, the compiler may instruct configuration manager 2212 (or other processing unit) to access ports specific ports. In this way, processing device 2200 may perform a pipelined memory access, continuously providing data to processing units by simultaneously loading words in some lines and transmitting data in other lines. Thus, this pipelined memory access avoid may avoid latency issues.

Figure 23:
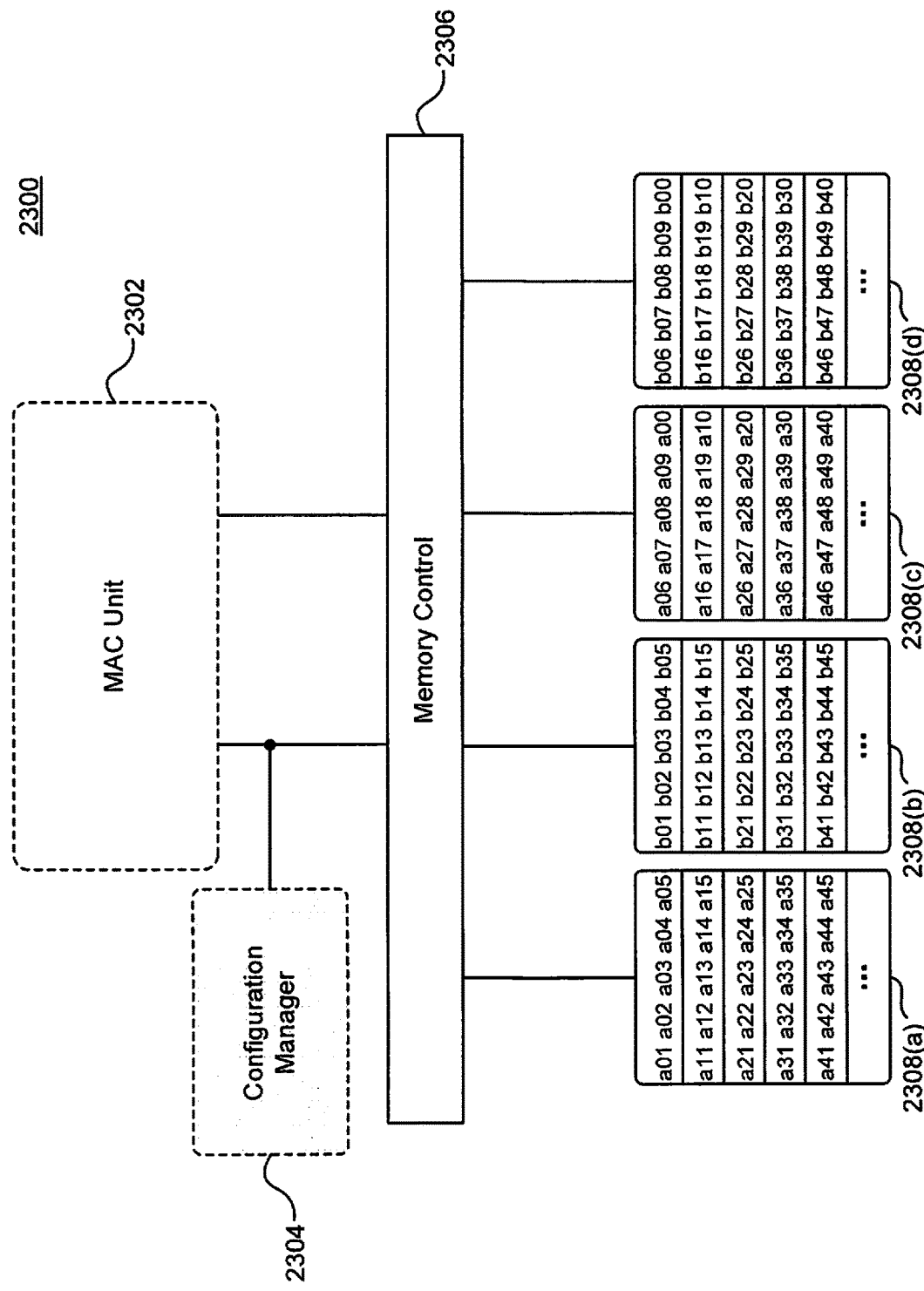
FIG. 23 is a block diagram of an exemplary processing device, consistent with disclosed embodiments.

FIG. 23 is a block diagram of an exemplary processing device 2300, consistent with disclosed embodiments. The block diagram shows a simplified processing device 2300 displaying a single accelerator in the form of MAC Unit 2302, configuration manager 2304 (equivalent or similar to configuration manager 2212), memory controller 2306 (equivalent or similar to memory controller 2210), and a plurality of memory blocks 2308(a)-(d).

In some embodiments, MAC unit 2302 may be a specific accelerator for processing a particular task. By way of example, the processing device 2300 may be tasked with 2D-convolutions. Then, configuration manager 2304 can signal an accelerator that has the appropriate hardware to perform calculations associated with the task. For instance, MAC unit 2302 may have four internal incrementing counters (logical adders and registers to manage the four loops needed by a convulsion calculation) and a multiply accumulate unit. Configuration manager 2304 may signal MAC unit 2302 to process incoming data and execute the task. Configuration manager 2304 may transmit an indication to MAC unit 2302 to execute the task. In these situations, MAC unit 2302 may iterate over calculated addresses, multiply the numbers, and accumulate them to an internal register.

In some embodiments, configuration manager 2304 may configure the accelerators while memory controller 2306 grants access to blocks 2308 and MAC unit 2302 using dedicated buses. In other embodiments, however, memory controller 2306 can directly configure the accelerators based on instructions received from configuration manger 2304 or an external interface. Alternatively, or additionally, configuration manager 2304 can pre-load a few configurations and allow the accelerator to iteratively run on different addresses with different sizes. In such embodiments, configuration manager 2304 may include a cache memory that stores a command before it is transmitted to at least one of the plurality of processing units, such as accelerators 2216. However, in other embodiments configuration manager 2304 may not include a cache.

In some embodiments, configuration manager 2304 or memory controller 2306 may receive addresses that need to be accessed for a task. Configuration manager 2304 or memory controller 2306 may check a register to determine whether the address is already in a loaded line to one of memory blocks 2308. If so, memory controller 2306 may read the word from memory block 2308 and pass it to the MAC unit 2302. If the address is not in a loaded line, configuration manager 2304 may request memory controller 2306 may load the line and signal MAC unit 2302 to delay until it is retrieved.

In some embodiments, as shown in FIG. 23, memory controller 2306 may include two inputs form two independent addresses. But if more than two addresses should be accessed simultaneously, and these addresses are in a single memory block (for example it is only in of memory blocks 2308(a)), memory controller 2306 or configuration manager 2304 may raise an exception. Alternatively, configuration manager 2304 may return invalid data signal when the two addresses can only be access through a single line. In other embodiments, the unit may delay the process execution until it is possible to retrieve all needed data. This may diminish the overall performance. Nonetheless, a compiler may be able to find a configuration and data placement that would prevent delays.

In some embodiments, a compiler may create a configuration or instruction set for processing device 2300 that may configure configuration manager 2304 and memory controller 2306 and accelerator 2302 to handle situations in which multiple addresses need to be accessed from a single memory block but the memory block has one port. For instance, a compiler may re-arrange data in memory blocks 2308 such that processing units may access multiple lines in memory blocks 2308.

In addition, memory controller 2306 may also work simultaneously on more than one input at the same time. For example, memory controller 2306 may allow accessing one of memory blocks 2308 through one port and supplying the data while receiving a request from a different memory block in another input. Therefore, this operation may result in and accelerator 2216 tasked with the exemplary 2D-convolutions receiving data from dedicated lines of communication with the pertinent memory blocks.

Additionally, or alternatively, memory controller 2306 or a logic block may hold refresh counters for every memory block 2308 and handle the refresh of all lines. Having such a counter allows memory controller 2306 to slip in the refresh cycles between dead access times from the devices.

Furthermore, memory controller 2306 may be configurable to perform the pipelined memory access, receiving addresses and opening lines in memory blocks before supplying the data. The pipelined memory access may provide data to processing units without interruption or delayed clock cycles. For example, while memory controller 2306 or one of the logic blocks access data with the right line in FIG. 23, it may be transmitting data in the left line. These methods will be explained in greater detail in connection to FIG. 26.

In response to the required data, processing device 2300 may use multiplexors and/or other switching devices to choose which device gets serviced to perform a given task. For example, configuration manager 2304 may configure multiplexers so at least two data lines reach the MAC unit 2302. In this way, a task requiring data from multiple addresses, such as 2D-convolutions, may be performed faster because the vectors or words requiring multiplication during convolution can reach the processing unit simultaneously, in a single clock. This data transferring method may allow the processing units, such as accelerators 2216, to quickly output a result.

In some embodiments, configuration manager 2304 may be configurable to execute processes based on priority of tasks. For example, configuration manager 2304 can be configured to let a running process finish without any interruptions. In that case, configuration manger 2304 may provide an instruction or configurations of a task to accelerators 2216, let them run uninterrupted, and switch multiplexers only when the task is finished. However, in other embodiments, configuration manager 2304 may interrupt a task and reconfigure data routing when it receives a priority task, such a request from an external interface. Nevertheless, with enough memory blocks 2308, memory controller 2306 may be configurable to route data, or grant access, to processing units with dedicated lines that do not have to be changed until a task is completed. Moreover, in some embodiments, all devices may be connected by buses to the entries of configuration manager 2304, and the devices may manage access between themselves and the buses (e.g., using the same logic as a multiplexer). Therefore, memory controller 2306 may be directly connected to a number of memory instances or memory blocks.

Alternatively, memory controller 2306 may be connected directly to memory sub-instances. In some embodiments, each memory instance or block can be built from sub-instances (for example, DRAM may be built from mats with independent data lines arranged in multiple sub-blocks). Further, the instances may include at least one of DRAM mats, DRAM, banks, flash mats, or SRAM mats or any other type of memory. Then, memory controller 2306 may include dedicated lines to address sub-instances directly to minimize latency during a pipelined memory access.

In some embodiments, memory controller 2306 may also hold the logic needed for a specific memory instance (such as row\col decoders, refresh logic, etc.) and memory blocks 2308 may handle its own logic. Therefore, memory blocks 2308 may get an address and generate commands for return\write data.

Figure 24:
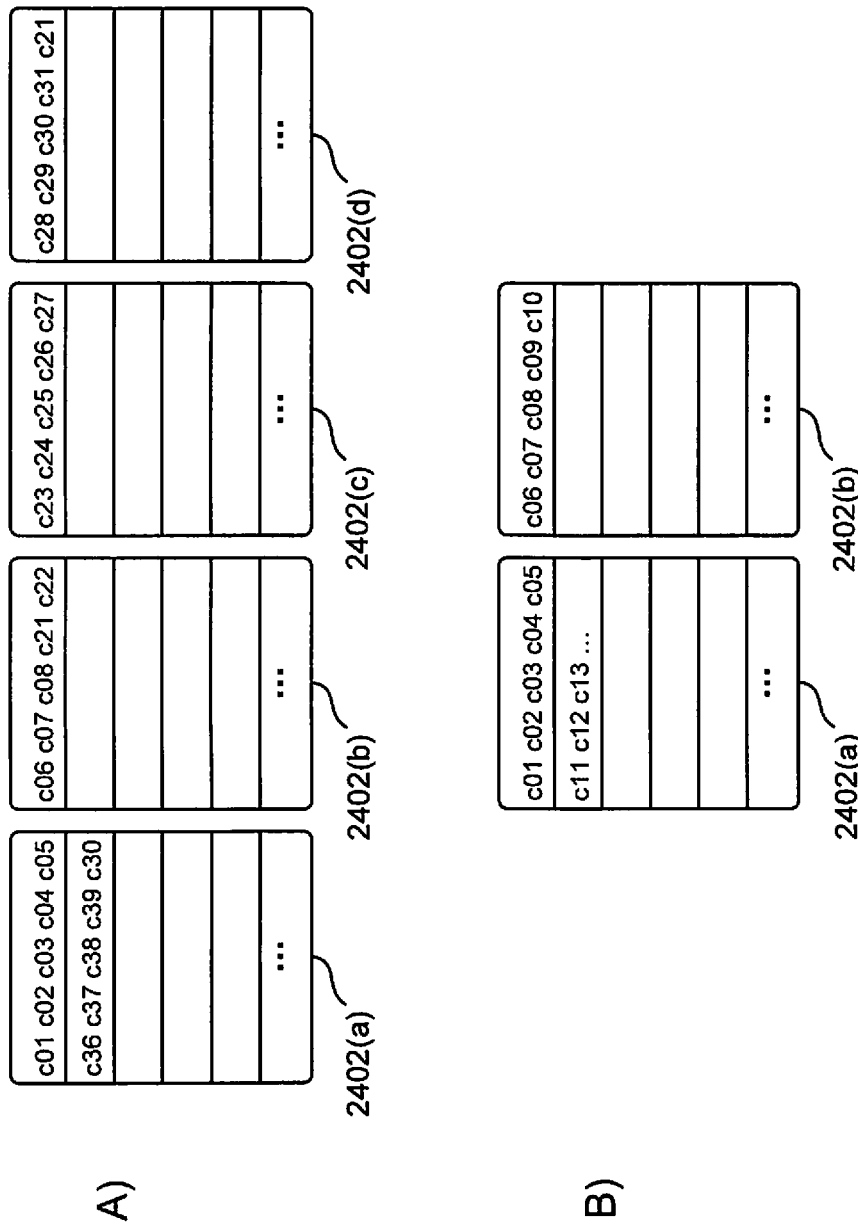
FIG. 24 includes exemplary memory configuration diagrams, consistent with disclosed embodiments.

FIG. 24 depicts exemplary memory configuration diagrams, consistent with disclosed embodiments. In some embodiments, a compiler generating code or configuration for processing device 2200 may perform a method to configure loading from memory blocks 2202 and 2204 by pre-arranging data in each block. For example, a compiler may prearrange data so each word required for a task is correlated to a line of memory instance or memory block(s). But for tasks that require more memory blocks than the one available in processing device 2200, a compiler may implement methods of fitting data in more than one memory location of each memory block. The compiler may also store data in sequence and evaluate the latency of each memory block to avoid line miss latency. In some embodiments, the host may be part of a processing unit, such as configuration manger 2212, but in other embodiments the compiler host may be connected to processing device 2200 via an external interface. In such embodiments, the host may run compiling functions, such as the ones described for the compiler.

In some embodiments, configuration manager 2212 may be a CPU or a micro controller (uC). In such embodiments, configuration manager 2212 may have to access the memory to fetch commands or instructions placed in the memory. A specific compiler may generate the code and place it in the memory in a manner that allows for consecutive commands to be stored in the same memory line and across a number of memory banks to allow for the pipelined memory access also on the fetched command. In these embodiments, configuration manager 2212 and memory controller 2210 may be capable of avoiding row latency in linear execution by facilitating the pipelined memory access.

The previous case of linear execution of a program described a method for a compiler to recognize and place the instructions to allow for pipelined memory execution. However other software structures may be more complex and would require the compiler to recognize them and act accordingly. For example, in case a task requires loops and branches, a compiler may place all the loop code inside a single line so that the single line can be looped without line opening latency. Then, memory controller 2210 may not need to change lines during an execution.

In some embodiments, configuration manager 2212 may include internal caching or small memory. The internal caching may store commands that are executed by configuration manager 2212 to handle branches and loops. For example, commands in internal caching memory may include instructions to configure accelerators for accessing memory blocks.

Figure 25:
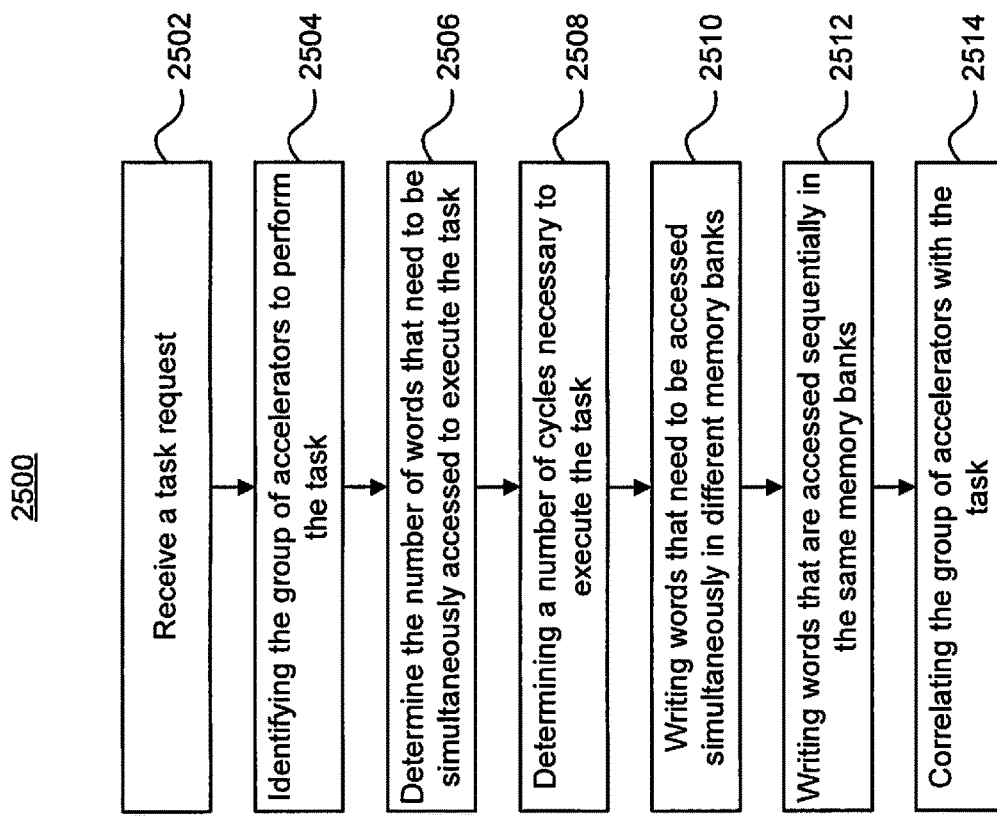
FIG. 25 is an exemplary flowchart illustrating a memory configuration process, consistent with disclosed embodiments.

FIG. 25 is an exemplary flowchart illustrating a possible memory configuration process 2500, consistent with disclosed embodiments. Where convenient in describing memory configuration process 2500, reference may be made to the identifiers of elements depicted in FIG. 22 and described above. In some embodiments, process 2500 may be executed by a compiler that provides instructions to a host connected through an external interface. In other embodiments, process 2500 may be executed by components of processing device 2200, such as configuration manager 2212.

In general, process 2500 may include determining a number of words required simultaneously to perform the task; determining a number of words that can be accessed simultaneously from each one of the plurality of memory banks; and dividing the number of words required simultaneously between multiple memory banks when the number of words required simultaneously is greater than the number of words that can be accessed simultaneously. Moreover, dividing the number of words required simultaneously may include executing a cyclic organization of words and sequentially assigning one word per memory bank.

More specifically, process 2500 may begin with step 2502, in which a compiler may receive a task specification. The specification includes required computations and/or a priority level.

In step 2504, a compiler may identify an accelerator, or group of accelerators, that may perform the task. Alternatively, the compiler may generate instructions so the processing units, such as configuration manager 2212, may identify an accelerator to perform the task. For example, using the required computation configuration manger 2212 may identify accelerators in the group of accelerators 2216 that may process the task.

In step 2506, the compiler may determine a number of words that needs to be simultaneously accessed to execute the task. For example, the multiplication of two vectors requires access to at least two vectors, and the compiler may therefore determine that vector words must be simultaneously accessed to perform the operation.

In step 2508, the compiler may determine a number of cycles necessary to execute the task. For example, if the task requires a convolution operation of four by-products, the compiler may determine that at least 4 cycles will be necessary to perform the task.

In step 2510, the compiler may place words that are needed to be accessed simultaneously in different memory banks. In that way, memory controller 2210 may be configured to open lines to different memory instances and access the required memory blocks within a clock cycle, without any required cached data.

In step 2512, the compiler place words that are accessed sequentially in the same memory banks. For example, in the case that four cycles of operations are required, the compiler may generate instructions to write needed words in sequential cycles in a single memory block to avoid changing lines between different memory blocks during execution.

In step 2514, compiler generate instructions for programming processing units, such as configuration manager 2212. The instructions may specify conditions to operate a switching device (such as a multiplexor) or configure a data bus. With such instructions, configuration manager 2212 may configure memory controller 2210 to route data from, or grant access to, memory blocks to processing units using dedicated lines of communication according to a task.

Figure 26:
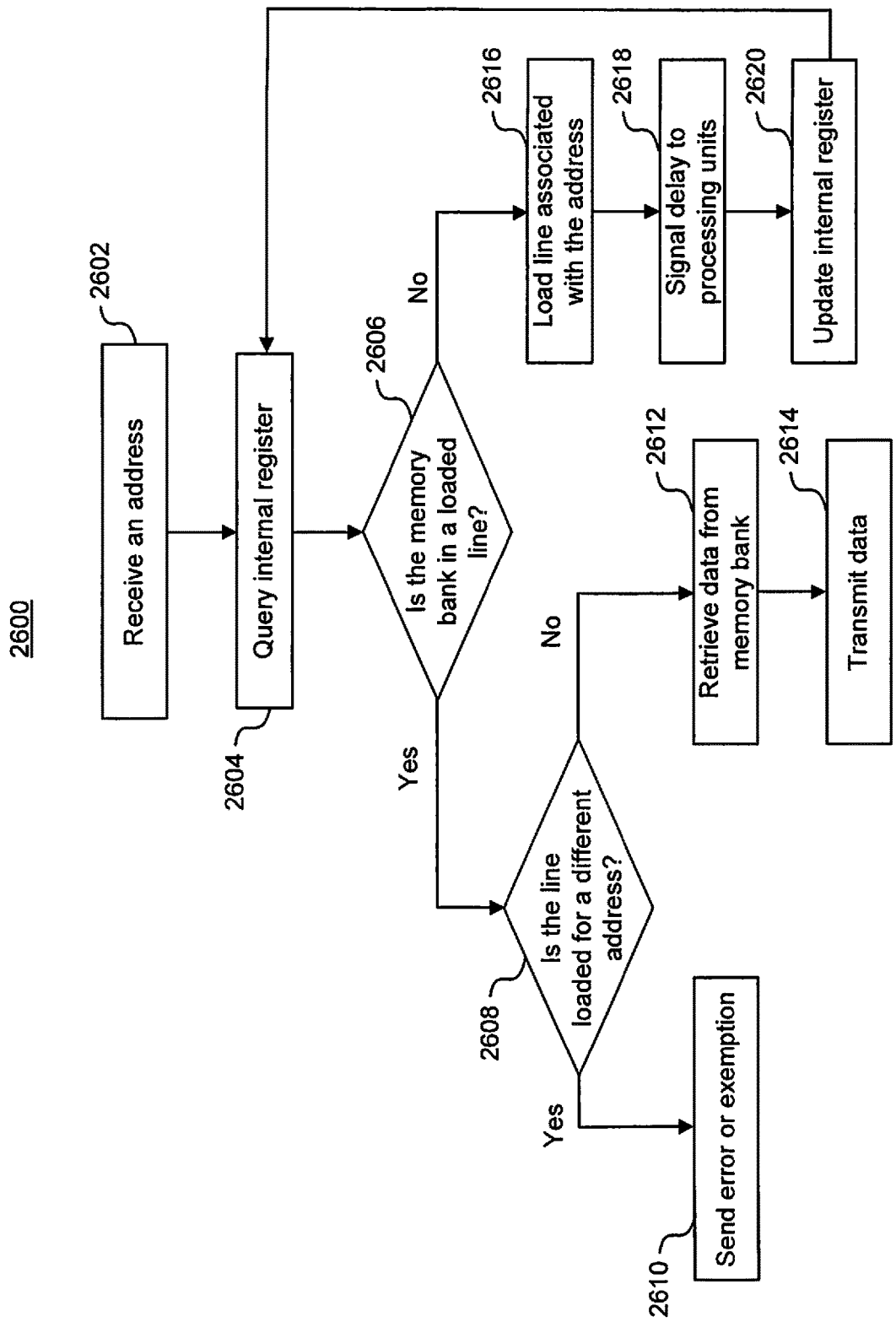
FIG. 26 is an exemplary flowchart illustrating a memory read process, consistent with disclosed embodiments.

FIG. 26 is an exemplary flowchart illustrating a memory read process 2600, consistent with disclosed embodiments. Where convenient in describing memory read process 2600, reference may be made to the identifiers of elements depicted in FIG. 22 and described above. In some embodiments, as described below, process 2600 may be implemented by memory controller 2210. In other embodiments, however, process 2600 may be implemented by other elements in the processing device 2200, such as configuration manager 2212.

In step 2602, memory controller 2210, configuration manager 2212, or other processing units may receive an indication to route data from, or grant access to, a memory bank. The request may specify an address and a memory block.

In some embodiments, the request may be received via a data bus specifying a read command in line 2218 and address in line 2220. In other embodiments, the request may be received via demultiplexers connected to memory controller 2210.

In step 2604, configuration manager 2212, a host, or other processing units, may query an internal register. The internal register may include information regarding opened lines to memory banks, opened addresses, opened memory blocks, and/or upcoming tasks. Based on the information in the internal register, it may be determined whether there are lines opened to the memory bank and/or whether the memory block received the request in step 2602. Alternatively, or additionally, memory controller 2210 may directly query the internal register.

If the internal register indicates that the memory bank is not loaded in an opened line (step 2606: no), process 2600 may continue to step 2616 and a line may be loaded to a memory bank associated with the received address. In addition, memory controller 2210 or a processing unit, such as configuration manager 2212, may signal a delay to the element requesting information from the memory address in step 2616. For example, if accelerator 2216 is requesting the memory information that is located an already occupied memory block, memory controller 2210 may send a delay signal to the accelerator in step 2618. In step 2620, configuration manager 2212 or memory controller 2210 may update the internal register to indicate a line has opened to a new memory bank or a new memory block.

If the internal register indicates that the memory bank is loaded in an opened line (step 2606: yes), process 2600 may continue to step 2608. In step 2608, it may be determined whether the line loaded the memory bank is being used for a different address. If the line is being used for a different address (step 2608: yes), it would indicate that there are two instances in a single block and, therefore, they cannot be accessed simultaneously. Thus, an error or exemption signal may be sent to the element requesting information from the memory address in step 2616. But, if the line is not being used for a different address (step 2608: no), a line may be opened for the address and retrieve data from the target memory bank and continue to step 2614 to transmit data to the to the element requesting information from the memory address.

With process 2600, processing device 2200 has the ability to establish direct connections between processing units and the memory blocks or memory instances that contain the required information to perform a task. This organization of data would enable reading information from organized vectors in different memory instances, as well as allow the retrieval of information simultaneously from different memory blocks when a device requests a plurality of these addresses.

FIG. 27 is an exemplary flowchart illustrating an execution process 2700, consistent with disclosed embodiments. Where convenient in describing execution process 2700, reference may be made to the identifiers of elements depicted in FIG. 22 and described above.

In step 2702, a compiler or a local unit, such as configuration manager 2212, may receive an indication of a task that needs to be performed. The task may include a single operation (e.g., multiplication) or a more complex operation (e.g., convolution between matrixes). The task may also indicate a required computation.

In step 2704, the compiler or configuration manager 2212 may determine a number of words that is required simultaneously to perform the task. For example, configuration a compiler may determine two words are required simultaneously to perform a multiplication between vectors. In another example, a 2D convolution task, configuration manager 2212 may determine that "n" times "m" words are required for a convolution between matrices, where "n" and "m" are the matrices dimensions. Moreover, in step 2704, configuration manager 2212 may also determine a number of cycles necessary to perform the task.

In step 2706, depending on the determinations in step 2704, a compiler may write words that need to be accessed simultaneously in a plurality of memory banks disposed on the substrate. For instance, when a number a number of words that can be accessed simultaneously from one of the plurality of memory banks is lower than the number of words that are required simultaneously, a compiler may organize data in multiple memory banks to facilitate access to the different required words within a clock. Moreover, when configuration manager 2212 or the compiler determine a number of cycles is necessary to perform the task, the compiler may write words that are needed in sequential cycles in a single memory bank of the plurality of memory banks to prevent switching of lines between memory banks.

In step 2708, memory controller 2210 may be configured to read or grant access to at least one first word from a first memory bank from the plurality of memory banks or blocks using a first memory line.

In step 2170, a processing unit, for example one of accelerators 2216, may process the task using the at least one first word.

In step 2712, memory controller 2210 may be configured to open a second memory line in a second memory bank. For example, based on the tasks and using the pipelined memory access approach, memory controller 2210 may be configured to open a second memory line in a second memory block where information required for the tasks was written in step 2706. In some embodiments, the second memory line may be opened when the task in step 2170 is about to be completed. For example, if a task requires 100 clocks, the second memory line may be opened in the 90th clock.

In some embodiments, steps 2708-2712 may be executed within one line access cycle.

In step 2714, memory controller 2210 may be configured to grant access to data from at least one second word from the second memory bank using the second memory line opened in step 2710.

In step 2176, a processing unit, for example one of accelerators 2216, may process the task using the at least second word.

In step 2718, memory controller 2210 may be configured to open a second memory line in the first memory bank. For example, based on the tasks and using the pipelined memory access approach, memory controller 2210 may be configured to open a second memory line to the first memory block. In some embodiments, the second memory line to the first block may be opened when the task in step 2176 is about to be completed.

In some embodiments, steps 2714-2718 may be executed within one line access cycle.

In step 2720, memory controller 2210 may read or grant access to at least one third word from the first memory bank from the plurality of memory banks or blocks using a second memory line in the first bank or a first line in a third bank and continuing in different memory banks.

The foregoing description has been presented for purposes of illustration. It is not exhaustive and is not limited to the precise forms or embodiments disclosed. Modifications and adaptations will be apparent to those skilled in the art from consideration of the specification and practice of the disclosed embodiments. Additionally, although aspects of the disclosed embodiments are described as being stored in memory, one skilled in the art will appreciate that these aspects can also be stored on other types of computer readable media, such as secondary storage devices, for example, hard disks or CD ROM, or other forms of RAM or ROM, USB media, DVD, Blu-ray, 4K Ultra HD Blu-ray, or other optical drive media.

Computer programs based on the written description and disclosed methods are within the skill of an experienced developer. The various programs or program modules can be created using any of the techniques known to one skilled in the art or can be designed in connection with existing software. For example, program sections or program modules can be designed in or by means of .Net Framework, .Net Compact Framework (and related languages, such as Visual Basic, C, etc.), Java, C++, Objective-C, HTML, HTML/AJAX combinations, XML, or HTML with included Java applets.

Moreover, while illustrative embodiments have been described herein, the scope of any and all embodiments having equivalent elements, modifications, omissions, combinations (e.g., of aspects across various embodiments), adaptations and/or alterations as would be appreciated by those skilled in the art based on the present disclosure. The limitations in the claims are to be interpreted broadly based on the language employed in the claims and not limited to examples described in the present specification or during the prosecution of the application. The examples are to be construed as non-exclusive. Furthermore, the steps of the disclosed methods may be modified in any manner, including by reordering steps and/or inserting or deleting steps. It is intended, therefore, that the specification and examples be considered as illustrative only, with a true scope and spirit being indicated by the following claims and their full scope of equivalents.

What is claimed is:

1. A memory chip, comprising:
    a plurality of memory banks, each memory bank having a bank row decoder, a bank column decoder, and a plurality of memory sub-banks, each memory sub-bank having a sub-bank row decoder and a sub-bank column decoder for allowing reads and writes to locations on the memory sub-bank, each memory sub-bank comprising:
        a plurality of memory mats, each memory mat having a plurality of memory cells, wherein the sub-bank row decoders and the sub-bank column decoders are configured to receive read and write requests from at least one of the bank row decoder and the bank column decoder.

2. The memory chip of claim 1, wherein each memory sub-bank further has a sub-bank controller configured to determine whether to processor read requests and write requests from a controller of the memory bank.

3. The memory chip of claim 2, wherein the controller of the memory is synchronized to a system clock.

4. The memory chip of claim 2, wherein the controllers of the memory sub-banks are not synchronized to a system clock.

5. The memory chip of claim 1, wherein each sub-bank further has a processor subunit using the sub-bank as a dedicated memory.

6. The memory chip of claim 5, wherein each processor subunit is configured to access a sub-bank dedicated to the processor subunit using the row decoder and the column decoder of the sub-bank without using the bank row decoder and the bank column decoder.

7. The memory chip of claim 5, wherein the processor subunit comprises a configurable processor subunit or an accelerator.

8. A memory chip, comprising:
    a plurality of memory banks, each memory bank having a bank controller and a plurality of memory sub-banks, each memory sub-bank having a sub-bank row decoder and a sub-bank column decoder for allowing reads and writes to locations on the memory sub-bank, each memory sub-bank comprising:
        a plurality of memory mats, each memory mat having a plurality of memory cells, wherein the sub-bank row decoders and the sub-bank column decoders are configured to receive read and write requests from the bank controller and process read and write requests received from the bank controller.

9. The memory chip of claim 8, wherein each memory sub-bank further has a sub-bank controller configured to determine whether to processor read requests and write requests from the bank controller.

10. The memory chip of claim 9, wherein the bank controller is synchronized to a system clock.

11. The memory chip of claim 9, wherein the controllers of the memory sub-banks are not synchronized to a system clock.

12. The memory chip of claim 8, wherein each sub-bank further has a processor subunit using the sub-bank as a dedicated memory.

13. The memory chip of claim 12, wherein each processor subunit is configured to access a sub-bank dedicated to the processor subunit using the row decoder and the column decoder of the sub-bank without using the bank controller.

14. A memory chip, comprising:
    a plurality of memory banks, each memory bank having a bank controller for processing reads and writes to locations on the memory bank, each memory bank comprising:
        a plurality of memory mats, each memory mat having a plurality of memory cells and having a mat row decoder and a mat column decoder, wherein the mat row decoders and the mat column decoders are configured to process read and write requests from a sub-bank controller, wherein the read and write requests are generated by the sub-bank controller independent from the bank controller.

15. The memory chip of claim 14, wherein each memory mat further has a comparator configured to determine whether to processor read requests and write requests from the sub-bank controller based on the command address from the bank controller.

16. The memory chip of claim 14, wherein each memory mat has an assigned address range that is determined by one or more fuses.

17. The memory chip of claim 16, wherein the one or more fuses are configured to disable a memory mat that is faulty.

18. The memory chip of claim 14, wherein each sub-bank further has a processor subunit using the sub-bank as a dedicated memory.

19. A memory chip, comprising:
a plurality of memory banks, each memory bank having a bank controller, a row decoder, and a column decoder for allowing reads and writes to locations on the memory bank; and
a plurality of buses connecting each controller of the plurality of bank controllers to at least one other controller of the plurality of bank controllers; and
wherein each controller is configured to process data incoming from other controllers before passing the data to the memory bank having the controller.

20. The memory chip of claim 19, wherein the plurality of buses are configured to be accessed without interruption of data transfers on main buses of the memory banks.

21. A memory chip, comprising:
a plurality of memory banks, each memory bank having a bank controller, a row decoder, and a column decoder for allowing reads and writes to locations on the memory bank; and
a plurality of buses connecting each controller of the plurality of bank controllers to at least one other controller of the plurality of bank controllers, wherein each controller is connected to a plurality of other controllers and is configurable for selection of one other of the other controllers for sending or receiving of data.

22. The memory chip of claim 19, wherein each memory bank comprises a dynamic random access memory bank.

23. The memory chip of claim 19, wherein each controller is configurable and is configured to determine addresses for reading and writing in the memory bank having the controller.

24. The memory chip of claim 21, wherein each controller is configured to process data incoming from other controllers before passing the data to the memory bank having the controller.

25. The memory chip of claim 19, wherein each controller is connected to another spatially adjacent controller.

26. The memory chip of claim 14, wherein the sub-bank controller is configured to return an error message upon receiving a control signal from the bank controller while the read and write requests are being processed.

* * * * *